United States Patent
Yu

(10) Patent No.: US 11,075,498 B2
(45) Date of Patent: Jul. 27, 2021

(54) METHOD OF FABRICATING AN OPTOELECTRONIC COMPONENT

(71) Applicant: ROCKLEY PHOTONICS LIMITED, Altrincham (GB)

(72) Inventor: Guomin Yu, Glendora, CA (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/999,789

(22) Filed: Aug. 21, 2020

(65) Prior Publication Data

US 2021/0057874 A1   Feb. 25, 2021

Related U.S. Application Data

(60) Provisional application No. 62/891,235, filed on Aug. 23, 2019.

(30) Foreign Application Priority Data

Oct. 18, 2019   (GB) .................................... 1915118

(51) Int. Cl.
*H01S 5/00* (2006.01)
*H01S 5/02* (2006.01)
(Continued)

(52) U.S. Cl.
CPC .............. *H01S 5/021* (2013.01); *H01S 5/005* (2013.01); *H01S 5/0085* (2013.01); *H01S 5/026* (2013.01);
(Continued)

(58) Field of Classification Search
CPC .... H01S 5/021; H01S 5/18397; H01S 5/2022; H01S 5/209; H01S 5/2214; H01S 5/005;
(Continued)

(56) References Cited

U.S. PATENT DOCUMENTS 4,720,468 A    1/1988 Menigaux et al.
5,264,392 A *  11/1993 Gaebe .................... G02B 6/423
                                                438/27
(Continued)

FOREIGN PATENT DOCUMENTS

GB         2552264 A       1/2018
WO    WO 02/093203 A2    11/2002

OTHER PUBLICATIONS

Liang, S. et al., "Fabrication of InP-based monolithically integrated laser transmitters", Science China Information Sciences, Jul. 9, 2018, pp. 080405:1 through 080405:19, vol. 61, Science China Press and Springer-Verlag GmbH Germany, part of Springer Nature 2018.

(Continued)

*Primary Examiner* — Kinam Park
(74) *Attorney, Agent, or Firm* — Lewis Roca Rothgerber Christie LLP

(57) ABSTRACT

A method of fabricating an optoelectronic component within a silicon-on-insulator substrate, the method comprising: providing a silicon-on-insulator (SOI) substrate, the SOI substrate comprising a silicon base layer, a buried oxide (BOX) layer on top of the base layer, and a silicon device layer on top of the BOX layer; etching a first cavity region into the SOI substrate and etching a second cavity region into the SOI substrate, the first cavity region having a first depth and the second cavity region having a second depth, the second depth being greater than the first depth; depositing a multistack epi layer into the first and the second cavity regions simultaneously, the multistack epi layer comprising a first multistack portion comprising a first active region and a second multistack portion comprising a second active region.

20 Claims, 50 Drawing Sheets

(51) Int. Cl.
*H01S 5/183* (2006.01)
*H01S 5/20* (2006.01)
*H01S 5/22* (2006.01)
*H01S 5/026* (2006.01)
*H01S 5/32* (2006.01)
*H01S 5/30* (2006.01)

(52) U.S. Cl.
CPC .......... *H01S 5/18397* (2013.01); *H01S 5/209* (2013.01); *H01S 5/2022* (2013.01); *H01S 5/2214* (2013.01); *H01S 5/3013* (2013.01); *H01S 5/3027* (2013.01); *H01S 5/32* (2013.01)

(58) Field of Classification Search
CPC .......... H01S 5/026; H01S 5/32; H01S 5/3013; H01S 5/3027; H01S 5/0085
See application file for complete search history.

(56) References Cited

U.S. PATENT DOCUMENTS

| | | |
|---|---|---|
| 9,356,163 B1 | 5/2016 | Liu et al. |
| 9,372,307 B1 | 6/2016 | Budd et al. |
| 9,608,160 B1* | 3/2017 | Bayram .............. H01L 21/0262 |
| 9,864,136 B1 | 1/2018 | Jacob |
| 2003/0013304 A1* | 1/2003 | Deliwala ............ G02B 6/12011 438/689 |
| 2003/0062526 A1* | 4/2003 | Romano .............. H01S 5/02461 257/79 |
| 2004/0013338 A1 | 1/2004 | Bjorkman et al. |
| 2007/0116398 A1 | 5/2007 | Pan et al. |
| 2013/0037907 A1 | 2/2013 | Cho |
| 2014/0254978 A1 | 9/2014 | Koch et al. |
| 2016/0322779 A1 | 11/2016 | Cai et al. |

OTHER PUBLICATIONS

International Search Report and Written Opinion of the International Searching Authority, dated Oct. 28, 2020, Corresponding to PCT/EP2020/073482, 16 pages.

U.K. Intellectual Property Office Search and Examination Report, dated Apr. 17, 2020, for Patent Application No. GB1915118.2, 6 pages.

Jung, D. et al., "Highly reliable low threshold InAs quantum dot lasers on on-axis (001) Si with 87% injection efficiency", ACS Photonics, Dec. 18, 2017, pp. 1-16, American Chemical Society.

* cited by examiner

FIG. 1c

Table 10a (EAM section, 12a):

| # | mult | type | material | thickness | value | doping | dopant |
|---|------|------|----------|-----------|-------|--------|--------|
| 14 | 1 | p | InGaAs | 400 | | 1 | Zn |
| 13 | 1 | p | InGaAsP | 50 | 1499.98 | 1.5 | Zn |
| 12 | 1 | p | InP | 1340 | 1302.91 | 1 | Zn |
| 11 | 1 | p | InGaAsP | 20 | 918.407 | 1 | Zn |
| 10 | 1 | p | AlInGaAs | 60 | 1302.91 | 1 | C |
| 9 | 1 | uid | AlInGaAs | 70 | 843.435 | | |
| 8 | 12x | uid | AlInGaAs | 7 | 968.035 | | |
| 7 | 12x | active | AlInGaAs | 9 | 1127.14 | | |
| 6 | 1 | uid | AlInGaAs | 7 | 1278.2 | | |
| 5 | 1 | uid | InGaAsP | 77 | 1100 | | |
| 4 | 1 | n | InP | 80 | 918.407 | 0.2 | Si |
| 3 | 1 | n | InP | 70 | 918.407 | 0.5 | Si |
| 2 | 1 | n | InP | 920 | 918.407 | 0.8 | Si |
| 1 | Substrate: semi-insulating and n doped InP | | | | | | |

(B)

Table 10b (Laser + EAM section, 12b, 13b):

Laser:

| # | mult | type | material | thickness | value | doping | dopant |
|---|------|------|----------|-----------|-------|--------|--------|
| 27 | 1 | p | InGaAs | 400 | | 1 | Zn |
| 26 | 1 | p | InGaAsP | 50 | 1499.98 | 1.5 | Zn |
| 25 | 1 | p | InP | 1340 | 1302.91 | 1 | Zn |
| 24 | 1 | p | InGaAsP | 20 | 918.407 | 1 | Zn |
| 23 | 1 | p | AlInGaAs | 60 | 1302.91 | 1 | C |
| 22 | 1 | uid | AlInGaAs | 70 | 843.435 | | |
| 21 | 12x | uid | AlInGaAs | 7 | 968.035 | | |
| 20 | 12x | active | AlInGaAs | 9 | 1127.14 | | |
| 19 | 1 | uid | AlInGaAs | 7 | 1278.2 | | |
| 18 | 1 | uid | InGaAsP | 77 | 1100 | | |
| 17 | 1 | n | InP | 80 | 918.407 | 0.2 | Si |
| 16 | 1 | n | InP | 70 | 918.407 | 0.5 | Si |
| 15 | 1 | n | InP | 920 | 918.407 | 0.8 | Si |

EAM:

| # | mult | type | material | thickness | value | doping | dopant |
|---|------|------|----------|-----------|-------|--------|--------|
| 14 | 1 | p | InGaAs | 400 | | 1 | Zn |
| 13 | 1 | p | InGaAsP | 50 | 1499.98 | 1.5 | Zn |
| 12 | 1 | p | InP | 1340 | 1302.91 | 1 | Zn |
| 11 | 1 | p | InGaAsP | 20 | 918.407 | 1 | Zn |
| 10 | 1 | p | AlInGaAs | 60 | 1302.91 | 1 | C |
| 9 | 1 | uid | AlInGaAs | 70 | 843.435 | | |
| 8 | 12x | uid | AlInGaAs | 7 | 968.035 | | |
| 7 | 12x | active | AlInGaAs | 9 | 1127.14 | | |
| 6 | 1 | uid | AlInGaAs | 7 | 1278.2 | | |
| 5 | 1 | uid | InGaAsP | 77 | 1100 | | |
| 4 | 1 | n | InP | 80 | 918.407 | 0.2 | Si |
| 3 | 1 | n | InP | 70 | 918.407 | 0.5 | Si |
| 2 | 1 | n | InP | 920 | 918.407 | 0.8 | Si |
| 1 | Substrate: semi-insulating and n doped InP | | | | | | |

(A)

| | Layer | R | n/u/p | Material | Thick (nm) | Eg (nm) | Doping (10^18) | Dopant |
|---|---|---|---|---|---|---|---|---|
| Laser (113b) | 31 | 1 | p | InGaAs | 400 | 1499.98 | 1 | Zn |
| | 30 | 1 | p | InGaAsP | 50 | 1302.91 | 1.5 | Zn |
| | 29 | 1 | p | InP | 1340 | 918.407 | 1 | Zn |
| | 28 | 1 | p | InGaAsP | 20 | 1302.91 | 1 | Zn |
| | 27 | 1 | p | AlInGaAs | 60 | 843.435 | 1 | C |
| | 26 | 1 | uid | AlInGaAs | 70 | 968.035 | | |
| | 25 | 12x | uid | AlInGaAs | 71 | 127.14 | | |
| | 24 | 12x | active | AlInGaAs | 9 | 1278.2 | | |
| | 23 | 1 | uid | AlInGaAs | 7 | 1127.14 | | |
| | 22 | 1 | uid | InGaAsP | 77 | 1100 | | |
| | 21 | 1 | n | InP | 80 | 918.407 | 0.2 | Si |
| | 20 | 1 | n | InP | 70 | 918.407 | 0.5 | Si |
| | 19 | 1 | n | InP | 920 | 918.407 | 0.8 | Si |
| EAM (112b) | 18 | 1 | p | InGaAs | 400 | 1499.98 | 1 | Zn |
| | 17 | 1 | p | InGaAsP | 50 | 1302.91 | 1.5 | Zn |
| | 16 | 1 | p | InP | 1340 | 918.407 | 1 | Zn |
| | 15 | 1 | p | InGaAsP | 20 | 1302.91 | 1 | Zn |
| | 14 | 1 | p | AlInGaAs | 60 | 843.435 | 1 | C |
| | 13 | 1 | uid | AlInGaAs | 70 | 968.035 | | |
| | 12 | 12x | uid | AlInGaAs | 7 | 1127.14 | | |
| | 11 | 12x | active | AlInGaAs | 9 | 1278.2 | | |
| | 10 | 1 | uid | AlInGaAs | 7 | 1127.14 | | |
| | 9 | 1 | uid | InGaAsP | 77 | 1100 | | |
| | 8 | 1 | n | InP | 80 | 918.407 | 0.2 | Si |
| | 7 | 1 | n | InP | 70 | 918.407 | 0.5 | Si |
| | 6 | 1 | n | InP | 920 | 918.407 | 0.8 | Si |
| Template (114b) | 5 | 1 | uid | InGaAs, or InP | 500 | | | |
| | 4 | 1 | uid | InAlAs | 1300 | Graded buffer layer | | |
| | 3 | 1 | uid | GaAs | 1000 | | | |
| | 2 | 1 | uid | Ge | 1000 | | | |
| | 1 | | | Substrate: (100) Si with 6 degree off cut to (111) | | | | |

FIG. 3a

| | | Layer | R | n/u/p | Material | Thick (nm) | Eg (nm) | Doping (10^18) | Dopant |
|---|---|---|---|---|---|---|---|---|---|
| 213b | Laser | 31 | 1 | p | InGaAs | 400 | 1499.98 | 1 | Zn |
| | | 30 | 1 | p | InGaAsP | 50 | 1302.91 | 1.5 | Zn |
| | | 29 | 1 | p | InP | 1340 | 918.407 | 1 | Zn |
| | | 28 | 1 | p | InGaAsP | 20 | 1302.91 | 1 | Zn |
| | | 27 | 1 | p | AlInGaAs | 60 | 843.435 | 1 | C |
| | | 26 | 1 | uid | AlInGaAs | 70 | 968.035 | | |
| | | 25 | 12x | uid | AlInGaAs | 7 | 1127.14 | | |
| | | 24 | 12x | active | AlInGaAs | 9 | 1278.2 | | |
| | | 23 | 1 | uid | AlInGaAs | 7 | 1127.14 | | |
| | | 22 | 1 | uid | InGaAsP | 77 | 1100 | | |
| | | 21 | 1 | n | InP | 80 | 918.407 | 0.2 | Si |
| | | 20 | 1 | n | InP | 70 | 918.407 | 0.5 | Si |
| | | 19 | 1 | n | InP | 920 | 918.407 | 0.8 | Si |
| 212b | EAM | 18 | 1 | p | InGaAs | 400 | 1499.98 | 1 | Zn |
| | | 17 | 1 | p | InGaAsP | 50 | 1302.91 | 1.5 | Zn |
| | | 16 | 1 | p | InP | 1340 | 918.407 | 1 | Zn |
| | | 15 | 1 | p | InGaAsP | 20 | 1302.91 | 1 | Zn |
| | | 14 | 1 | p | AlInGaAs | 60 | 843.435 | 1 | C |
| | | 13 | 1 | uid | AlInGaAs | 70 | 968.035 | | |
| | | 12 | 6x | uid | AlInGaAs | 7 | 1127.14 | | |
| | | 11 | 6x | active | AlInGaAs | 9 | 1278.2 | | |
| | | 10 | 1 | uid | AlInGaAs | 7 | 1127.14 | | |
| | | 9 | 1 | uid | InGaAsP | 77 | 1100 | | |
| | | 8 | 1 | n | InP | 80 | 918.407 | 0.2 | Si |
| | | 7 | 1 | n | InP | 70 | 918.407 | 0.5 | Si |
| | | 6 | 1 | n | InP | 920 | 918.407 | 0.8 | Si |
| 214b | Template | 5 | 1 | uid | GaAs, or In | 500 | | | |
| | | 4 | 1 | uid | InAlAs | 1300 | Graded buffer layer | | |
| | | 3 | 1 | uid | GaAs | 1000 | | | |
| | | 2 | 1 | uid | Ge | 1000 | | | |
| | | 1 | | | Substrate: (100) Si with 6 degree off cut to (111) | | | | |

FIG. 3b

Top view
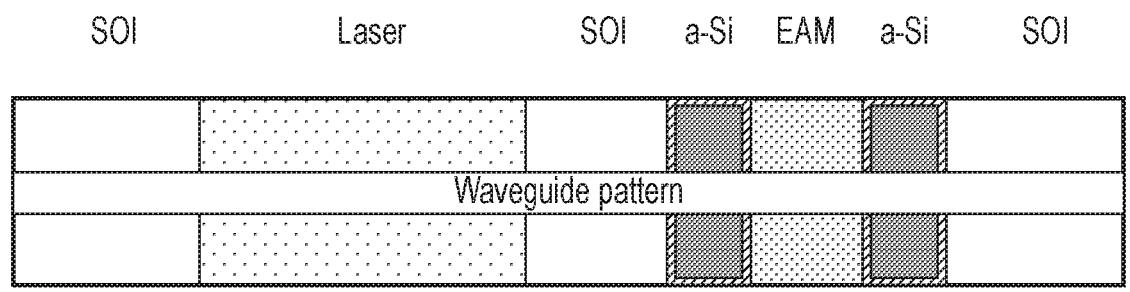
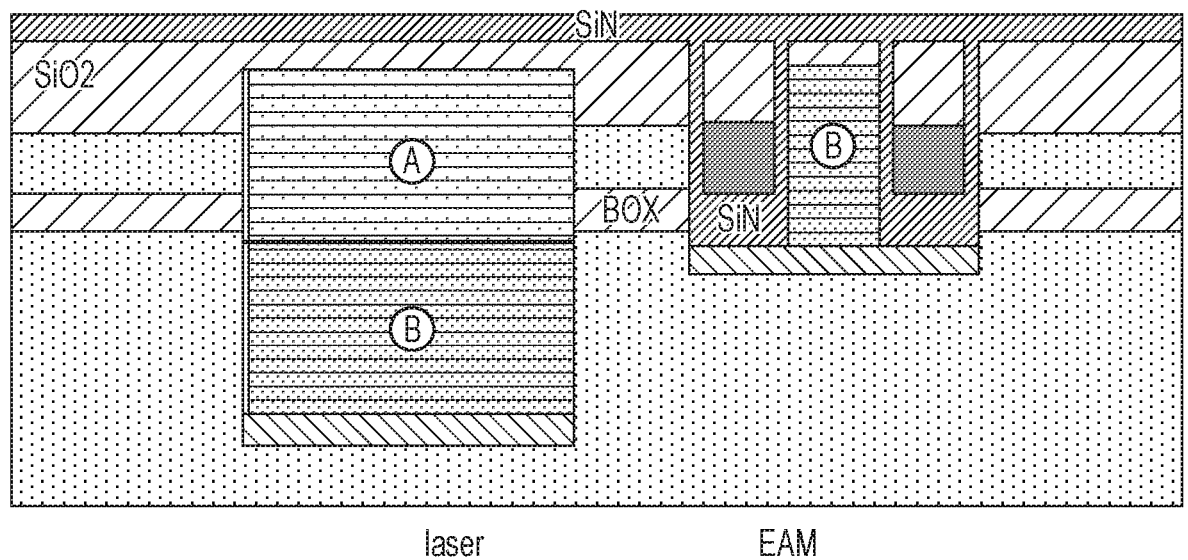
Section view along with the direction of light propagation
FIG. 4o

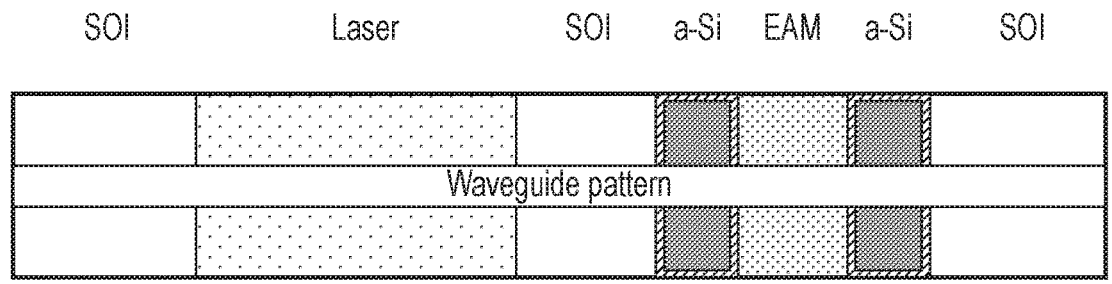
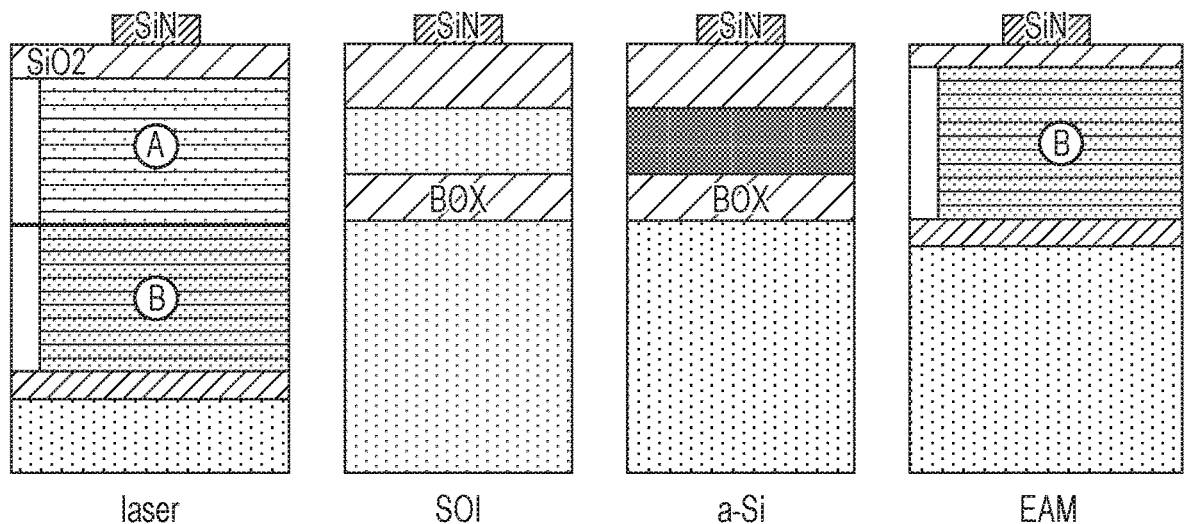
Section view perpendicular to the direction of light propagation
FIG. 4p Section view perpendicular to the direction of light propagation Section view along with the direction of light propagation from right to left

|  |  | Layer | R | n/u/p | Material | Thick (nm) | Note |
|---|---|---|---|---|---|---|---|
| Laser region | QD Laser | 9 | 1 | p+ | GaAs | 300 | |
| | | 28 | 1 | p | Al0.4Ga0.6As | 1500 | |
| | | 27 | 1 | uid | GaAs | 12.5 | |
| | | 26 | 5x | uid | GaAs | 37.5 | |
| | | 25 | 5x | active | InAs QD in In0.15Ga0.85AS QW | 11.5 | |
| | | 24 | 1 | uid | GaAs | 50 | |
| | | 23 | 1 | n | Al0.4Ga0.6As | 1500 | |
| Laser buffer region | | 22 | 1 | n | GaAs | 3100 | buffer |
| | | 21 | 10x | uid | GaAs | 10 | |
| | | 20 | 10x | uid | In0.1Ga0.9As | 20 | |
| | | 19 | 1 | uid | InGaAs graded | 1300 | |
| EAM region | EAM | 18 | 1 | p | InGaAs | 400 | |
| | | 17 | 1 | p | InGaAsP | 50 | |
| | | 16 | 1 | p | InP | 1340 | |
| | | 15 | 1 | p | InGaAsP | 20 | |
| | | 14 | 1 | p | AlInGaAs | 60 | |
| | | 13 | 1 | uid | AlInGaAs | 70 | |
| | | 12 | 12x | uid | AlInGaAs | 7 | |
| | | 11 | 12x | active | AlInGaAs | 9 | |
| | | 10 | 1 | uid | AlInGaAs | 7 | |
| | | 9 | 1 | uid | InGaAsP | 77 | |
| | | 8 | 1 | n | InP | 80 | |
| | | 7 | 1 | n | InP | 70 | |
| | | 6 | 1 | n | InP | 920 | |
| EAM buffer region | | 5 | 1 | uid | InGaAs, or InP | 500 | |
| | | 4 | 1 | uid | InAlAs | 1300 | Graded buffer layer |
| | | 3 | 1 | uid | GaAs | 1000 | |
| | | 2 | 1 | uid | Ge | 1000 | |
| | | 1 | | | Si (100) substrate | | |

FIG. 7a

Section view along with the direction of light propagation from left to right

| | | | | | | | |
|---|---|---|---|---|---|---|---|
| 812 / Laser | 27 | 1 | p | InGaAs | 400 | 1499.98 | 1 | Zn |
| | 26 | 1 | p | InGaAsP | 50 | 1302.91 | 1.5 | Zn |
| | 25 | 1 | p | InP | 1340 | 918.407 | 1 | Zn |
| | 24 | 1 | p | InGaAsP | 20 | 1302.91 | 1 | Zn |
| | 23 | 1 | p | AlInGaAs | 60 | 843.435 | 1 | C |
| | 22 | 1 | uid | AlInGaAs | 70 | 968.035 | | |
| | 21 | 12x | uid | AlInGaAs | 7 | 1127.14 | | |
| | 20 | 12x | active | AlInGaAs | 9 | 1278.2 | | |
| | 19 | 1 | uid | AlInGaAs | 7 | 1127.14 | | |
| | 18 | 1 | uid | InGaAsP | 77 | 1100 | | |
| | 17 | 1 | n | InP | 80 | 918.407 | 0.2 | Si |
| | 16 | 1 | n | InP | 70 | 918.407 | 0.5 | Si |
| | 15 | 1 | n | InP | 920 | 918.407 | 0.8 | Si |
| 812 / EAM | 14 | 1 | p | InGaAs | 400 | 1499.98 | 1 | Zn |
| | 13 | 1 | p | InGaAsP | 50 | 1302.91 | 1.5 | Zn |
| | 12 | 1 | p | InP | 1340 | 918.407 | 1 | Zn |
| | 11 | 1 | p | InGaAsP | 20 | 1302.91 | 1 | Zn |
| | 10 | 1 | p | AlInGaAs | 60 | 843.435 | 1 | C |
| | 9 | 1 | uid | AlInGaAs | 70 | 968.035 | | |
| | 8 | 12x | uid | AlInGaAs | 7 | 1127.14 | | |
| | 7 | 12x | active | AlInGaAs | 9 | 1278.2 | | |
| | 6 | 1 | uid | AlInGaAs | 7 | 1127.14 | | |
| | 5 | 1 | uid | InGaAsP | 77 | 1100 | | |
| | 4 | 1 | n | InP | 80 | 918.407 | 0.2 | Si |
| | 3 | 1 | n | InP | 70 | 918.407 | 0.5 | Si |
| | 2 | 1 | n | InP | 920 | 918.407 | 0.8 | Si |
| 812 / Laser | 27 | 1 | p | InGaAs | 400 | 1499.98 | 1 | Zn |
| | 26 | 1 | p | InGaAsP | 50 | 1302.91 | 1.5 | Zn |
| | 25 | 1 | p | InP | 1340 | 918.407 | 1 | Zn |
| | 24 | 1 | p | InGaAsP | 20 | 1302.91 | 1 | Zn |
| | 23 | 1 | p | AlInGaAs | 60 | 843.435 | 1 | C |
| | 22 | 1 | uid | AlInGaAs | 70 | 968.035 | | |
| | 21 | 12x | uid | AlInGaAs | 7 | 1127.14 | | |
| | 20 | 12x | active | AlInGaA | 9 | 1278.2 | | |
| | 19 | 1 | uid | AlInGaAs | 7 | 1127.14 | | |
| | 18 | 1 | uid | InGaAsP | 77 | 1100 | | |
| | 17 | 1 | n | InP | 80 | 918.407 | 0.2 | Si |
| | 16 | 1 | n | InP | 70 | 918.407 | 0.5 | Si |
| | 15 | 1 | n | InP | 920 | 918.407 | 0.8 | Si |
| 812 / EAM | 14 | 1 | p | InGaAs | 400 | 1499.98 | 1 | Zn |
| | 13 | 1 | p | InGaAsP | 50 | 1302.91 | 1.5 | Zn |
| | 12 | 1 | p | InP | 1340 | 918.407 | 1 | Zn |
| | 11 | 1 | p | InGaAsP | 20 | 1302.91 | 1 | Zn |
| | 10 | 1 | p | AlInGaAs | 60 | 843.435 | 1 | C |
| | 9 | 1 | uid | AlInGaAs | 70 | 968.035 | | |
| | 8 | 12x | uid | AlInGaAs | 7 | 1127.14 | | |
| | 7 | 12x | active | AlInGaAs | 9 | 1278.2 | | |
| | 6 | 1 | uid | AlInGaAs | 7 | 1127.14 | | |
| | 5 | 1 | uid | InGaAsP | 77 | 1100 | | |
| | 4 | 1 | n | InP | 80 | 918.407 | 0.2 | Si |
| | 3 | 1 | n | InP | 70 | 918.407 | 0.5 | Si |
| | 2 | 1 | n | InP | 920 | 918.407 | 0.8 | Si |

Buffer
Si-sub

FIG. 14e

METHOD OF FABRICATING AN OPTOELECTRONIC COMPONENT

CROSS-REFERENCE TO RELATED APPLICATION(S)

This application claims priority to United Kingdom application number GB 1915118.2, filed on Oct. 18, 2019, which claims priority to and the benefit of U.S. provisional patent application No. 62/891,235, filed Aug. 23, 2019. The entire contents of both of the applications identified in this paragraph are incorporated herein by reference.

FIELD

One or more aspects of embodiments according to the present invention relate to a method of fabricating an optoelectronic component, and more particularly to a method including the step of depositing a multistack epi layer simultaneously into a first cavity and a second cavity, the second cavity having a different depth from the first cavity.

BACKGROUND

Conventional optoelectronic devices (for example, electro-ab sorption modulators or EAMs) comprise a waveguide on a base that is generally a semiconductor substrate such as a silicon substrate. Waveguides on a semiconductor substrate are typically configured to guide a light signal through an upper layer of the substrate by total internal reflection. Where a silicon on insulator (SOI) substrate is used, the SOI substrate is made up of a silicon base layer, a buried oxide (BOX) layer on top of the base layer, and a silicon device layer on top of the BOX layer.

An optoelectronic device may comprise a waveguide with an optically active region (also referred to as an active waveguide), for example an electro-absorption medium, deposited in a cavity in the silicon layer. Typically, a thin silicon layer is left on the bottom of the cavity between the BOX layer and the optically active region as a crystal seed for the active material to be grow n epitaxially. Both the silicon seed layer and the BOX layer may function as a bottom cladding for the active waveguide. Usually, the epitaxial growth for the active material needs a further active material seed layer located upon the silicon seed layer in order to obtain a high quality crystal structure of the desired active region. For example, a seed layer of germanium may be grown when an active layer of silicon-germanium is to be grown.

For any optical waveguide device, it is desired to optimise the coupling efficiency between a passive (non-optically active) waveguide and the active waveguide since high losses will result in a less useful or potentially useless device. Performance of a device can also be optimised by choice of material and increasingly the choice of active materials is becoming more complex. The use of complicated epi stacks including layers of active material is well documented. This gives rise to unique fabrication challenges. Ultimately, it is desirable to reduce the number of fabrication steps involved. However, the more complicated the structures involved; the greater the number of fabrication steps involved. This is particularly the case when complicated epi stacks are deposited and subsequently patterned.

Single epi growth has previously been used at a step to create better coupling between a single active structure and an optical waveguide.

SUMMARY

Accordingly, the present invention aims to solve the above problems by providing, according to a first aspect, a method of fabricating an optoelectronic component within a silicon-on-insulator substrate, the method comprising:

providing a silicon-on-insulator (SOI) substrate, the SOI substrate comprising a silicon base layer, a buried oxide (BOX) layer on top of the base layer, and a silicon device layer on top of the BOX layer;

etching a first cavity region into the SOI substrate and etching a second cavity region into the SOI substrate, the first cavity region having a first depth and the second cavity region having a second depth, the second depth being greater than the first depth;

depositing a multistack epi layer into the first and the second cavity regions simultaneously, the multistack epi layer comprising a first multistack portion comprising a first active region and a second multistack portion comprising a second active region;

wherein the relative separation of the first active region and the second active region within the multistack epi layer is chosen based on the difference in depth of the first cavity region and the second cavity region, such that after the simultaneous growth step, the first active region within in the first cavity region lies at the same level of the optoelectronic device as the second active region within the second cavity region and at the same level as the SOI device layer.

Traditionally, for each epi growth stage, a high temperature cleaning process is required. For a SiGe epi growth for example, the cleaning process requires temperatures of around 1100° C. Such a temperature will damage any previous epi growth and will therefore also damage any future epi growth. By depositing all epi layers of the multistack in a single epi step, any damage due to cleaning steps can be minimized.

The epi thickness of each layer within the multistack is designed such that laser mode is aligned with EAM mode in vertical direction.

The method may have any one of or, to the extent that they are compatible, any combination of the following optional features.

In some embodiments, the stack layers of the first multistack portion comprise doped layers which form a pin junction at the first active region. In this way, the layer of active material which forms the active region is sandwiched between at least one p doped region and at least one n doped region so that the resulting pin junction overlaps with the active material. The active material therefore forms at least a part of the "intrinsic" part of the pin junction.

In some embodiments the stack layers of the second multistack portion comprise doped layers which form a pin junction at the second active region.

In some embodiments, first multistack portion comprises undoped layers at the first active region.

In some embodiments, the stack layers of the second multistack portion comprise undoped layers at the second active region.

In some embodiments, the method further comprises the step of patterning the device layer of the SOI platform to form a guiding layer comprising one or more waveguides which may include an input waveguide and an output waveguide. In this way, the resulting device lies within the substrate, with a first active region in the first cavity, a second active region in the second cavity, and the device layer of the SOI all being located at the same level.

Optionally, the multistack epi layer in the first cavity region and the second cavity region comprises one or more of the following III-V materials: such as InGaAs, InGaAsP, AlInGaAs, InGaNAs.

Optionally, the multistack epi layer in the first cavity region and the second cavity region comprises one or more of the following group IV materials: such as Ge, SiGe, and SiGeSn.

In some embodiments the materials of the first stack portion are chosen such that when an electrical bias is applied across the first active region, it functions as an electro-absorption modulator (EAM). In some embodiments, the EAM may function either via the Quantum-Confined Stark Effect (QCSE) or Franz Keldysh (FK) effect.

In some embodiments, the materials of the second stack portion are chosen such that when an electrical bias is applied across the second active region, it functions as a laser diode.

In some embodiments, the first active region may function as an EAM and the second active material may function as a laser diode. In other embodiments, the first active material may function as a laser diode, and the second active material may function as an EAM. In other embodiments, the first active material may function as an EAM for one operating wavelength, and the second active material may function as an EAM for another operating wavelength. In other embodiments, the first active material may function as a laser diode for one operating wavelength, and the second active material may function as a laser for another operating wavelength. The materials from which the active regions are fabricated may dictate whether they are located within the uppermost part of the multistack epi layer, or at the lowermost portion of the multistack epi layer.

The first active material and the second active material may be formed from one or more III-V material, for example InAs, InGaAs, InGaAsP, AlInGaAs, or InGaNAs.

In some embodiments, the first active region and/or the second active region comprises multiple quantum wells (MQW).

In some embodiments, the first active region and/or the second active region comprises quantum dots (QD). In either active region, the active material may take the form of quantum dots in quantum wells.

In some embodiments, a buffer structure is located at the base of each of the first and second cavities. For an SOI substrate, the buffer structure may lie in-between the base layer of the silicon substrate and the lowermost epi layer.

In some embodiments, the buffer structure is a multilayer structure.

In some embodiments, the multi-layer structure of the buffer structure is one of the following: Ge/GaAs/InAlAs/InGaAs (comprising a layer of 1 µm Ge, a layer of 1 µm GaAs, a layer of 1.3 µm graded InAlAs and a layer of 0.5 µm InGaAs); Ge/GaAs/InAlAs/InP (comprising a layer of 1 µm Ge, a layer of 1 µm GaAs, a layer of 1.3 µm graded InAlAs and a layer of 0.5 µm InP); or GaP/GaAs/10 pair of 10 nm GaAs/20 nm In0.1Ga0.9As superlattice/GaAs (comprising a layer of 45 nm GaP, a layer of 0.1 µm GaAs, a superlattice layer of 10 pair of 10 nm GaAs/20 nm In0.1Ga0.9As, and a layer of 0.7 µm GaAs).

In some embodiments, the first cavity region and second cavity region are contiguous. In this way, the first cavity region and second cavity region can be thought of as a single cavity. There is no wall of silicon substrate, and instead a step is formed in-between the bottom of the first cavity region and the bottom of the second cavity region.

In some embodiments, the first cavity region and the second cavity region are separated by an intermediate portion of the SOI substrate. In this way, the intermediate portion of the SOI substrate forms a passive silicon waveguide between the first active region and the second active region.

In some embodiments, a distributed Bragg reflector (DBR) grating is located at the intermediate portion of the SOI substrate. In this way the optoelectronic component takes the form of a DBR laser.

According to a second aspect of the present invention, there is provided, a method of fabricating an optoelectronic component, the method comprising:

providing a substrate, etching a first cavity region into the substrate and etching a second cavity region into the substrate, the first cavity region having a first depth and the second cavity region having a second depth, the second depth being greater than the first depth;

depositing a multistack epi layer into the first and the second cavity regions simultaneously, the multistack epi layer comprising a first stack portion comprising a first active region and a second stack portion comprising a second active region;

wherein the relative separation of the first active region and the second active region within the multistack is chosen based on the difference in depth of the first cavity region and the second cavity region, such that after the simultaneous growth step, the first active region within in the first cavity region lies at the same level of the optoelectronic device as the second active region within the second cavity region.

In some embodiments, the method further comprises the step of patterning the substrate to form a guiding waveguide including an input waveguide and an output waveguide, the guiding waveguide being located at the same level as the first active region and the second active region. In this way, the substrate itself forms the waveguide of the optoelectronic device, and there is no need to provide additional materials for the guiding waveguides responsible for passing light into and out of the active regions. According to this abstract, the substrate could be SOI, but could also be made of another material such as InP.

In some embodiments, the method further comprises a third cavity and a fourth cavity, the third cavity having a greater depth than the second cavity, and the fourth cavity having a greater depth than the third cavity; wherein the multistack epi layer includes a third multistack portion comprising a third active region and a fourth multistack portion comprising a fourth active region; and wherein the first active region within the first cavity and second active region within the second cavity lie within the same level of the optoelectronic component as the third active region within the third cavity and the fourth active region within the fourth cavity.

In some embodiments, the first active region, second active region, third active region and fourth active each function as an EAM upon the application of an electrical bias across the active region, such that the optoelectronic component functions as a four channel Coarse Wavelength Division Multiplexor (CWDM4). In this way, it is possible to fabricate a CWDM4, with 4EAMs, each having different operating wavelengths, with only a single epi growth step. This cuts down on the number of cleaning steps required. Traditionally, for every EAM epi growth step, it would have been necessary to carry out a cleaning step, and each cleaning step would require temperatures of around 1100°, which would have resulted in the damage of previous epi layers already deposited.

According to a third aspect of the present invention there is provided, an optoelectronic component within a silicon-on-insulator (SOI) substrate, the SOI substrate comprising a silicon base layer, a buried oxide (BOX) layer on top of the base layer, and a silicon device layer on top of the BOX layer and the optoelectronic component comprising:

a first cavity region etched into the SOI substrate, the first cavity region having a first depth;

a second cavity region etched into the SOI substrate, the second cavity region having a second depth, the second depth being greater than the first depth;

a multistack epi layer located within the second cavity region with a first multistack portion containing a first active region, and a second multistack portion on top of the first multistack portion; the second multistack portion containing a second active region; and a further multistack epi layer with a further first active region, located within the first cavity region, the epi layers of the further multistack epi being identical to the layers of the first multistack portion. In this way, the first active region within the first cavity is on the same level as the second active region within the second cavity, and both are level with input and output waveguides formed out of the substrate itself. The first active region within the second cavity lies below the second active stack and is therefore completely redundant.

BRIEF DESCRIPTION OF THE DRAWINGS

These and other features and advantages of the present invention will be appreciated and understood with reference to the specification, claims, and appended drawings wherein:

FIG. 1c shows the layers of the multistack epi layer of the component of FIG. 1a in more detail;

FIGS. 2a-2g show steps involved in a method for fabricating the optoelectronic component of FIG. 1a;

FIG. 3a shows a detailed structure of a further example of a multistack epi layer, where a first multistack portion comprising an EAM active layer is located underneath a second multistack portion comprising an active layer for a laser; FIG. 3b shows a detailed structure of an alternative example of a multistack epi layer, where a first multistack portion comprising an active layer for a laser is located underneath a second multistack portion comprising an active layer for an EAM;

FIG. 6a shows a multistack epi layer incorporating a quantum dot laser and FIG. 6b shows an example of an optoelectronic device incorporating the multistack epi layer of FIG. 6a;

FIG. 7a shows an alternative multistack epi layer incorporating a quantum dot laser and FIG. 7b shows an example of an optoelectronic device incorporating the multistack epi layer of FIG. 7a;

FIGS. 13a-13l show example steps involved in fabricating the optoelectronic component of FIG. 9;

FIGS. 14a-14j show example steps involved in fabricating an optoelectronic component according to FIG. 11, the optoelectronic component including four EAMs, the EAMs having a III-V type active region configured to modulate an optical signal via the quantum-confined Stark effect (QCSE) or the Franz-Keldysh (FK) effect.

DETAILED DESCRIPTION

The detailed description set forth below in connection with the appended drawings is intended as a description of exemplary embodiments of optoelectronic components and methods of fabricating an optoelectronic component are provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
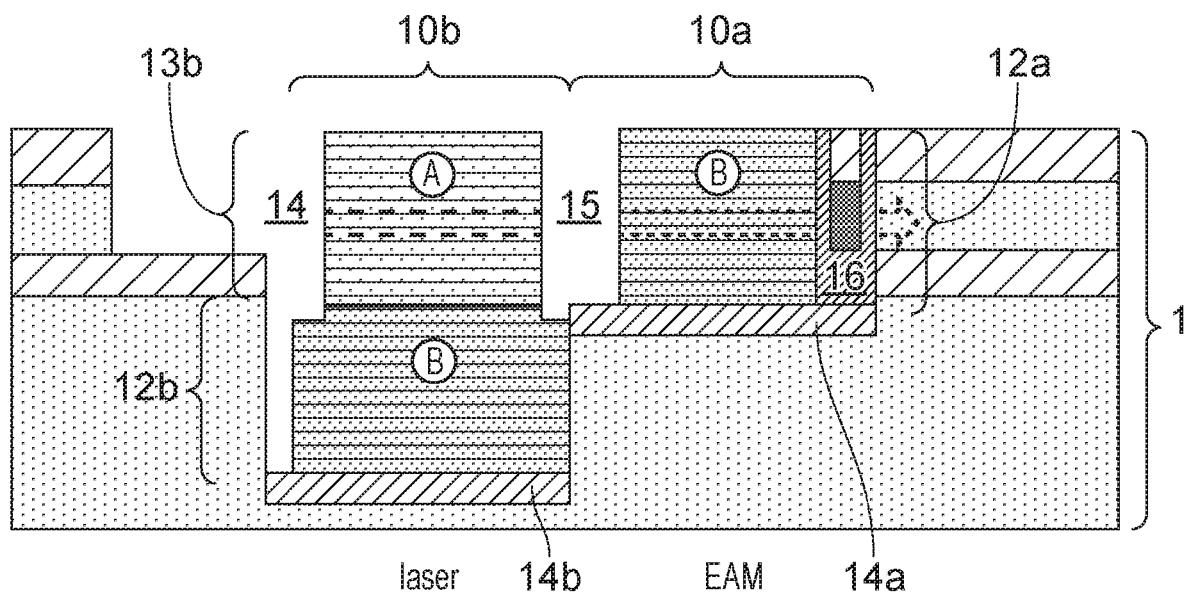
FIG. 1a shows an optoelectronic component where a first cavity region is contiguous with a second cavity region and FIG. 1b shows an optoelectronic component where a first cavity region and second cavity region are separated from one another by an intermediate portion of substrate.
Figure 1B:
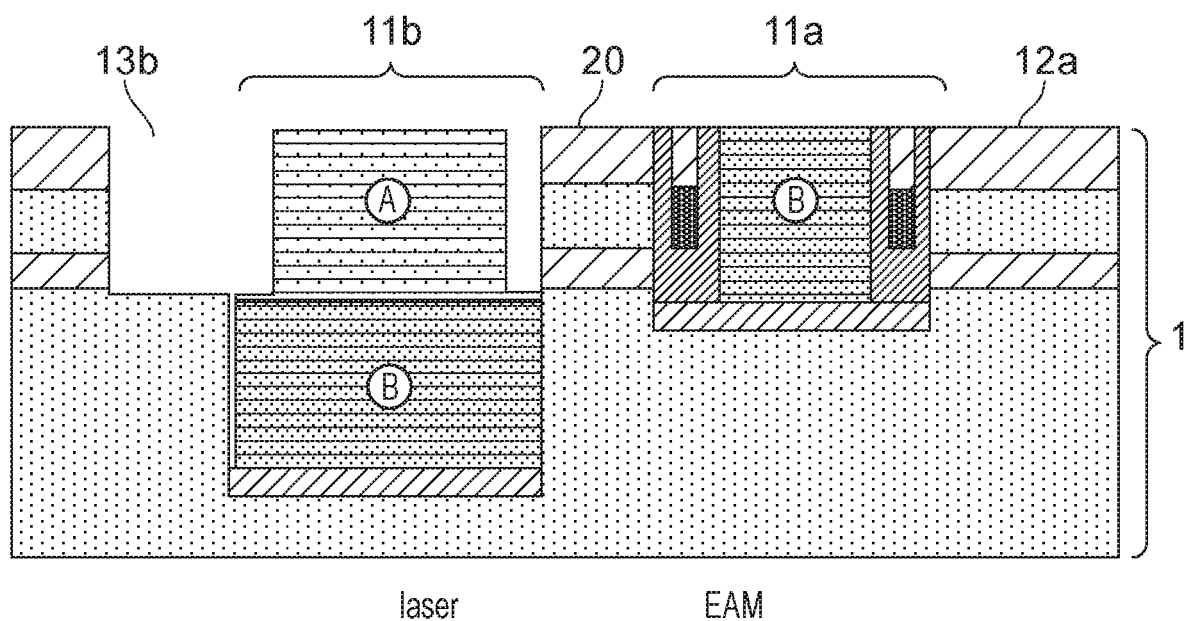

Two examples of embodiments of optoelectronic components are shown in FIG. 1a and FIG. 1b. In each example, a substrate 1 comprises a first cavity region 10a, 11a and a second cavity region 10b, 11b. A multistack epi layer is located within the second cavity region and is made up of a first multistack portion 12b containing a first active region, and a second multistack portion 13b on top of the first multistack portion; the second multistack portion containing a second active region. An example of the layers making up the multistack epi layer is shown in more detail in FIG. 1c.

A further multistack epi layer 12a with a further first active region is located within the first cavity 10a, 1 a. As shown in FIG. 1c, the epi layers of the further multistack epi within the first cavity region are identical to the layers of the first multistack portion within the second cavity region. As will be discussed in more detail below, this arises from the fact that the first cavity and second cavity are filled simultaneously by the growth of the multistack in a single growth stage. The first multistack portion 12b located underneath the second multistack portion 13b within the first cavity portion, is completely redundant and does not play any role whatsoever in the function of the optoelectronic component.

The relative separation of the first active region and the second active region within the multistack is chosen based on the difference in depth of the first cavity region and the second cavity region, such that the first active region within in the first cavity region lies at the same level of the optoelectronic device as the second active region within the second cavity region. That is to say, there are layers of optically active material in the first active region of the first cavity region that lie along the same horizontal plane as layers of optically active material in the second active region of the second cavity region, where the horizontal plane is parallel to the upper surface of the substrate. In the embodiments shown in FIGS. 1a-1c, the substrate is a silicon-on-insulator (SOI) substrate made up of a silicon base layer, a buried oxide (BOX) layer on top of the base layer, and a silicon device layer on top of the BOX layer. The silicon device layer itself forms the input and output waveguides for the active regions, since the device layer of the SOI substrate can be patterned to form a waveguide. The waveguide could be formed as a rib waveguide, a strip waveguide, or a channel waveguide. In some embodiments, an EAM may be fabricated as a strip waveguide, but the laser may be fabricated as a ridge waveguide. The waveguides may be fabricated so that the mode center of both aligned the same height.

In the embodiment shown in FIG. 1a, the first cavity region is contiguous with a second cavity region; whereas in the embodiment of FIG. 1b, the first cavity region and second cavity regions are physically separate individual cavities that are coupled together optically via an intermediate waveguide portion 20 formed from the substrate itself.

In the embodiments shown in FIGS. 1a-1c, the layers of the first multistack portion 12a are chosen such that the first active region 12b functions as an EAM under the application of a bias. The layers of the second multistack portion 13b are chosen such that the second active region 13b functions as a laser diode under the application of a bias. In the embodiment of FIG. 1a, the resulting optoelectronic component may function as a Fabry-Perot laser; whereas the embodiment of FIG. 1b may be adapted to function as an FP laser or as a DBR later. In the latter case, a DBR grating would be fabricated onto the intermediate waveguide portion 20 located in-between the first cavity region and the second cavity region, the grating determining the lasing wavelength of the resulting optoelectronic component. For FP lasers, the FP cavity is determined by the etch facets of the stacks. In the embodiments of FIGS. 1a-1c, each of the active regions include doped layers to form a pin junction. In the multistack epi layer of the second cavity, there are therefore two pin junctions, one on top of the other. In the multistack epi layer, a PN junction is formed between the top p-type doped cladding layers of the pin junction of the first active region and the bottom n-type doped bottom cladding of the pin junction of the second active region, which provide electrical isolation between the two pin junctions and therefore ensure that the redundant active region of the multistack epi layer within the second cavity do not electrically interfere with the second active region within that cavity (in this case corresponding to the laser diode of the device). In addition, both the p-type doped InP in the top cladding of the pin junction of the first active region and the n-type doped InP in the bottom cladding of the pin junction of the second active region have a lower reflective index than that of the I-region and a thickness more than 1000 nm, which provides optical isolation between the two pin junctions and ensure that the redundant active region of the multistack epi layer within the second cavity do not optically interfere with the second active region within that cavity.

In the embodiment of FIG. 1a, an isolation trench 14 is formed in-between the substrate 1 and the multistack epi layer 12b, 13b located within the second cavity region 10b. A further isolation trench 15 is formed in-between the first multistack epi portion 12a of the first cavity region 10a and the second multistack epi portion 13b located within the second cavity region 10b. A final, filled trench 16 is located in-between the first multistack epi portion 12a of the first cavity and the substrate 1. Trench 16 is filled with silicon nitride and amorphous silicon which has the same dimension as that of SOI waveguide and acts as a bridge waveguide to connect SOI waveguide and the first multistack epi portion 12a of the first cavity region 10a. By etching the edges of the multistack epi layer, it is possible to eliminate undesirable edge defects. One or more of the edges left behind once the trenches have been etched may be coated in an anti-reflective (AR) coating.

Figure 2A:
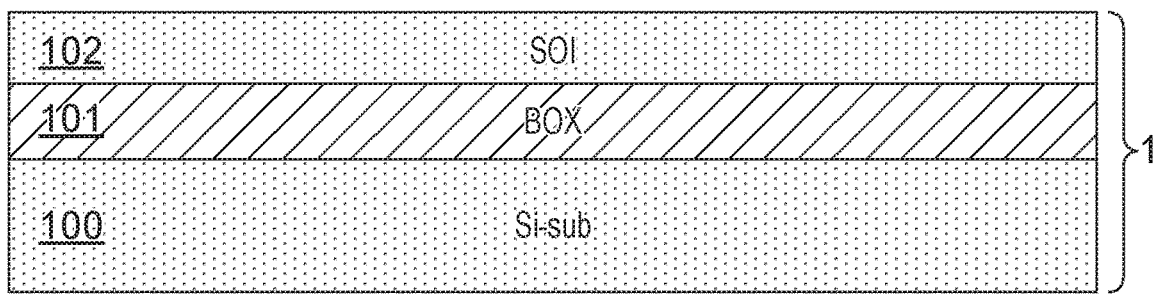

A method of fabrication of an optoelectronic component is described below with reference to FIGS. 2a-2g. Initially, as shown in FIG. 2a, a substrate 1 is provided. In the embodiment shown, the method is carried out on a silicon-on-insulator (SOI) wafer made up of a silicon base layer 100, a buried oxide (BOX) layer 101 on top of the silicon base layer, and a silicon device layer 102 on top of the BOX layer. However, it should be appreciated that the method could be adapted and carried out on other substrates such as InP instead.

Figure 2B:
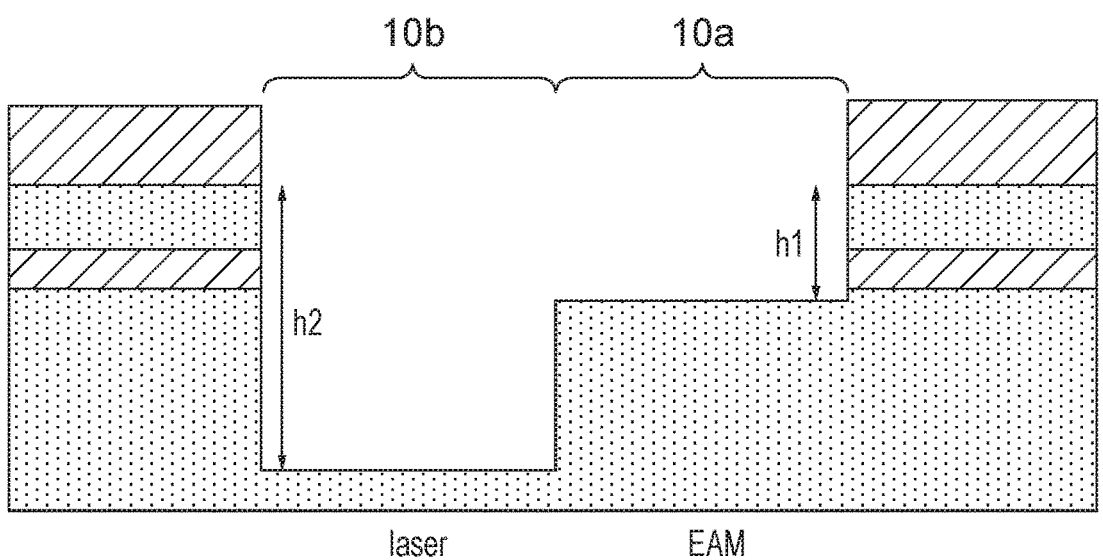
Figure 2C:
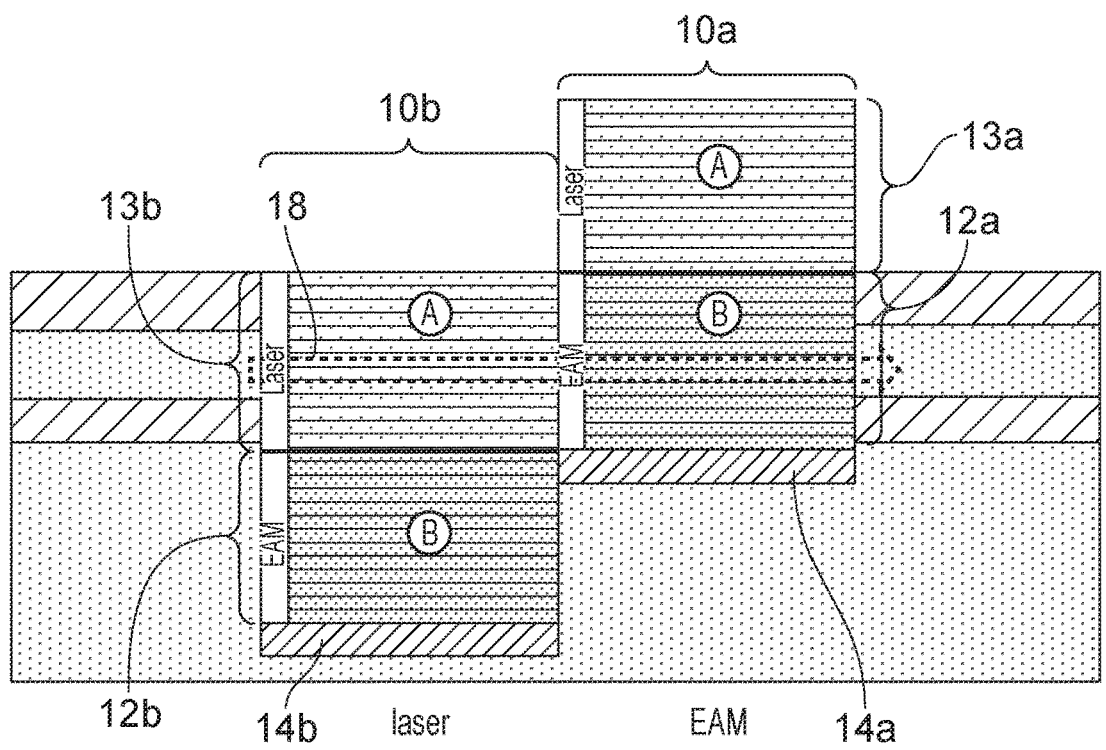

A first cavity region 10a and a second cavity region 10b are etched into the substrate 1 using standard SOI etching techniques as shown in FIG. 2b. In this embodiment, the first cavity region and second cavity region are contiguous, so form a single cavity with a stepped base. The first cavity region has a first depth h1 and the second cavity region has a second depth h2 which is greater than the first depth. Both the first cavity region and the second cavity portion extend through the silicon device layer, the BOX layer and beyond, down into the silicon base layer 100.

In a single epi growth step (FIG. 2c), a multistack epi layer is grown into the first and second cavity regions simultaneously. The multistack epi layer is made up of a first multistack portion 12a, 12b with a second multistack portion 13a, 13b located directly on top of the first multistack portion. A buffer structure 14a, 14b may be grown on the base of the first and second cavities before the multistack epi layers are grown. In this way, it is possible to accommodate for the lattice constant mismatch between the silicon base layer and a subsequent layer of a material such as InP within the stack.

The first multistack portion comprises a first active region and a second multistack portion comprises a second active region. As can be seen in more detail in FIG. 1c, this may include undoped layer/layers of a suitable material such as AlInGaAs. Doped layers are located underneath and on top of the undoped layer(s). In the embodiment shown in FIGS. 2a-2g, the doped and undoped layers of each multistack portion form pin junctions, with n doped layer(s) located below undoped layer(s) and p doped layer(s) located above undoped layers. The multistack epi layer as a whole is therefore made up of two pin junctions; taking an n-i-p:n-i-p structure in order of deposition.

The relative separation of the first active region and the second active region within the multistack is chosen based on the difference in depth of the first cavity region and the second cavity region such that after the simultaneous growth of the multistack epi layer, the first active region within in the first cavity region lies at the same level (of the optoelectronic device) as the second active region. The ultimate optoelectronic device will take the form of a rib waveguide with a first active waveguide region and a second active waveguide region, input waveguides and output waveguides (in this case silicon rib waveguides). The mode supported by the first active region and second active region are therefore chosen to overlap, not only with each other, but also with the modes supported by the input and output waveguides. It should be noted that the detailed EPI structures described herein are examples only and that the materials, number of layers, thicknesses, dopant concentrations etc. may be adapted.

In the embodiment shown, the buffer structure is a multi-layer buffer region located on top of silicon substrate, such as Ge/GaAs/InAlAs/InGaAs. This could be grown as part of the single multistack epi growth, or just before.

Each of the first active region and the second active region may include multiple quantum wells (MQW), or quantum dots in quantum wells (QD). In some embodiments, the second active region (which forms the EAM active region) may consist of a bulk material. Typically, III-V materials are suitable for the first active region (which corresponds to the laser in this embodiment) and the second active layer (which corresponds to the EAM in this embodiment) such as InAs, InGaAs, InGaAsP, AlInGaAs, InGaNAs.

Figure 2D:
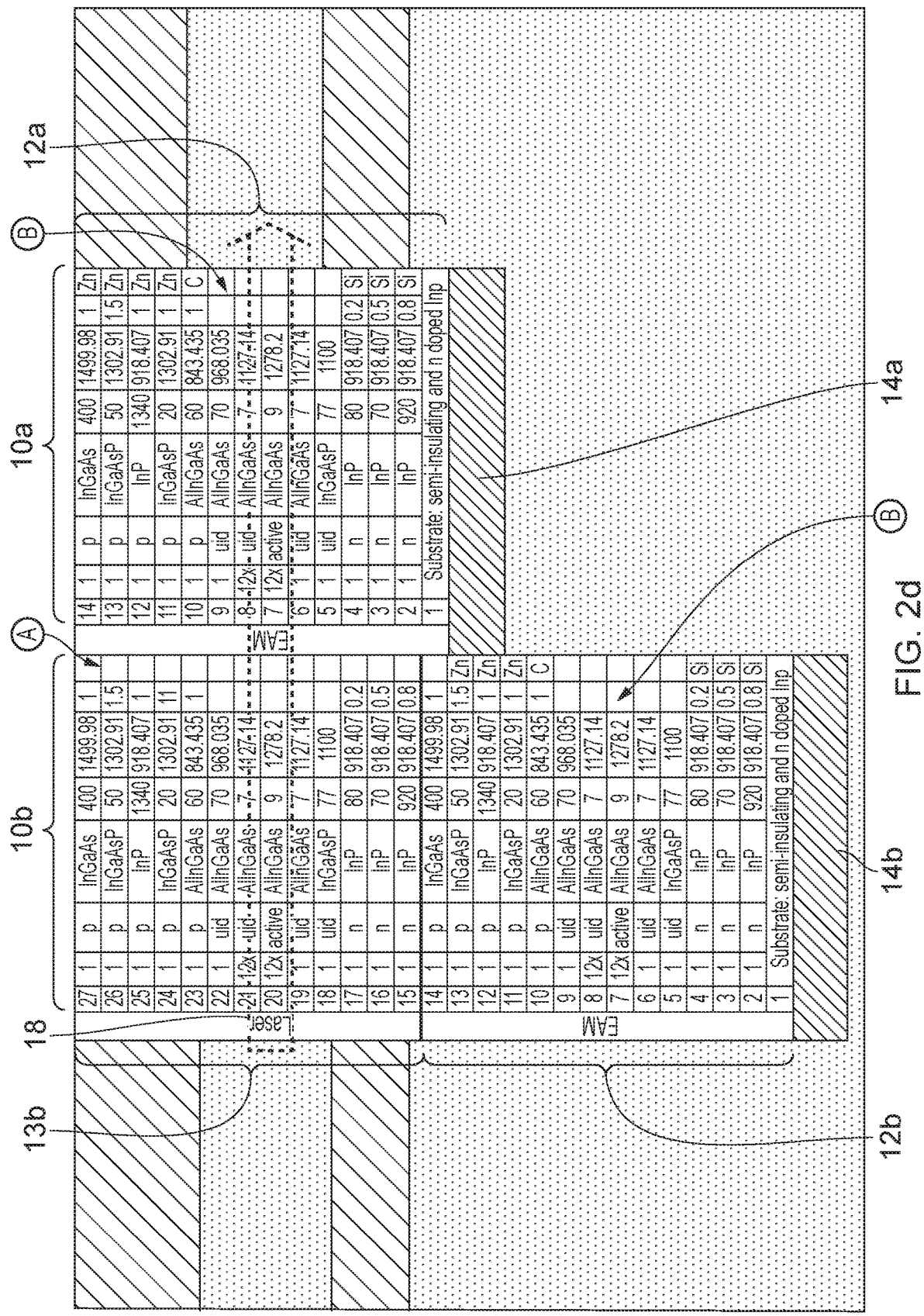
Figure 2E:
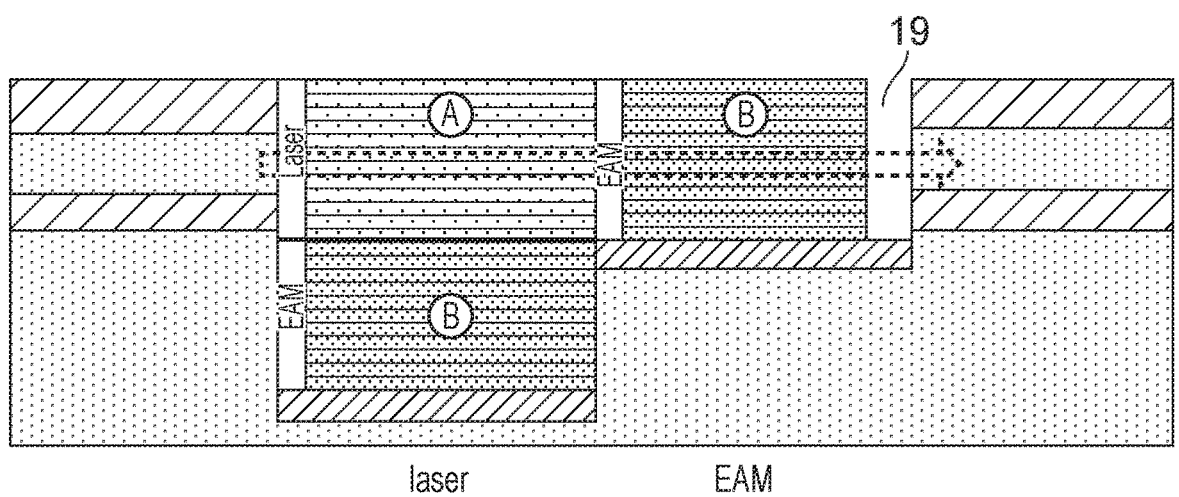
Figure 2F:
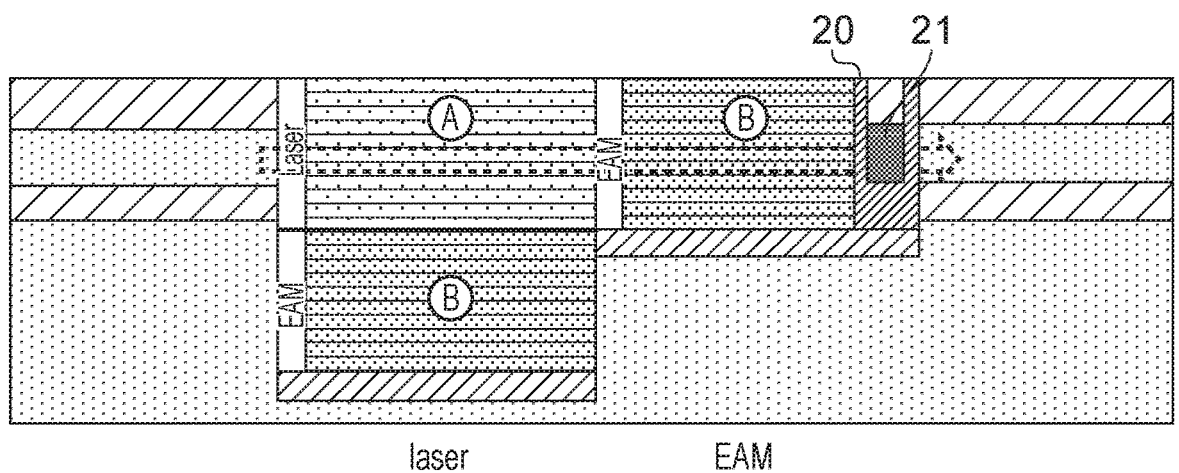
Figure 2G:
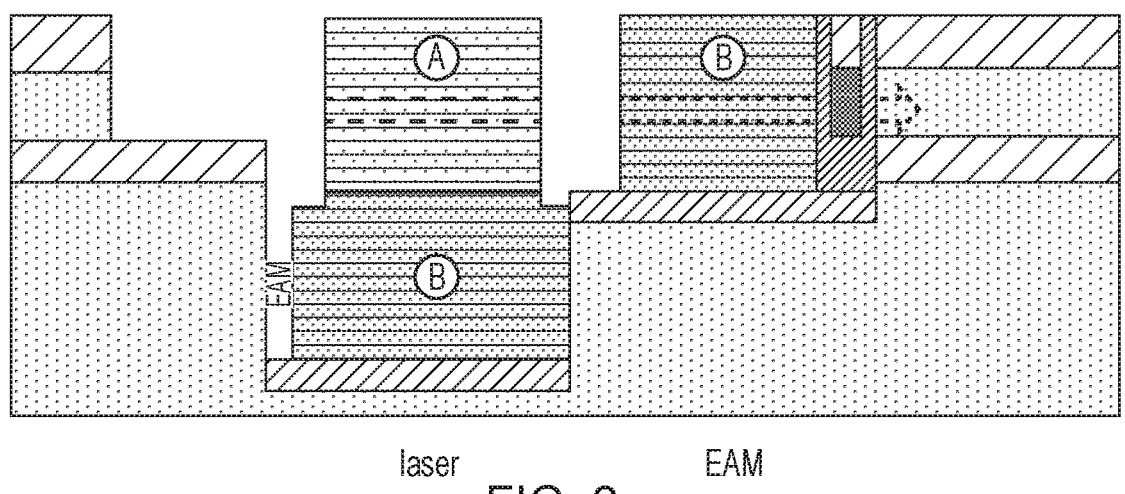

Following the simultaneous growth step, surplus epi layer is removed via planarization (FIG. 2d). In the present case, the surplus material to be planarized corresponds to the second multistack portion 13a that protrudes upwards from the first cavity region since the first cavity is designed only to accommodate those layers of the multistack which relate to the first portion (i.e. the EAM). After planarization, a trench 19 is etched (FIG. 2e) between the edge of the cavity wall and the multistack epi layer of the first cavity region, in order to remove the facet. The trench is then re-filled with silicon nitride and amorphous silicon (α-Si), the silicon nitride forming an initial passivation layer on the walls of the trench, and the α-Si filling the resulting silicon nitride lined trench. A layer of Silicon Oxide will form naturally on top of the α-Si.

By lining the trench with silicon nitride it is possible to mitigate disadvantageous effects of α-Si, such as the long term reliability issue such as leakage current that α-Si could cause to the pin junction, whilst still making the most of the low loss properties of α-Si.

Finally, further trenches are etched (FIG. 2g) to act as isolation trenches and also to fabricate the rib waveguide structure of the multistack regions.

Detailed examples of multistack epi layers can be seen in FIGS. 3a and 3b. FIG. 3a shows an example where a first multistack portion 112b with an active layer 102b suitable for functioning as an EAM is located underneath a second multistack portion 113b comprising an active layer 103b which is suitable for functioning as a laser diode upon application of a bias across the layer. A buffer structure (template) 114b is made up of multiple layers and exhibits a graded effect, to form an improved starting point for the growth of the multistack epi layer. In the embodiment shown, the buffer structure includes sub layers of Ge, GaAs, InAlAs and InGaAs or InP. Typical materials used in the first multistack portion include InP, InGaAsP, AlInGaAs, and InGaAs.

The alternative multistack epi layer shown in FIG. 3b differs from that of FIG. 3a in that the ordering of the first and second multistack portions are reversed. In this case, the first multistack portion 212b includes an active layer 202b suitable for functioning as a laser diode. The first multistack portion 212b being located directly underneath a second multistack portion 213b comprising an active layer 203b which is suitable for functioning as an EAM upon application of a bias across the layer. An example of an optoelectronic component comprising a multistack epi layer such as that of FIG. 3b can be seen in FIG. 5.

Figure 4A:
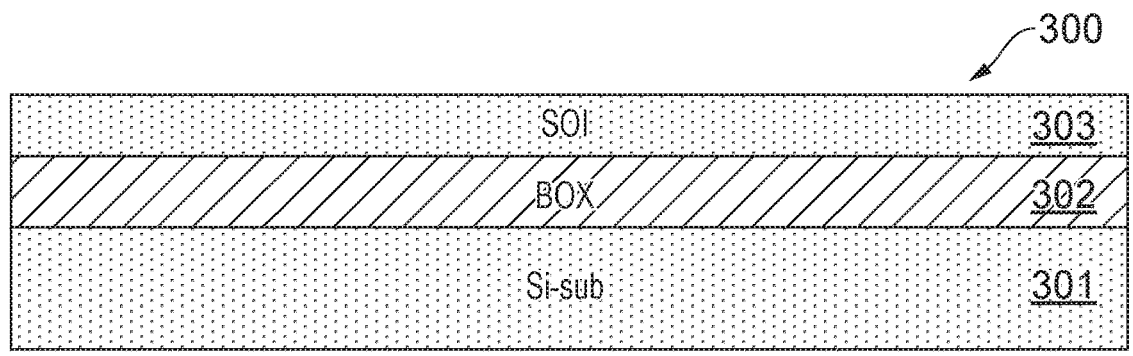
FIGS. 4a-4zb show steps involved in a method for fabricating the optoelectronic component of FIG. 1b.

The method for fabricating an optoelectronic component comprising an intermediate portion of substrate, such as that shown in FIG. 1b is now described below, with reference to FIGS. 4a-4zb. Initially, as shown in FIG. 4a, a substrate 300 is provided. In the embodiment shown, the method is carried out on a silicon-on-insulator (SOI) wafer made up of a silicon base layer 301, a buried oxide (BOX) layer 302 on top of the silicon base layer, and a silicon device layer 303 on top of the BOX layer. However, as with previous embodiments it should be appreciated that the method could be adapted and carried out on other substrates such as InP instead.

Figure 4B:
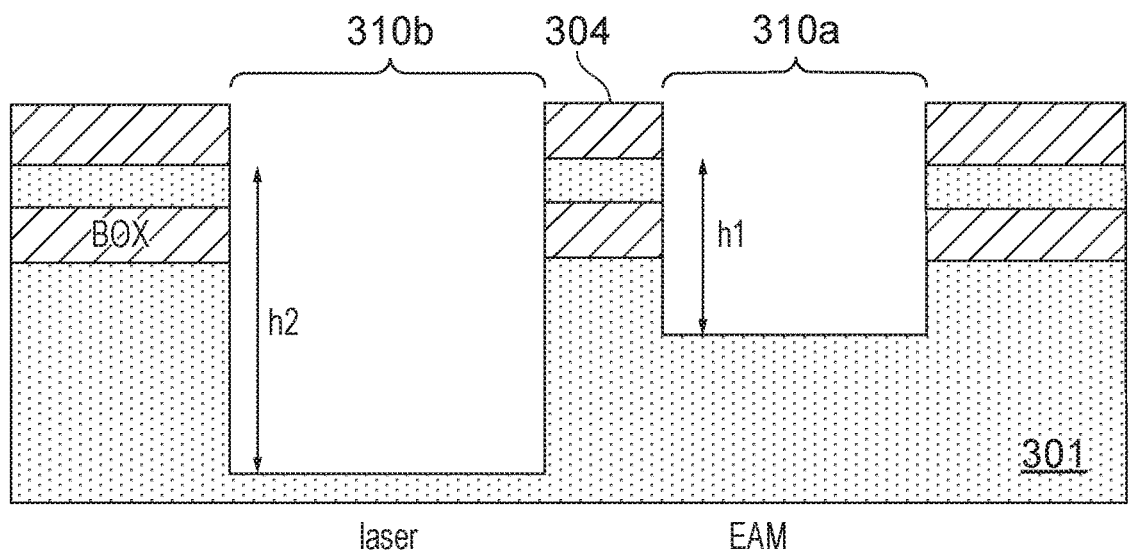

A first cavity region 310a and a second cavity region 310b are etched into the substrate 1 using standard SOI etching techniques as shown in FIG. 4b. In this embodiment, the first cavity region and second cavity region are entirely separate, so form two separate cavities. The first cavity region has a first depth h1 and the second cavity region has a second depth h2 which is greater than the first depth. Both the first cavity region and the second cavity portion extend through the silicon device layer, the BOX layer and beyond, down into the silicon base layer 301. The two cavities are separated by an intermediate portion of substrate 304.

Figure 4C:
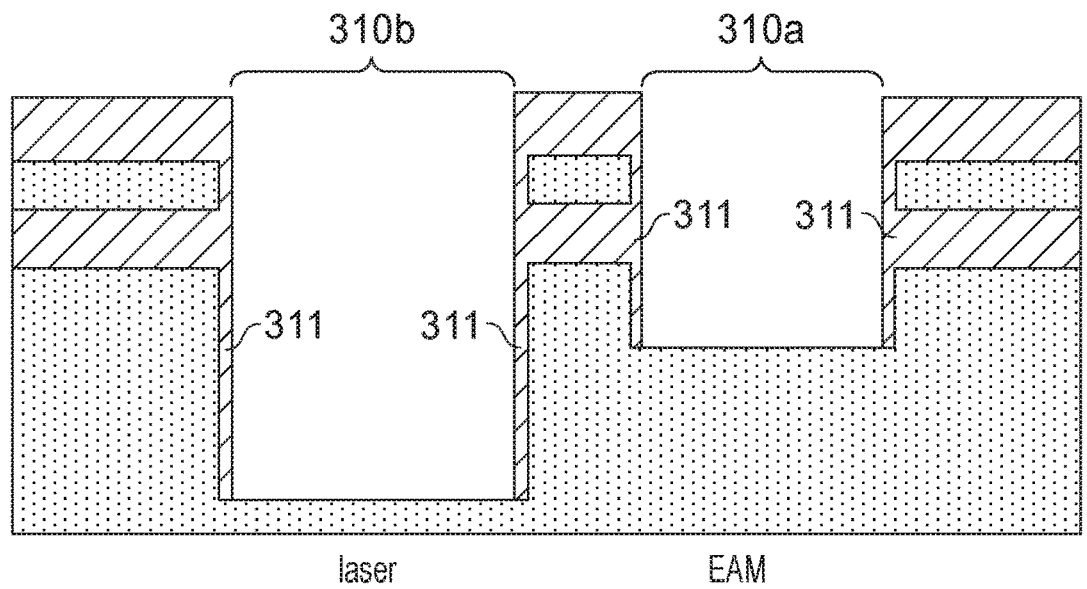

The sidewalls of the first cavity region and second cavity region are each coated in $SiO_2$ (FIG. 4c). A process such as thermal oxidation may be used to deposit these sidewall liner layers. A typical thickness for these layers would be 50 nm or around 50 nm. Note that these $SiO_2$ may be considered to be present in subsequent figures (although not shown). Although they are not shown in relation to the embodiment of FIG. 2a-2g, it should be appreciated that they could also be applied for that embodiment.

Figure 4D:
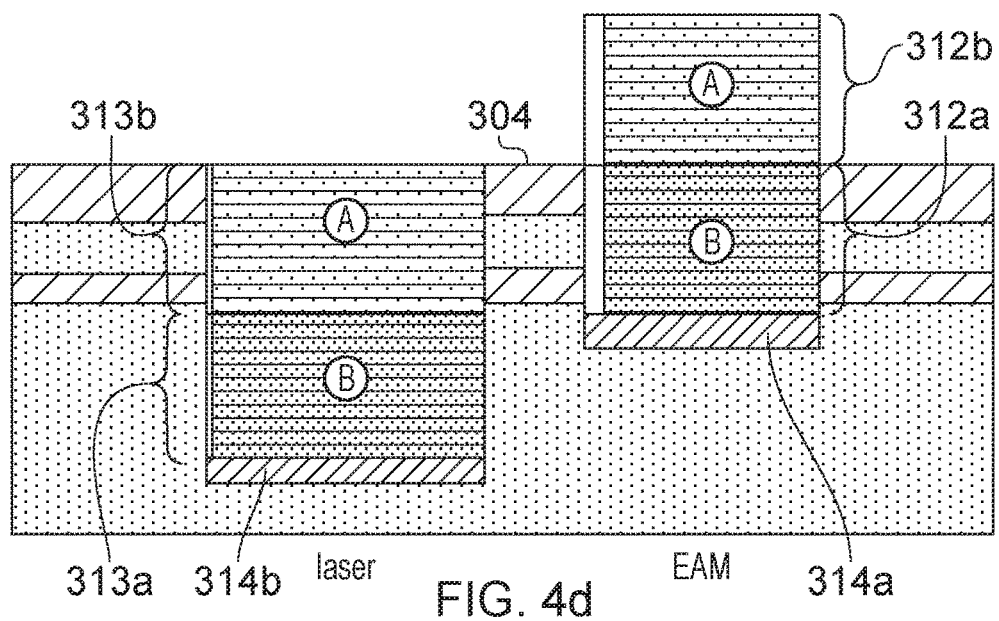

The multistack epi layer is then deposited in a single epi growth step (FIG. 4d), a multistack epi layer is grown into the first and second cavity regions simultaneously. The multistack epi layer is made up of a first multistack portion 312a, 312b with a second multistack portion 313a, 313b located directly on top of the first multistack portion. A buffer structure 314a, 314b may be grown on the base of the first and second cavities before the multistack epi layers are grown. In this embodiment, the active layer of the first multistack portion corresponds to an EAM, and the active layer of the second multistack portion corresponds to a laser diode. That is to say, the EAM section of the multistack is located directly underneath the laser section of the multistack.

During growth of the multistack epi layer (FIG. 4d), the thickness of the $SiO_2$ sidewalls will reduce to around 20 nm. As with previous embodiments, the epi layer thickness is designed such that when grown into the two cavities of different depths, the laser and EAM optical mode is aligned with the SOI waveguide mode in vertical direction. In other words; the first active layer and the second active layer are located on the same level of the final device as each other and also on the same level as the device layer 303 of the SOI substrate.

Figure 4E:
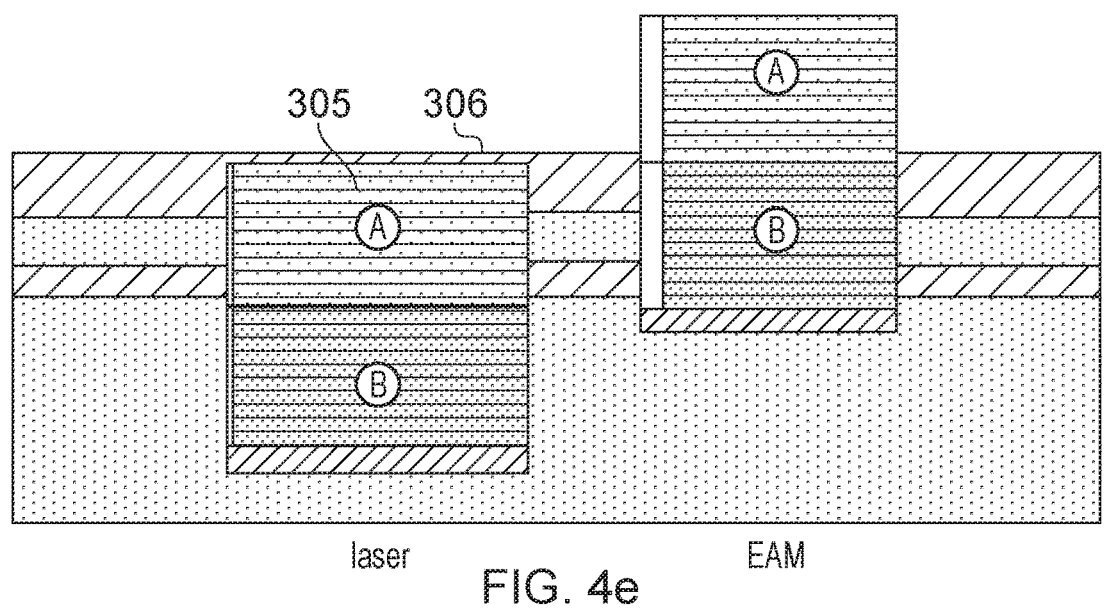
Figure 4F:
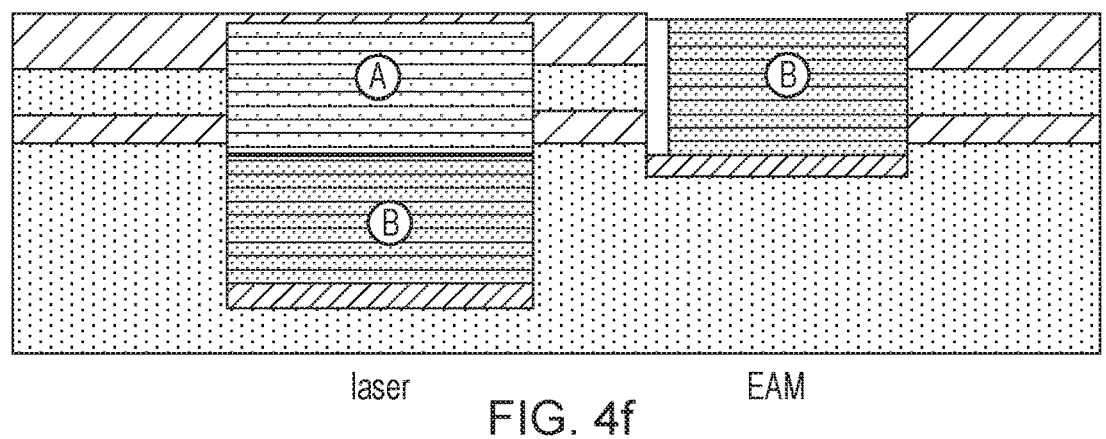

A $SiO_2$ layer 306 is formed on all areas other than above the first cavity region (FIG. 4e), before the surplus region 312b of the multistack epi layer in that first cavity region is etched (FIG. 4f), the surplus region being that which extends upwards from the SOI substrate and corresponds to the layers of the second multistack portion. There is an etch stop layer present in the multistack, in this case an InGaAs in the EAM stack (the first multistack portion). An alternative to etching could be surface planarization via Chemical Mechanical Polishing (CMP).

Figure 4G:
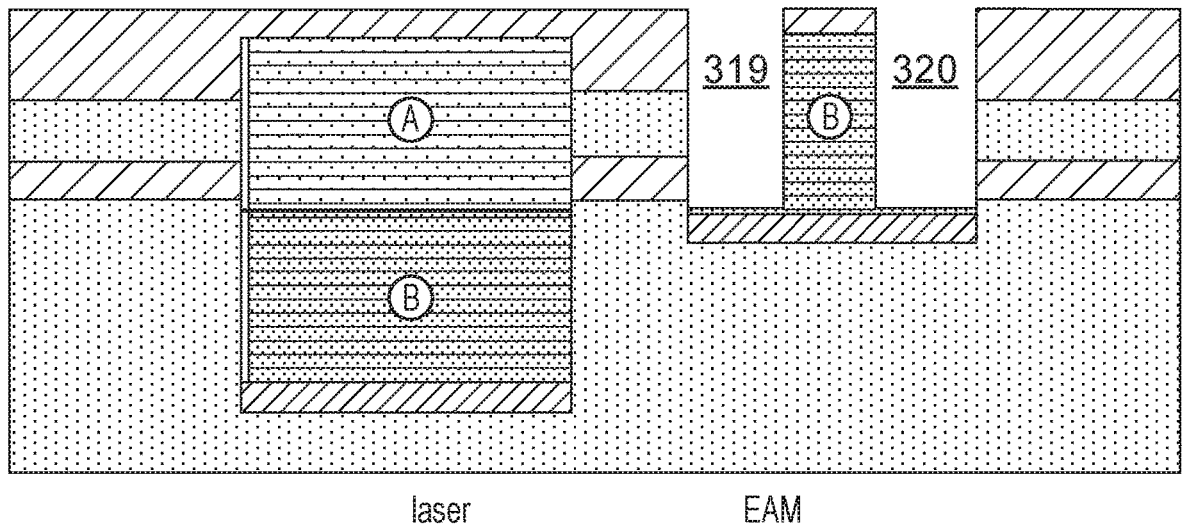
Figure 4H:
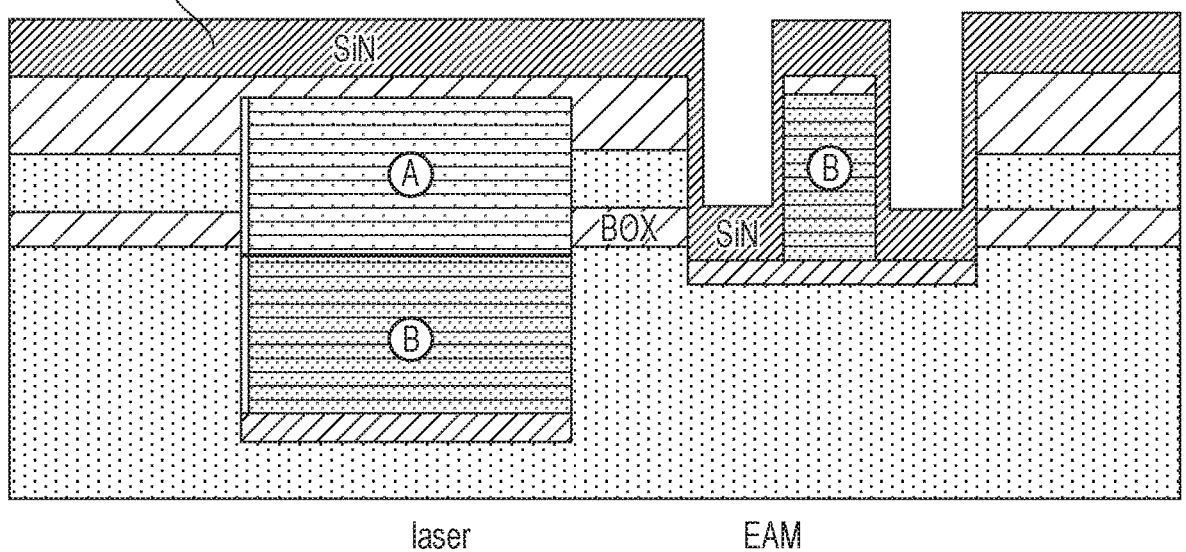

Once surplus sublayers of the stack have been removed, trenches 319, 320 are etched (FIG. 4g) in the multistack portion within the first cavity region in order to remove any edge defects. In more detail, this step involves depositing a hard etching mask such as SiO$_2$, patterning the areas to expose regions corresponding to the desired trench locations at the facets of the first multistack portion 312a (the EAM multistack in this embodiment). The depth of the trenches 319, 320 are chosen to extend below the BOX layer of the SOI substrate and into the silicon base layer. Trenches are then filled (FIG. 4h) with a high index liner layer such as silicon nitride. In the embodiment shown, this may take the form of a silicon nitride liner 330 having a refractive index of 2.7. Typical thicknesses of the SiN layer on the sidewalls of the trenches may be at or around 240 nm. The thickness on the bottom of the trench will usually be greater than that on the sidewalls (e.g. at or around 510 nm). In the embodiment shown, the top surface of the silicon nitride located at the bottom of the trench is chosen to align with the upper surface of the BOX layer.

Figure 4I:
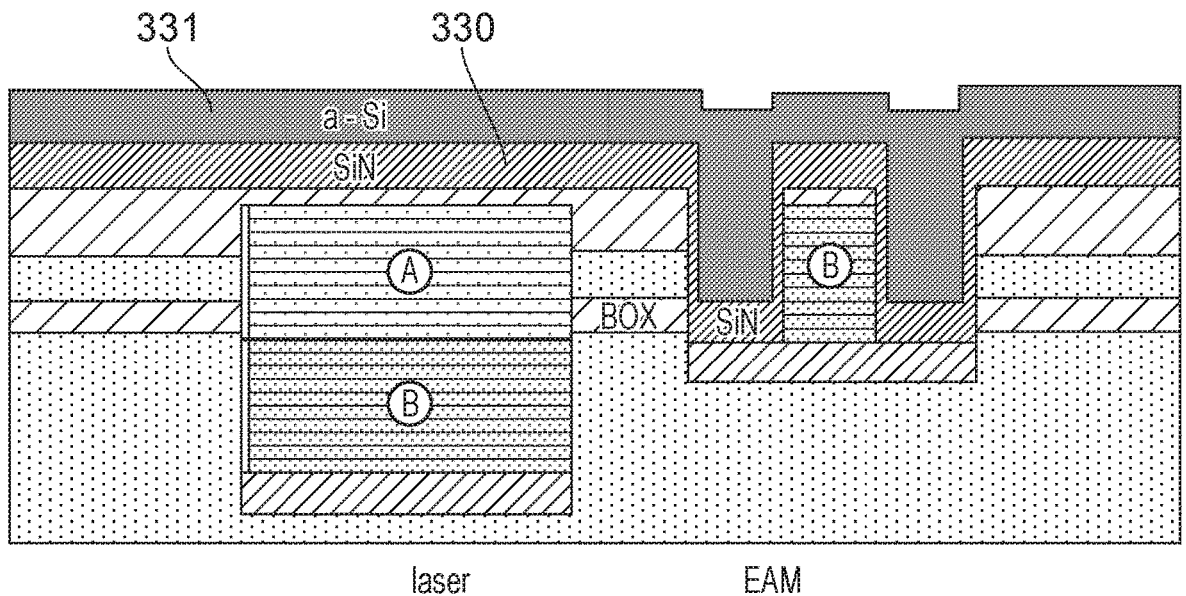
Figure 4J:
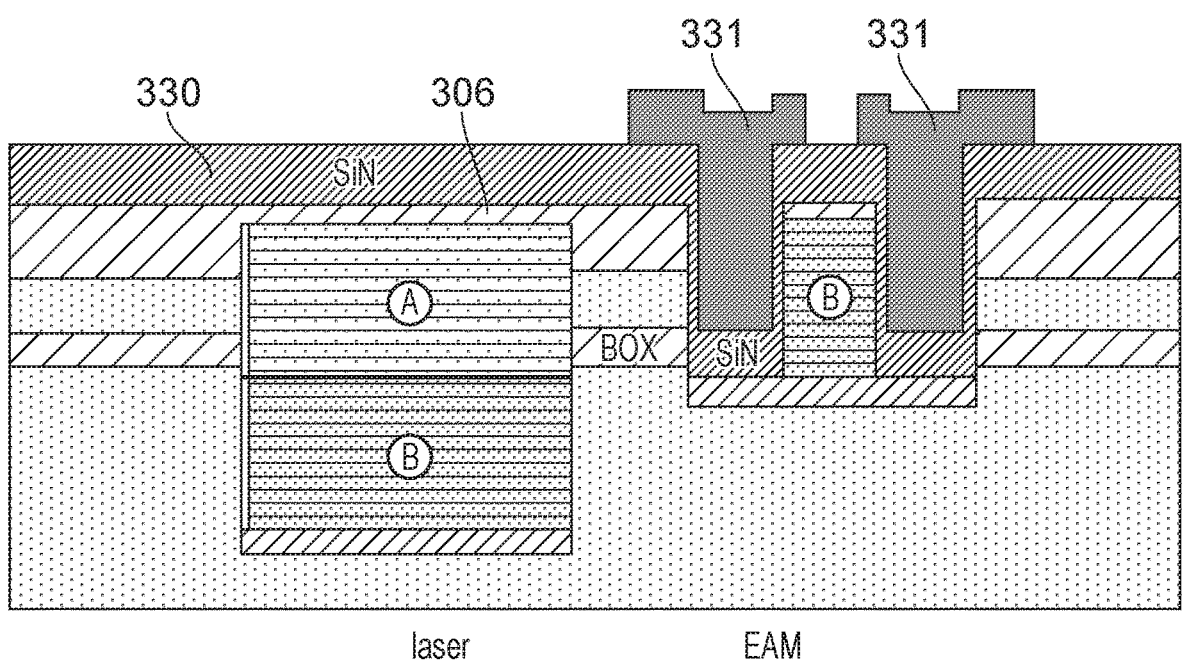
Figure 4K:
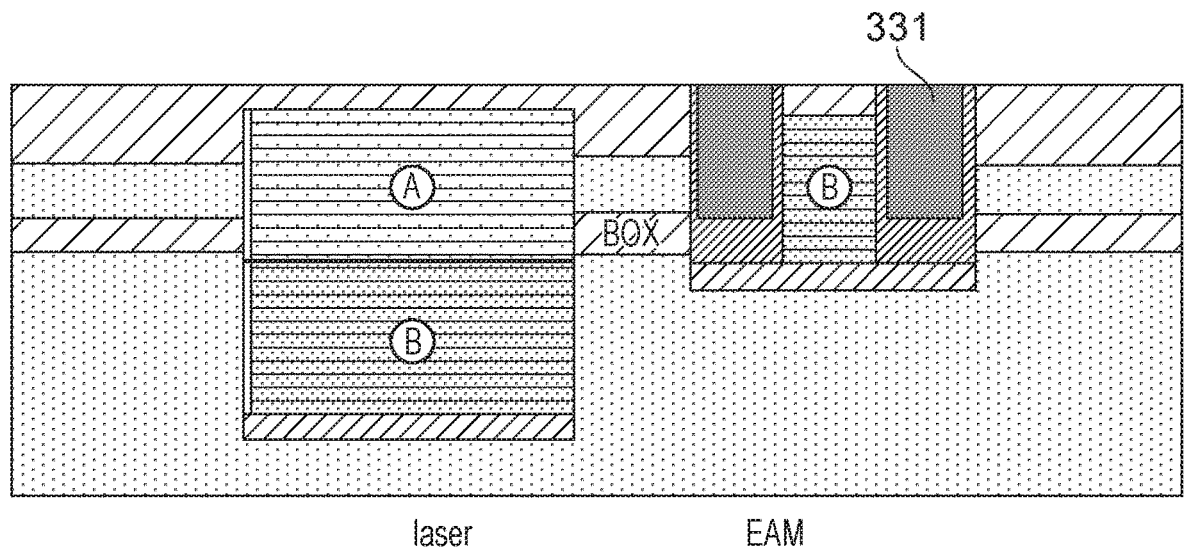
Figure 4L:
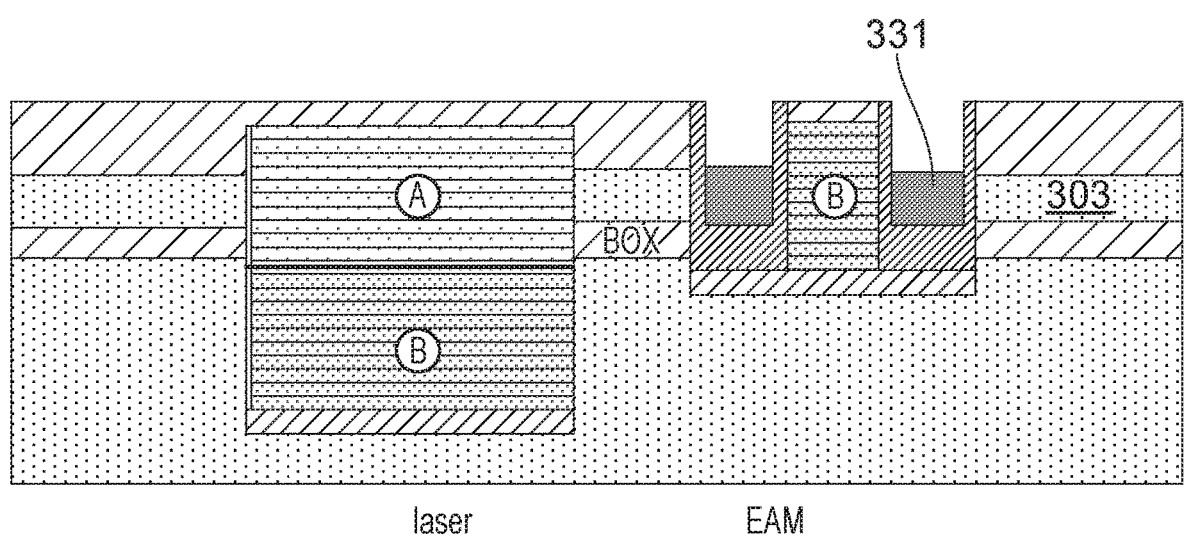
Figure 4M:
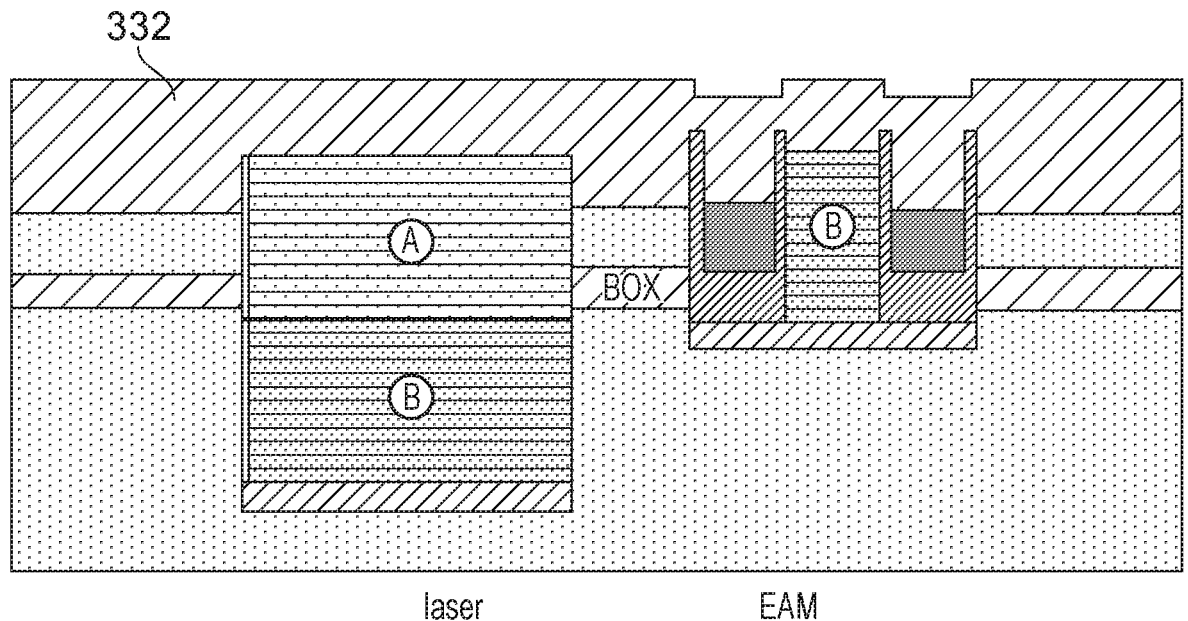
Figure 4N:
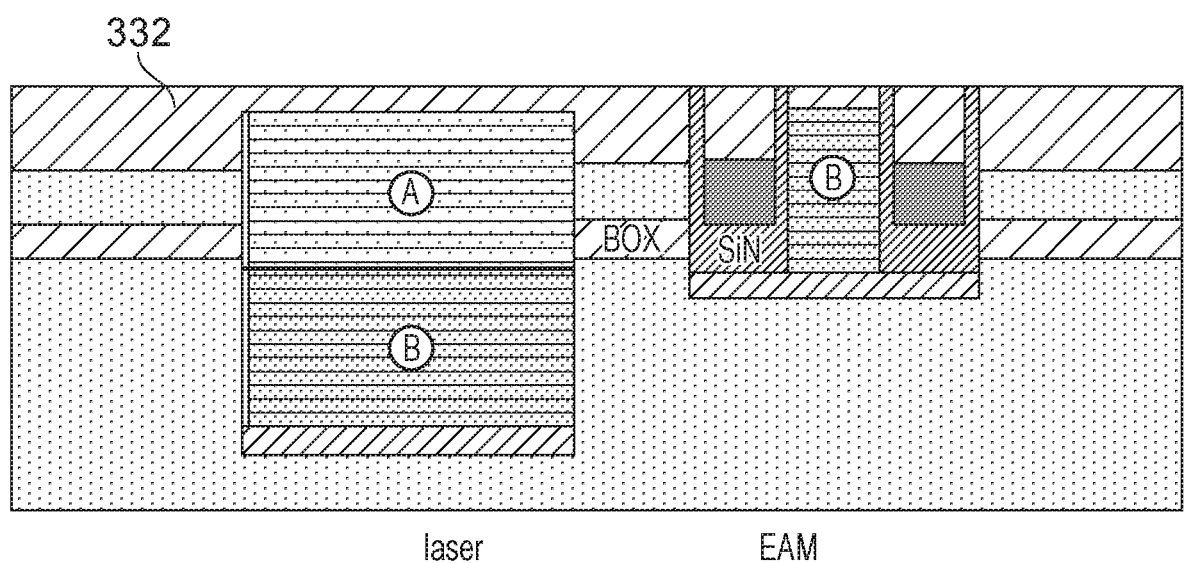

Once the liner layer has been deposited within the trenches, the remainder of the trenches 319, 320 are filled with amorphous Silicon (α-Si) (FIG. 4i). The amorphous Si layer is then etched (FIG. 4j) to extend only to regions above the trenches and over spilling outwards at the areas immediately surrounding the opening of the trenches. In this way, it acts to release stress and reduce wafer bowing during the subsequent removal stage (FIG. 4K) at which the amorphous silicon 331 and silicon nitride 330 are removed using CMP; the SiO$_2$ layer 306 below the silicon nitride layer 330 acting as an etch stop. A dry etch process is then used (FIG. 4l) to etch the amorphous Silicon filling such that the top of the amorphous Silicon aligns at level with the top of the device layer 303 of the SOI substrate. A further layer of SiO$_2$ is then deposited (FIG. 4m) before yet another planarization step is carried out (FIG. 4n) on the SiO$_2$ layer.

Figure 4Q:
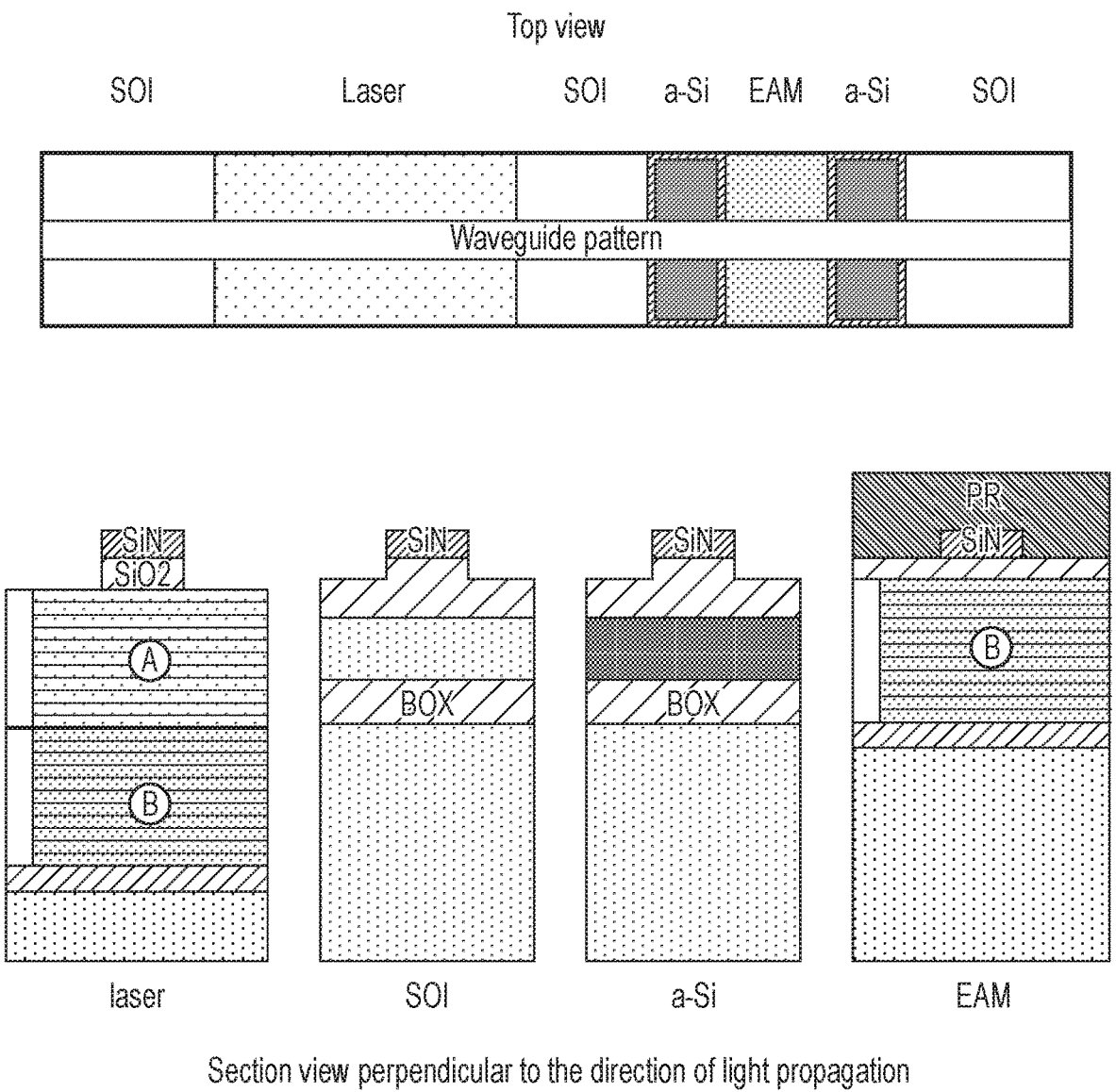
Figure 4R:
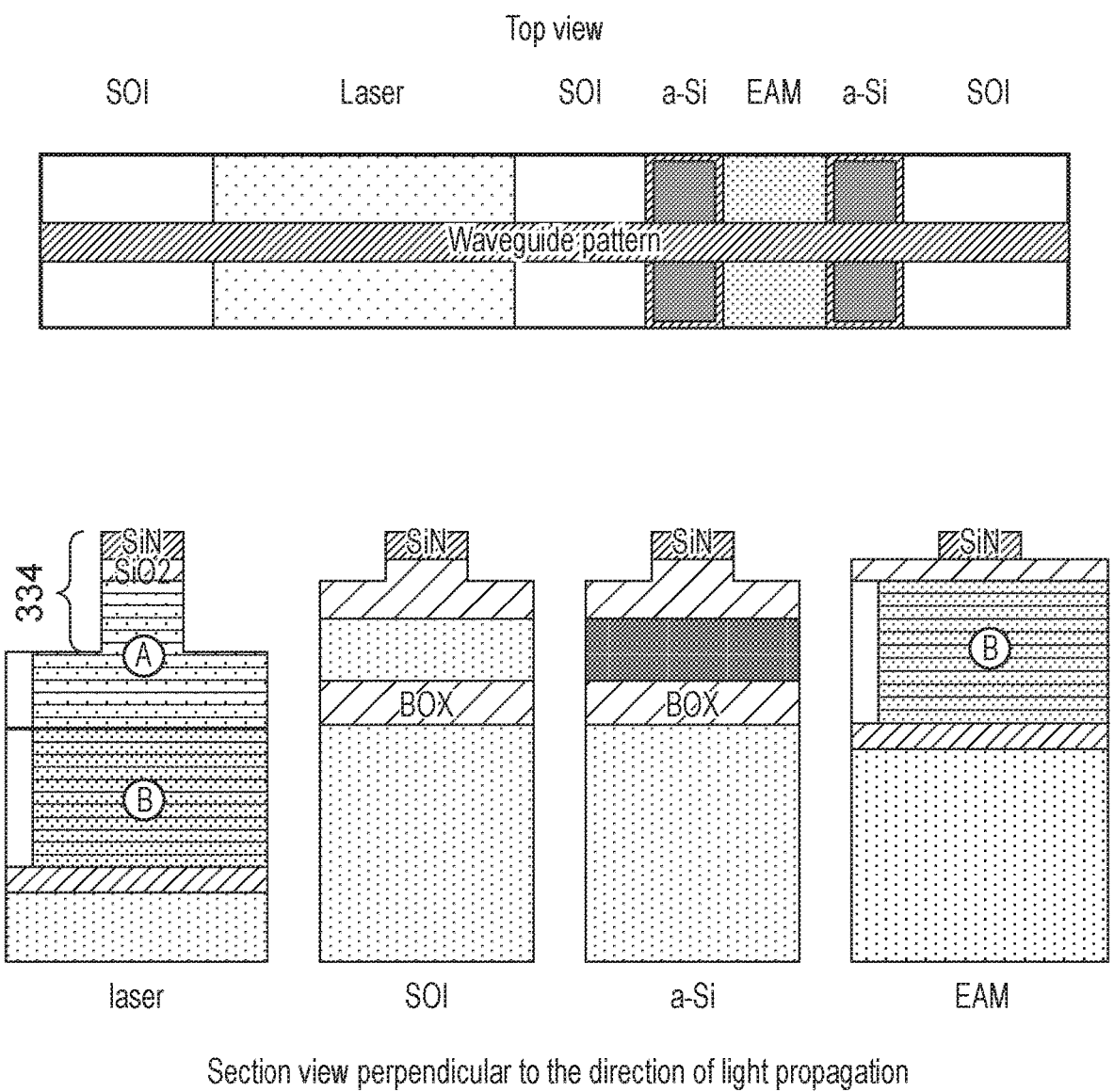
Figure 4S:
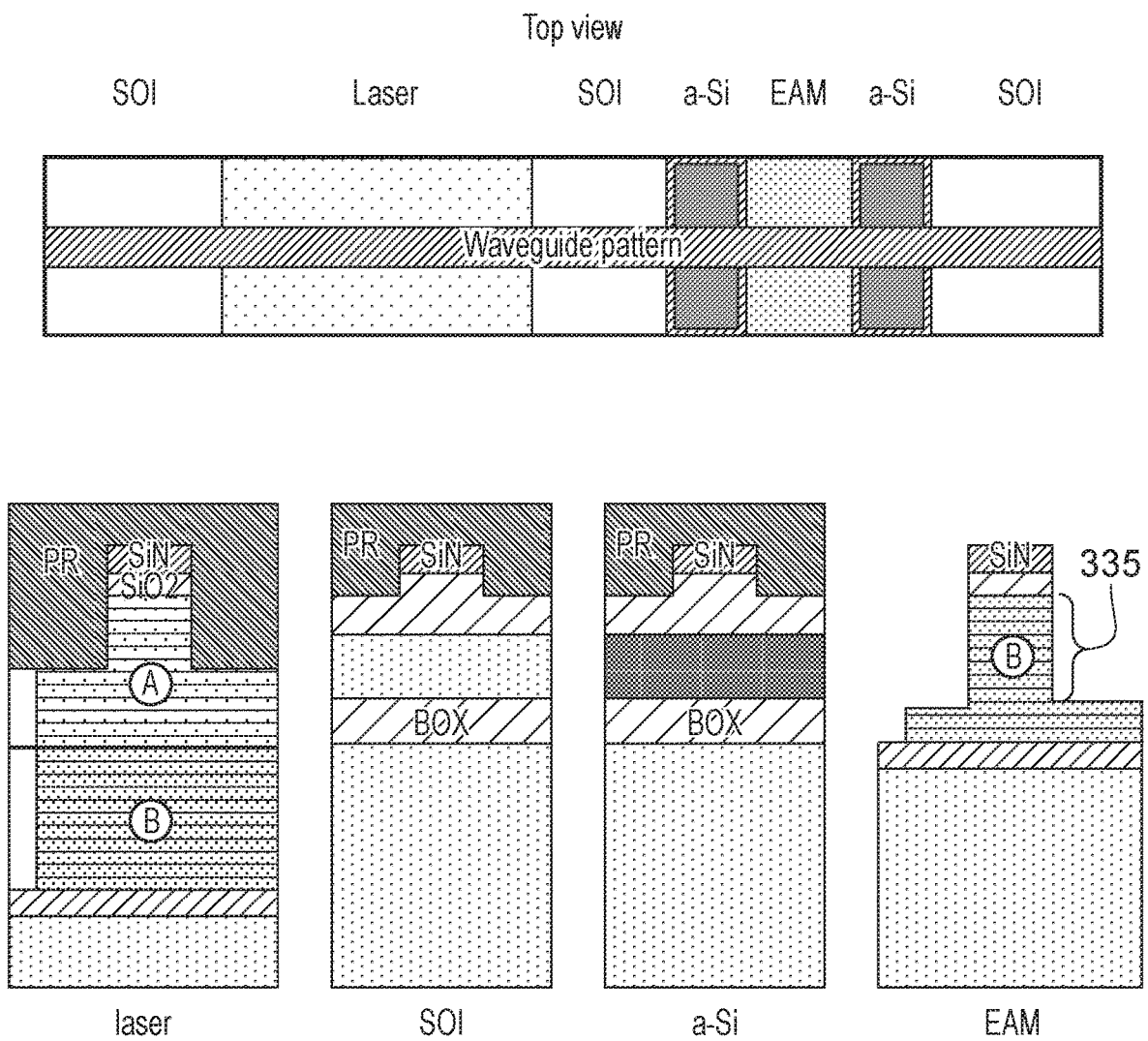

Steps are then carried out to fabricate the waveguide structure. A layer of waveguide material, for example Si$_3$N$_4$ is deposited (FIG. 4o) and the desired waveguide structure etched into this silicon nitride layer (FIG. 4p). Then the first cavity (a cavity for the EAM) is covered with photoresist (FIG. 4q). A further etching step is then carried out (FIG. 4r) to etch a waveguide structure 334 at the second multistack portion within the second cavity region (a cavity for the laser). Etching is carried out down to the etching stop layer of the second multistack portion above the intrinsic layer in the second cavity to form a ridge waveguide in which the intrinsic layers are right below the etch stop layer After the waveguide etching for laser, the waveguide 335 for the EAM is etched from the first multistack in the first cavity by covering the rest parts with PR (FIG. 4s). Etching is carried out down to the n doped layer of the first multistack portion in the first cavity, resulting in a waveguide with sidewalls which extends down the n doped layers of the respective multistack portion and also the intrinsic layers, including any layer(s) which make up the active region.

Figure 4T:
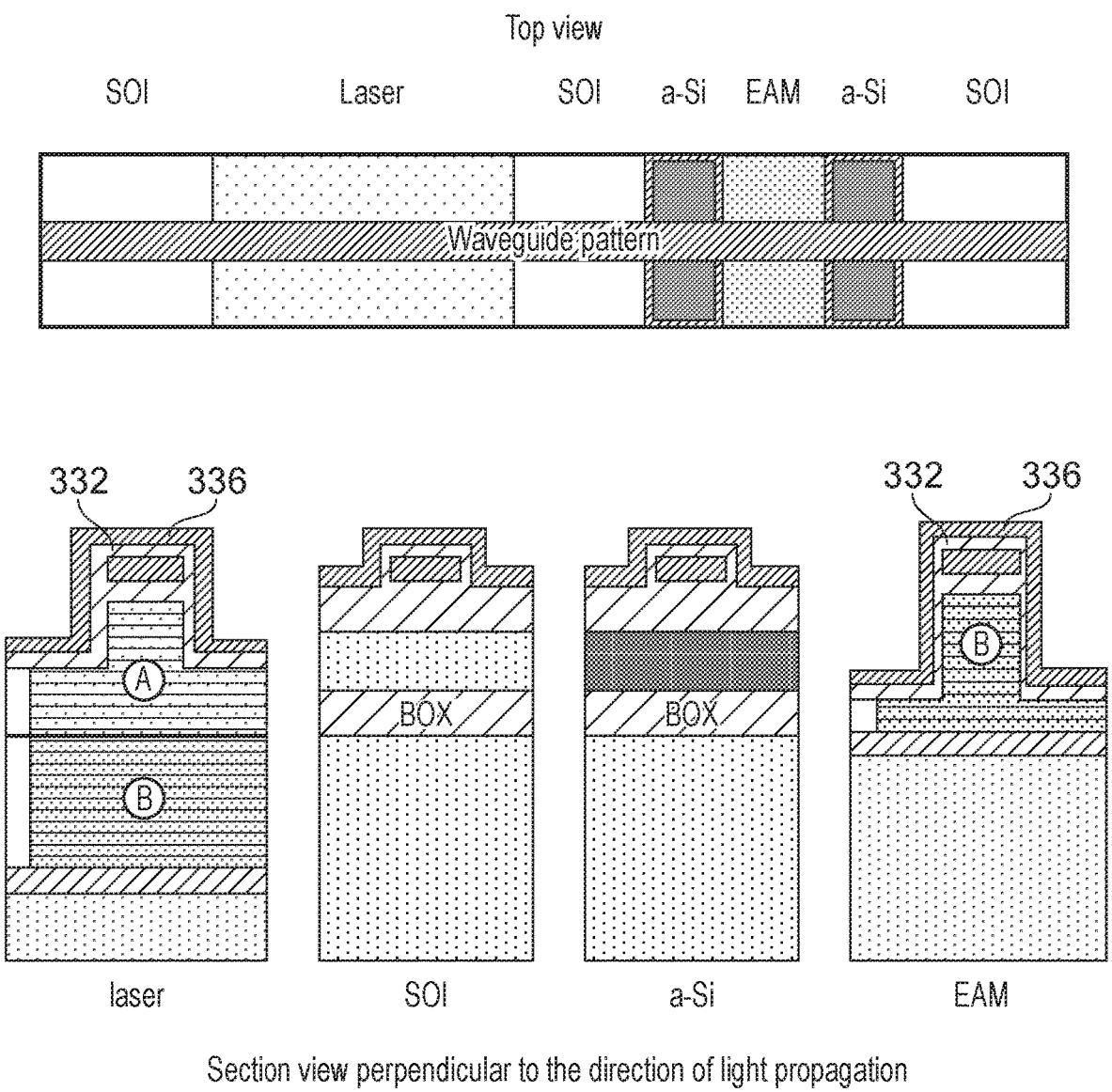
Figure 4U:
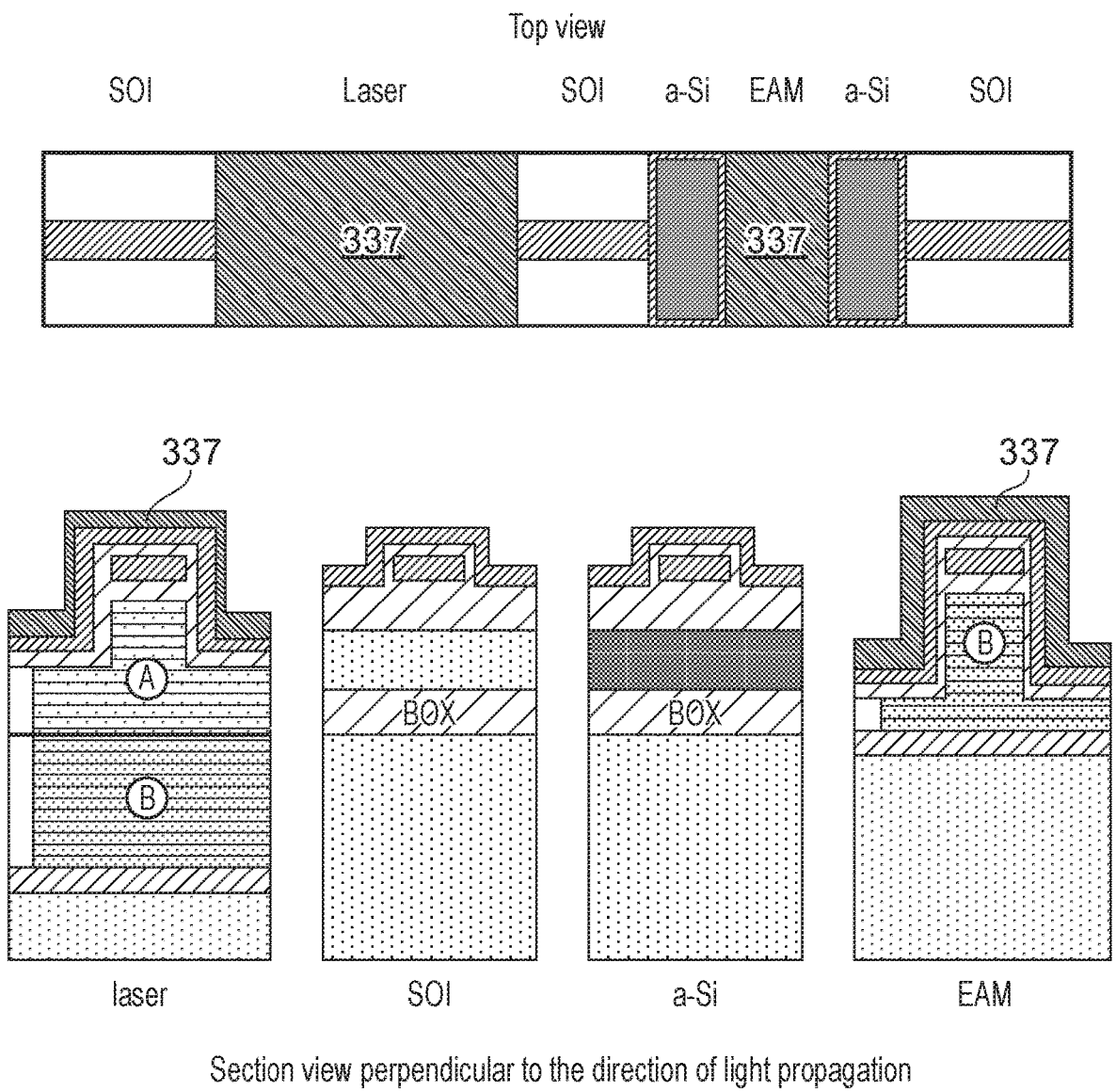
Figure 4V:
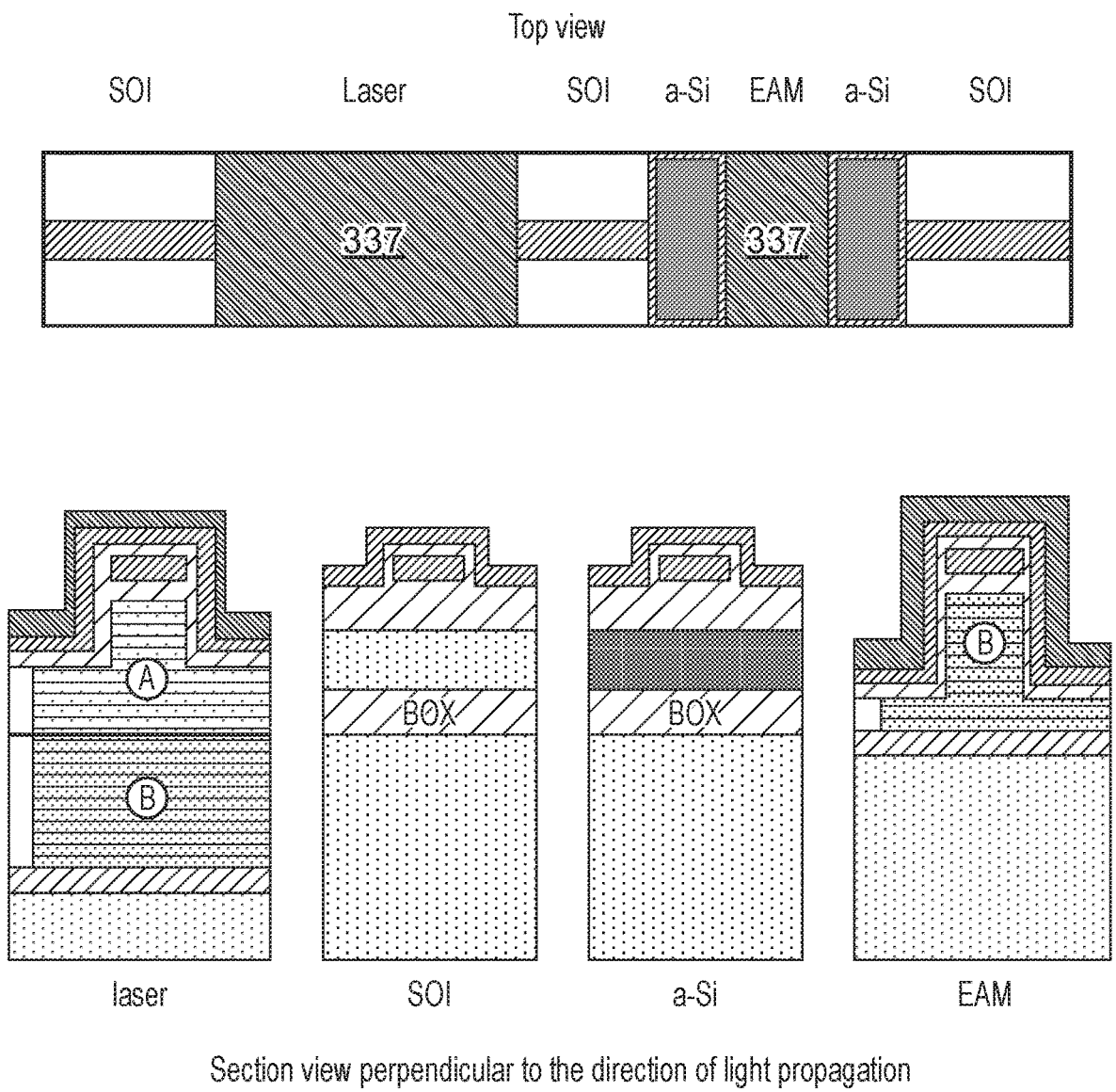
Figure 4W:
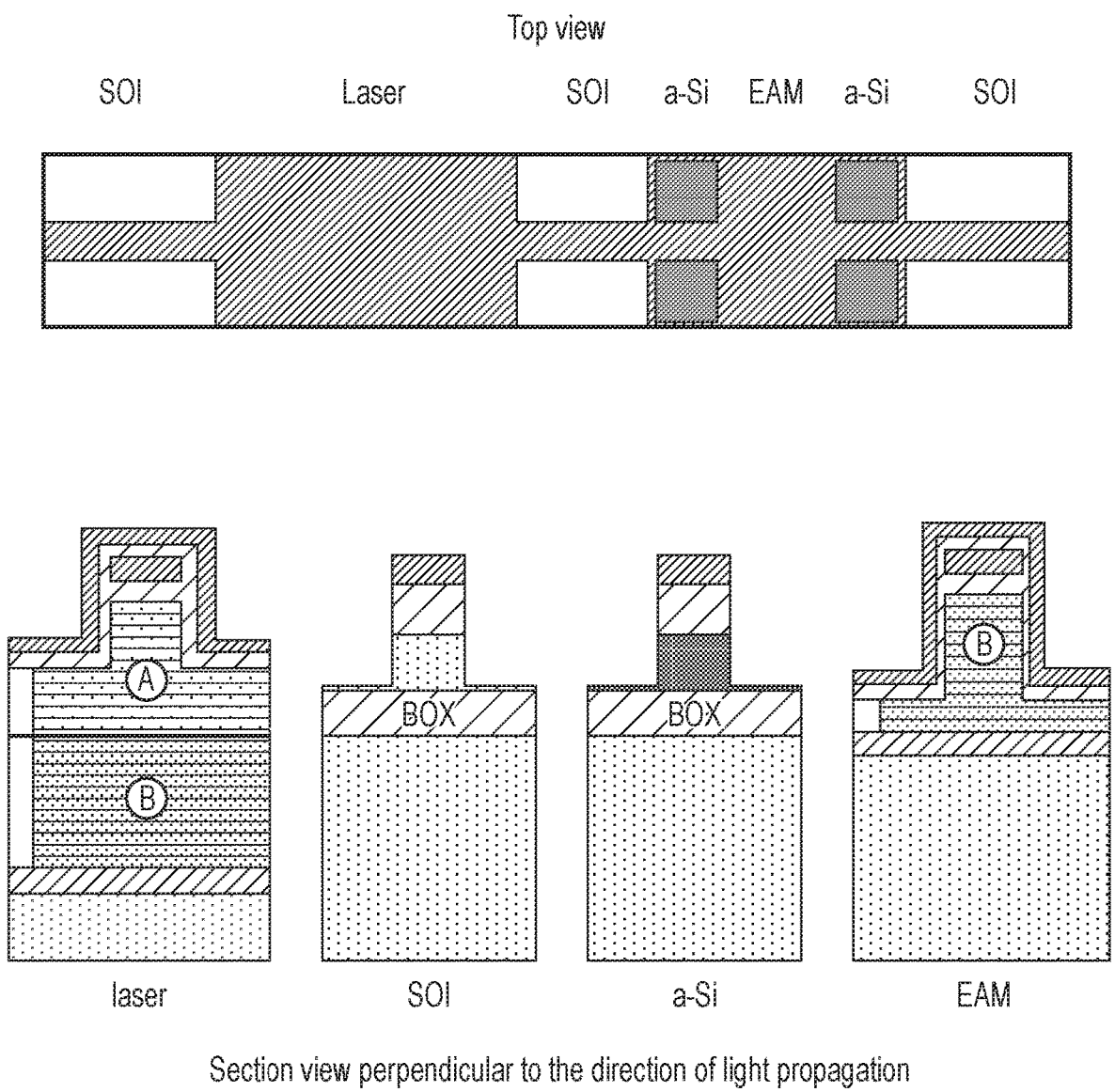
Figure 4X:
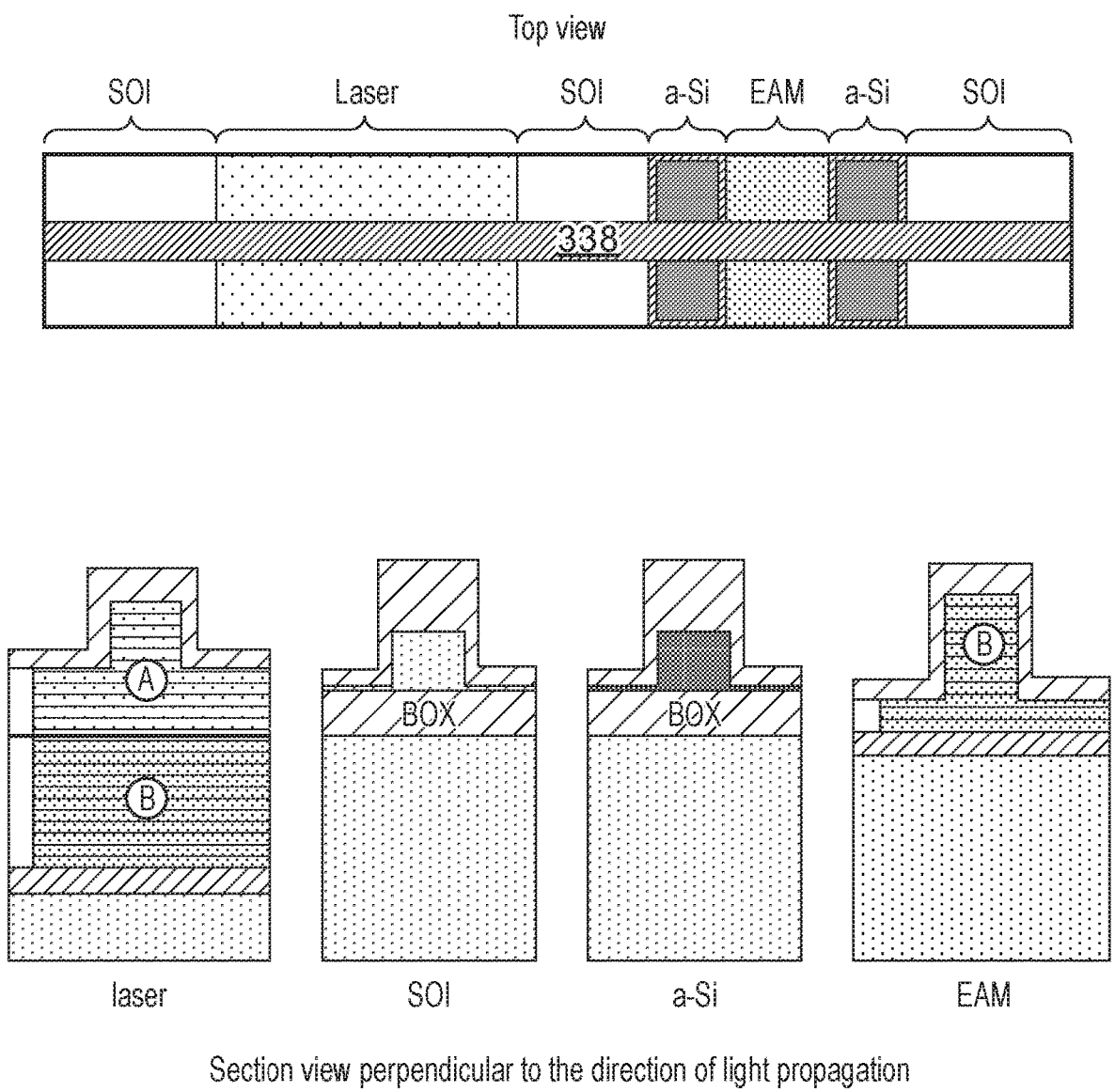

Once the waveguide structure has been etched, a layer of an oxide such as SiO$_2$ 332 is deposited, followed by a layer of silicon nitride 336 (FIG. 4t). A photoresist 337 is then used to cover a region above the first cavity (which in this embodiment forms the EAM of the device) and the second cavity (which in this embodiment forms a laser). The remaining SOI and amorphous Si sections are then exposed (FIG. 4u) and etched (FIG. 4v, FIG. 4w) so that the SOI waveguide connecting to and from the multistack waveguide regions have a waveguide height which is the same as or substantially the same as the waveguides fabricated from the first multistack in the first cavity for EAM. The laser waveguide from the second multistack in the second cavity may have a different waveguide optical mode size from that of the first multistack in the first cavity due to the nature of the ridge waveguide. In this way, light is conveniently guided into and out of the active regions of the waveguides that have been formed from the etched multistack 338 (FIG. 4w). The layer of silicon nitride 336 is removed and a new layer of SiO$_2$ deposited to build up the height of any waveguide regions with lower sidewalls. A single guided waveguide then passes along the length of the device, the waveguide being made up of a plurality of different waveguide portions located at different locations along its longitudinal axis. As illustrated in FIG. 4x, these waveguide portions include: SOI portions ("SOI"), a laser waveguide portion ("Laser"), an EAM waveguide portion ("EAM") distanced from the laser waveguide portion by an SOI waveguide portion ("SOI"), amorphous Si waveguide portions ("a-Si") at either side of the EAM portion, the amorphous Si waveguide portions being located in-between the EAM waveguide portion and SOI portions either side of the EAM waveguide portion.

Figure 4Y:
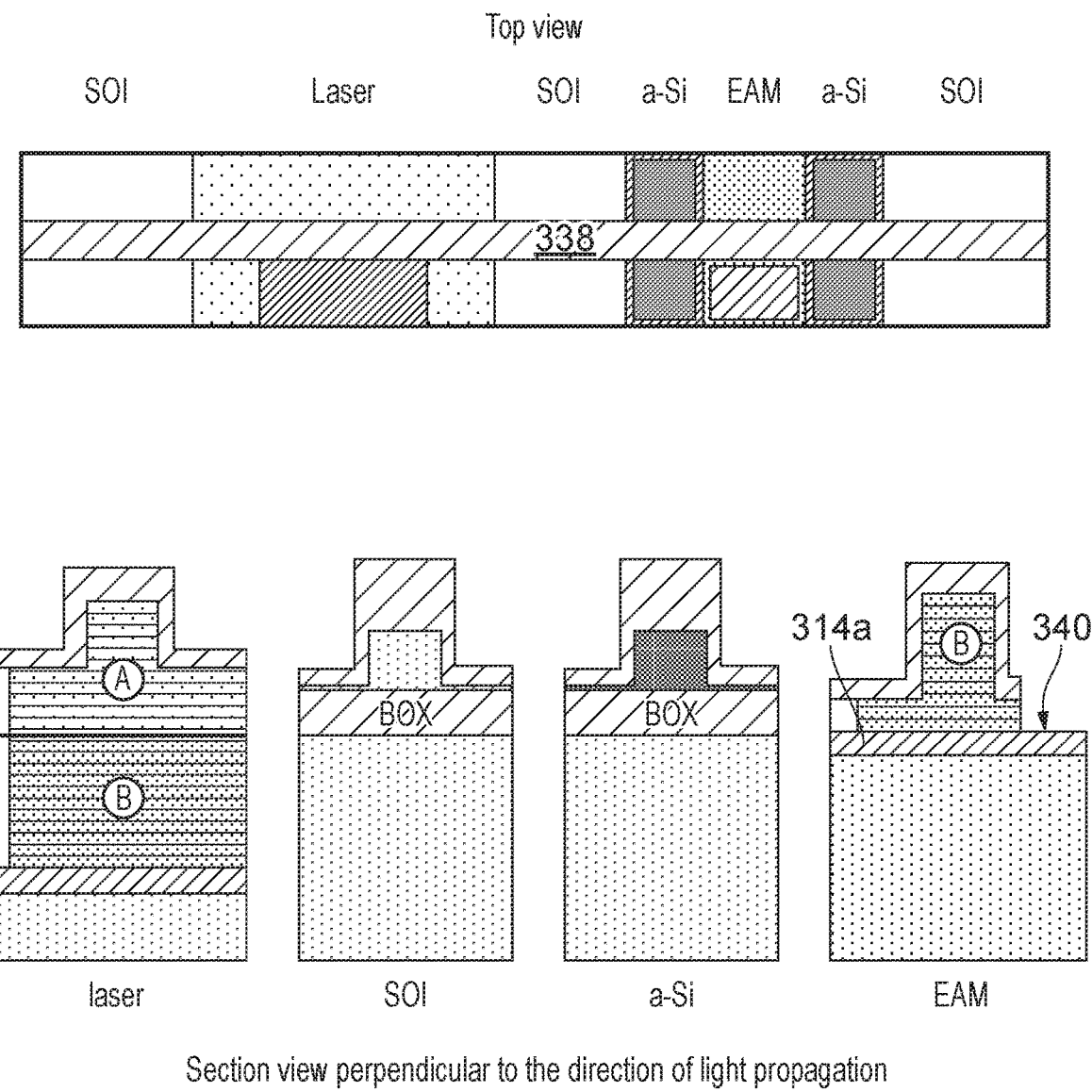

As can be seen from FIG. 4y, an EAM isolation area 340 is etched in the EAM portion for receiving a further electrode. The second isolation area 340 extends down through the entire multistack epi layer to the buffer structure 314a underneath. A via is created at the top of each of the laser waveguide and the EAM waveguide to provide a path for an electrical contact to the uppermost layers of the respective multistack portions. Electrodes 341a, 341b, 342a, 342b are then deposited (FIG. 4z) to the laser portion and to the EAM portion via metallization to enable a bias to be applied across the pin junction of each of the laser waveguide and the EAM waveguide.

Figure 4Z:
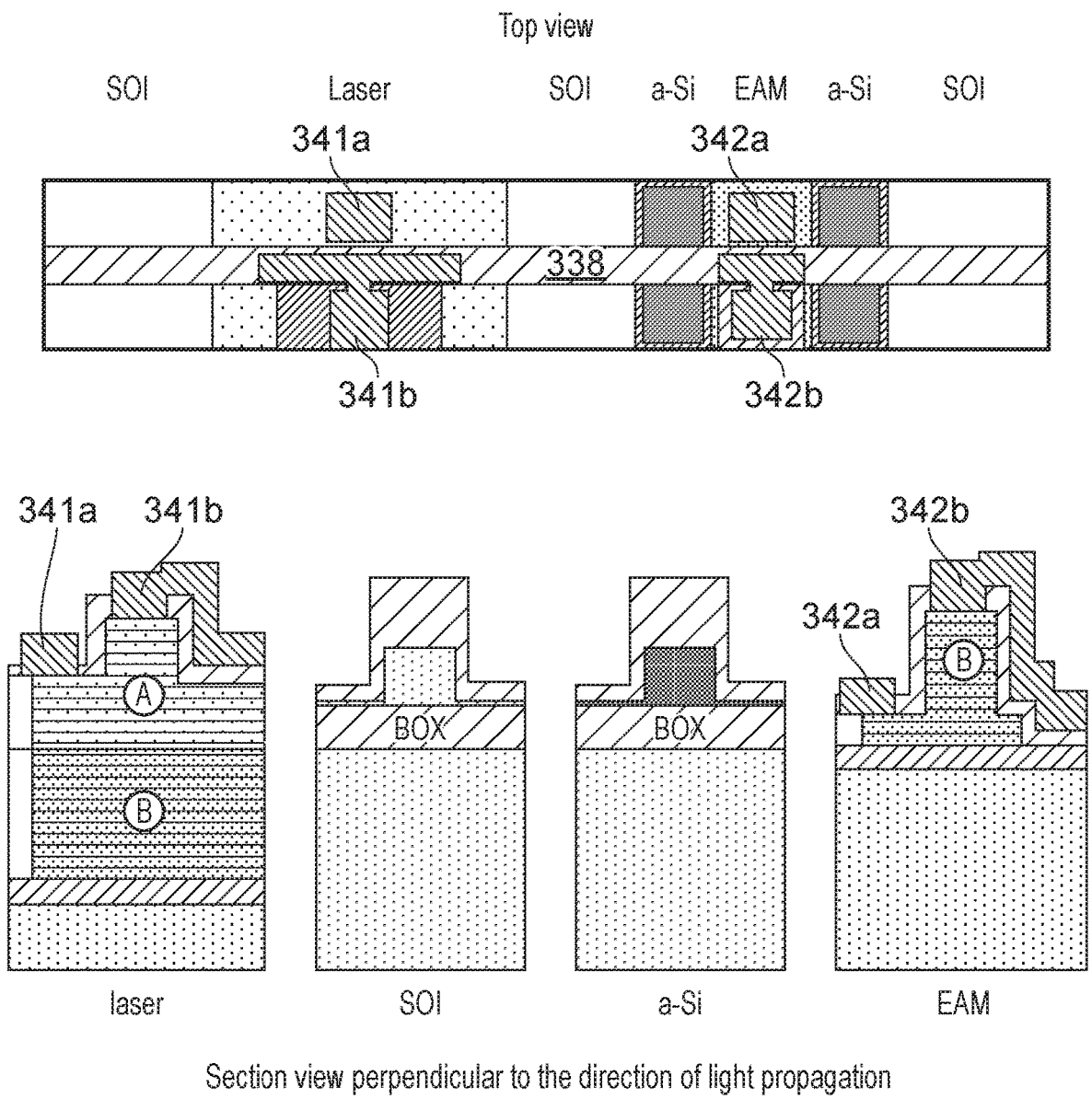
Figure 4Z:
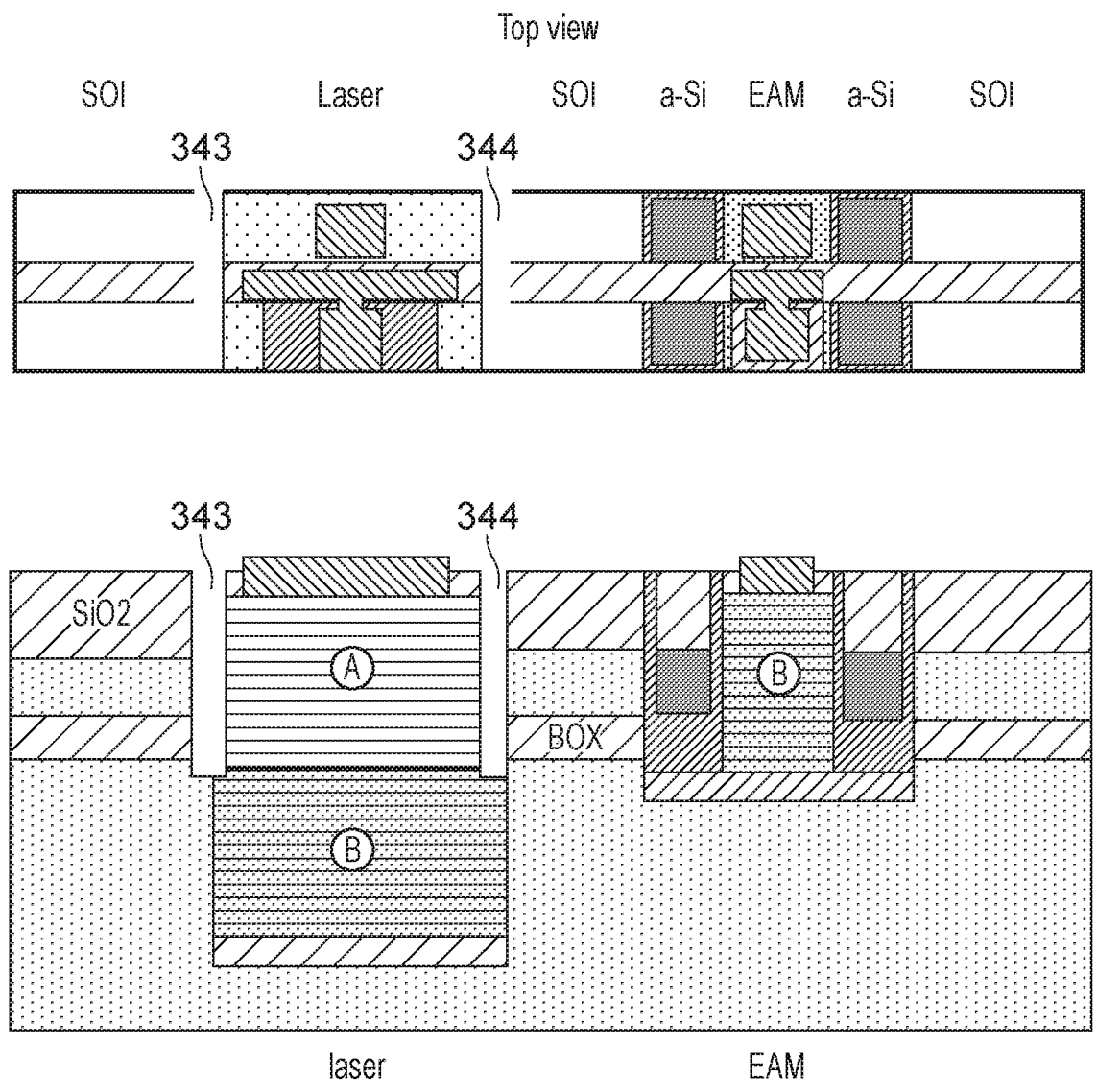
Figure 4Z:
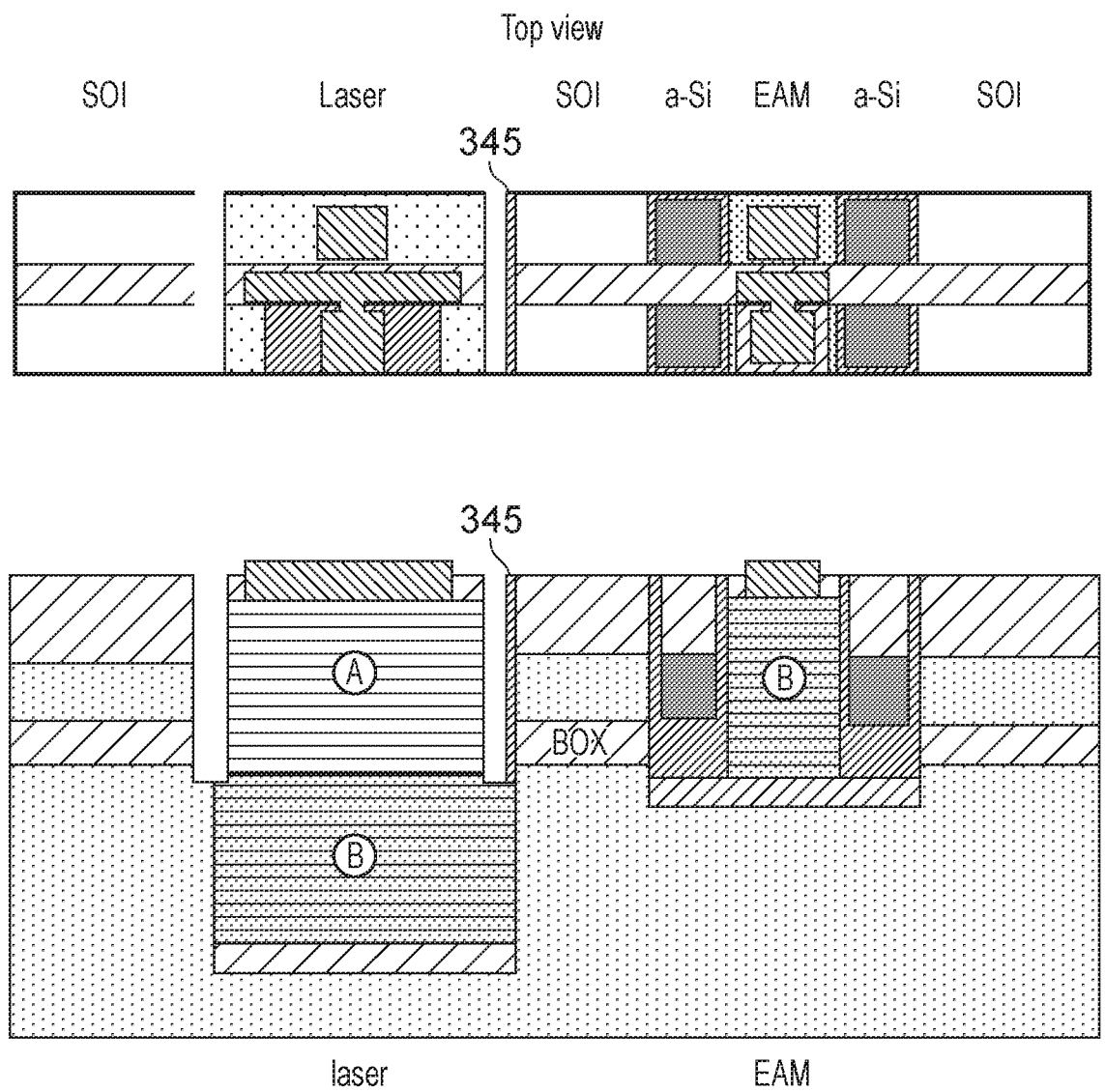

As shown in FIG. 4za, facets are etched at the input and output of the laser waveguide portion. These facets are then coated with antireflection coating as shown in FIG. 4zb.

Although the embodiment described above in relation to FIGS. 4a-4zb relates to an optoelectronic device having an intermediate substrate region, it should be appreciated that any one of, or combination of the steps could also be applied to the embodiment described in relation to FIG. 2a-2g.

Figure 5:
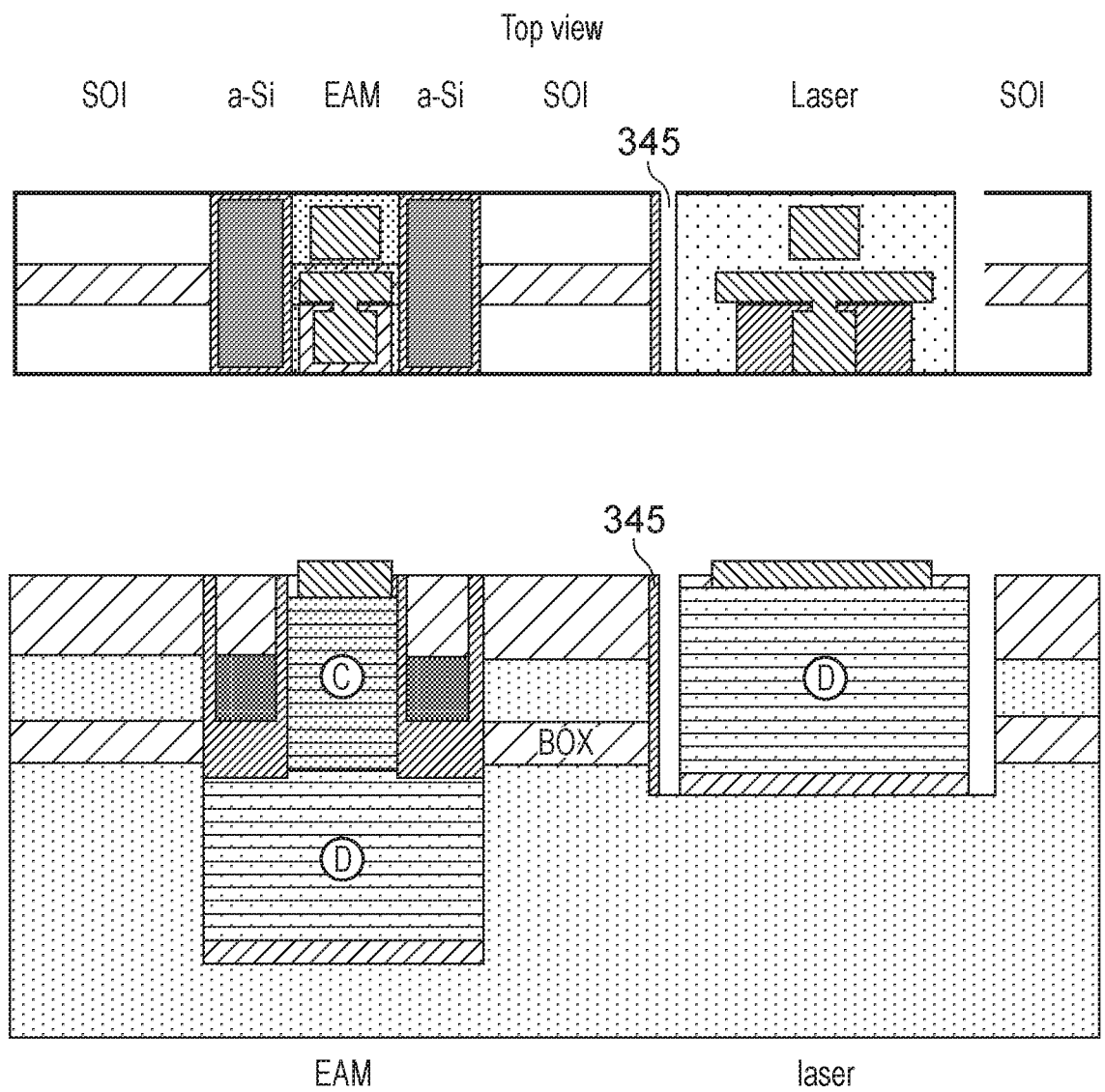
FIG. 5 depicts an optoelectronic component comprising a multistack epi layer such as that of FIG. 3b.

FIG. 5 shows an alternative embodiment which differs from the embodiment of FIGS. 4a-zb in that the ordering of the multistack has been reversed. In this case, the multistack portion containing the laser active layer is located underneath the multistack portion containing the EAM active layer. The first cavity will therefore ultimately house the laser waveguide portion and the EAM waveguide portion will be formed within the second (deeper) cavity. The multistack epi structure may take the form of that shown in FIG. 3b. Fabrication steps set out above in relation to FIGS. 4a-4zb will be carried out, but adapted to account for the fact that the ordering of the multistack portions have been reversed.

Figure 6A:
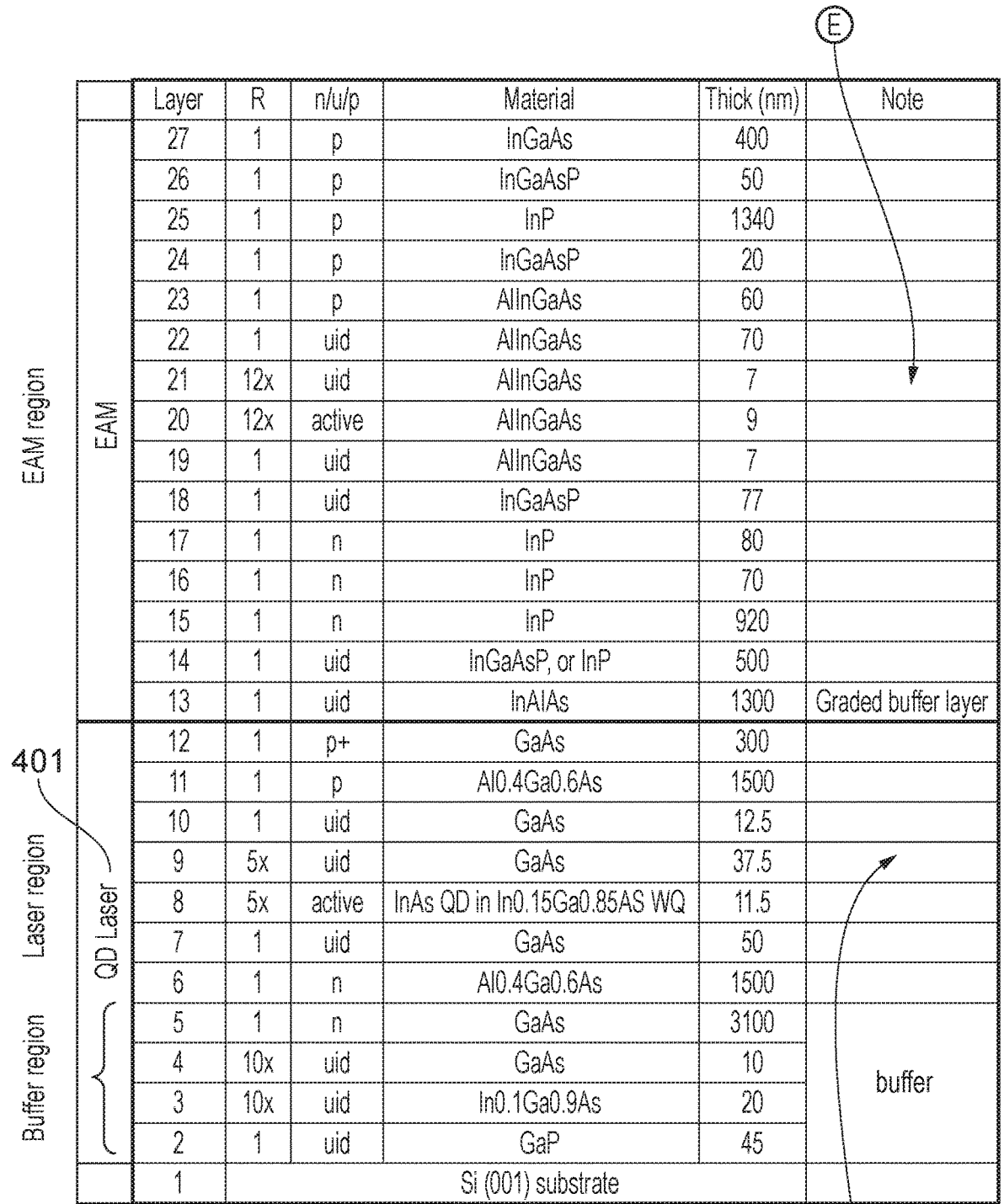
Figure 6B:
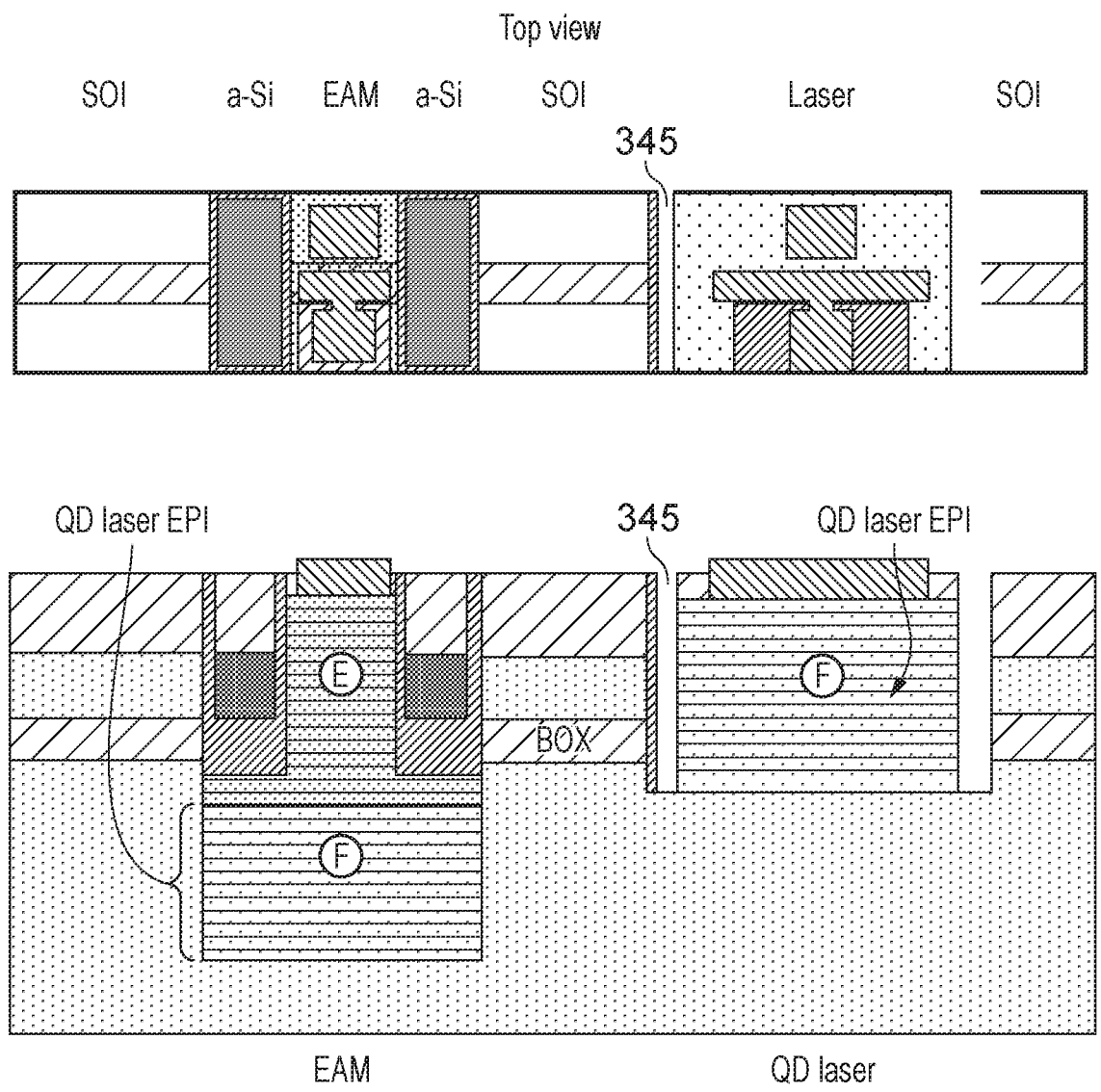
Figure 7B:
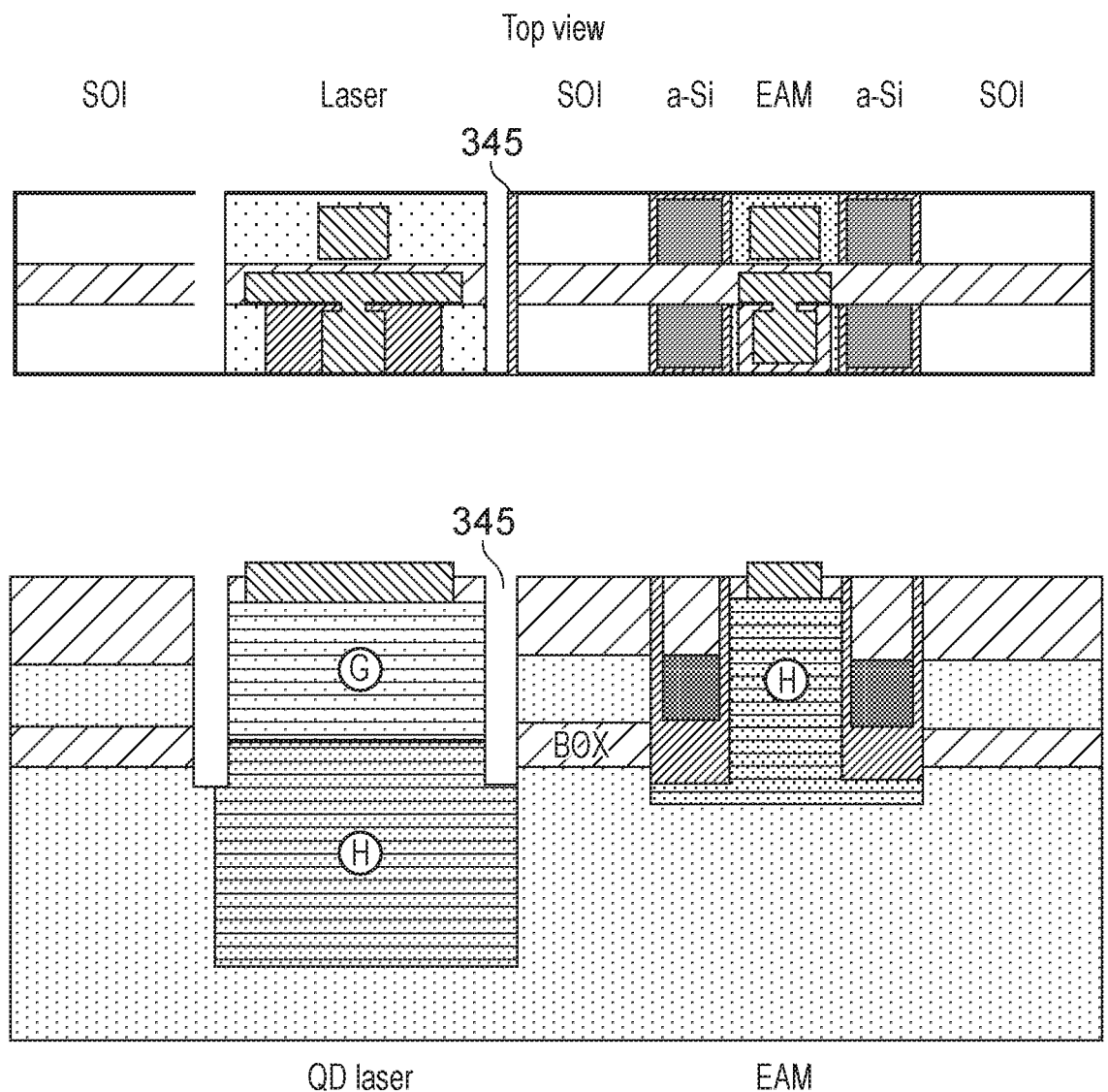

Referring to FIGS. 6a and 6b, a further embodiment of the optoelectronic component is presented. In this case, the multistack epi layer includes at least one layer 401 of an active material which comprises quantum dot (QD) material. In this case, the QD layer forms the active region which will ultimately form the laser waveguide portion. In the embodiment shown in FIG. 6b, the laser multistack portion is located below the EAM multistack portion. The fabrication process therefore mirrors that of FIG. 5. The embodiment shown in FIG. 7b differs from that of FIG. 6b in that it is fabricated using the multilater epi stack shown in FIG. 7a. In this case, the EAM multistack portion is located below the laser multistack portion (which includes the QD active region). The fabrication steps carried out to create the device of FIG. 7b therefore follow those steps described above in detail with reference to FIGS. 4a-zb.

Further examples of optoelectonic devices which make use of the inventive concept of simultaneous epitaxial growth are described below with reference to FIGS. 8, 9, 10. These relate to optoelectonic structures containing multiple EAMs, for example those used in coarse wavelength division multiplexing, such as CWDM4 which requires 4 EAMs, each EAM having a different operating wavelength from the others. In these examples, the active epi layers are intrinsic (or unintentional doped, UID) with a layer of under cladding SiGe (such as $Si_{0.8}Ge_{0.2}$) layer which has lower refractive index to optically isolate the active layers in the stack.

These examples overcome significant challenges in conventional process methods where integrating 4 different EAMs on a single chip would require 4 separate epi growth stages, each of which would require a high temperature cleaning process for each growth (for example, for SiGe, the temperature is about 1100 C). Undesirably, the high temperature stages would lead to damage of any previous EPI structures. This invention provides a fabrication method that integrate 4 EAMs with different operating wavelengths in one time EPI growth.

The fabrication method of the present invention enables a single multistack epi layer to be grown containing multiple (in this case 4) multistack portions, each multistack portion corresponding to a different EAM. As with previous embodiments, a suitably sized cavity is etched corresponding to each respective multistack portion. That way, when the same multistack epi layer is grown in each of the four cavities, the active region (501, 502, 503, 504) of each EAM (EAM1, EAM2, EAM3, EAM4) will align along a single optical axis. This can be shaped via etching to create a single waveguide structure.

Figure 8:
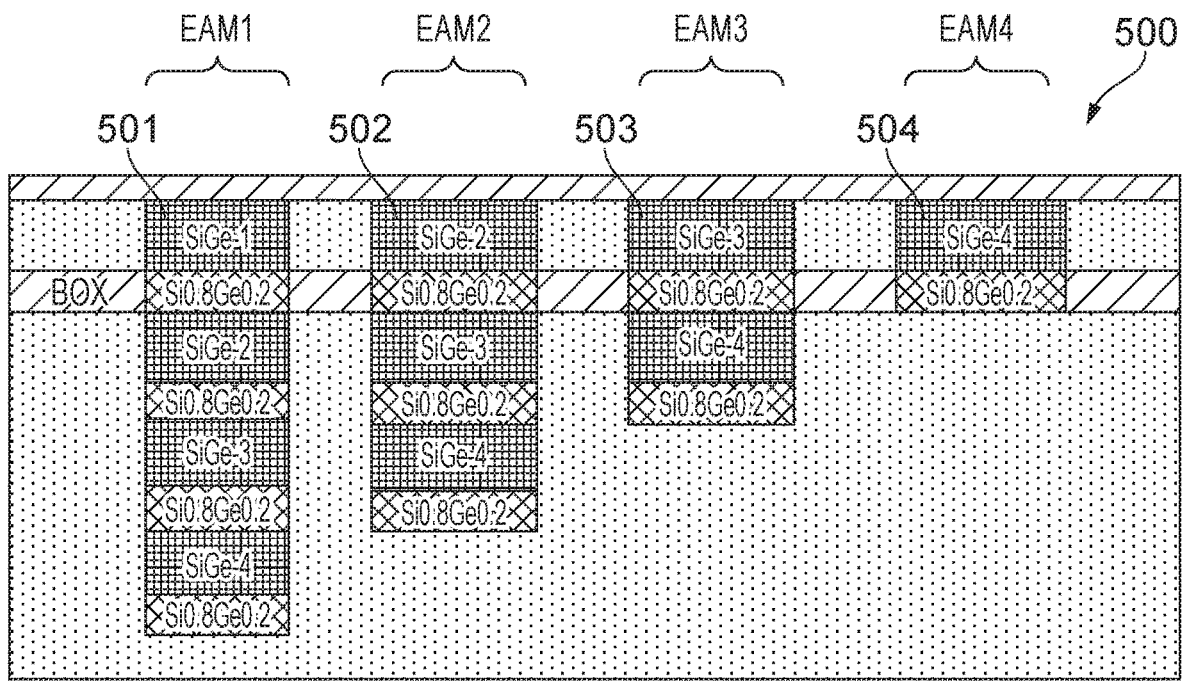
FIG. 8 depicts an example of a first embodiment of an optoelectronic component having four EAMs.

In the optoelectonic device 500 of FIG. 8, each of the EAMs (EAM1, EAM2, EAM3, EAM4) comprises an active region 501, 502, 503, 504 formed from SiGe. It is envisaged that other similar materials which exhibit the required optoelectronic properties could be used. In the optoelectonic device 510 of FIG. 9, each of the EAMs (EAM1, EAM2, EAM3, EAM4) comprises an active region 511, 512, 513, 514 formed from a material containing a multiple quantum well (MQW) structure, which may be a SiGe based MQW material. In the optoelectonic device 521 of FIG. 10, each of the EAMs (EAM1, EAM2, EAM3, EAM4) comprises an active region 511, 512, 513, 514 formed from a SiGeSn material.

Figure 11:
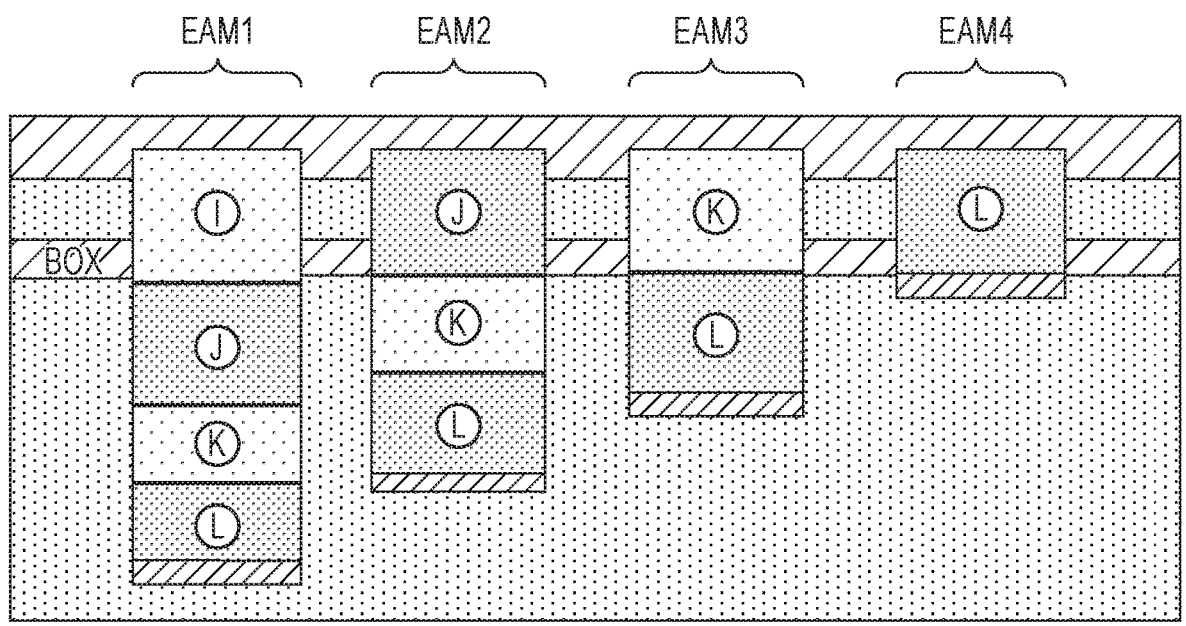
FIG. 11 depicts an example of a fourth embodiment of an optoelectronic component having four optoelectronic regions.
Figure 12A:
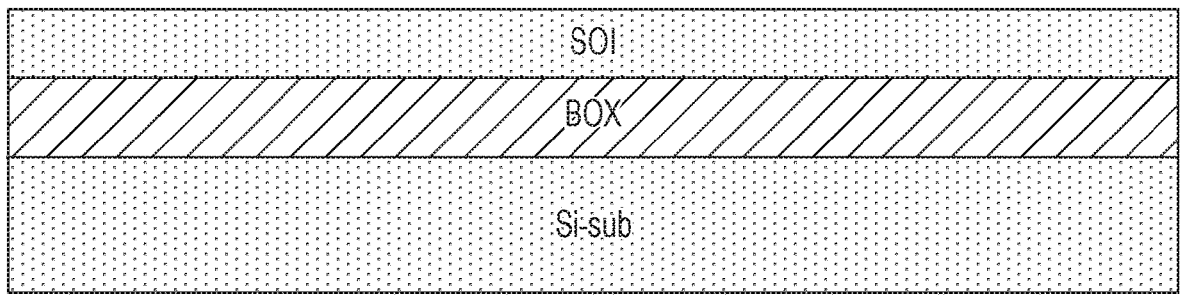
FIGS. 12a-12i show example steps involved in fabricating the optoelectronic component of FIG. 8.
Figure 12B:
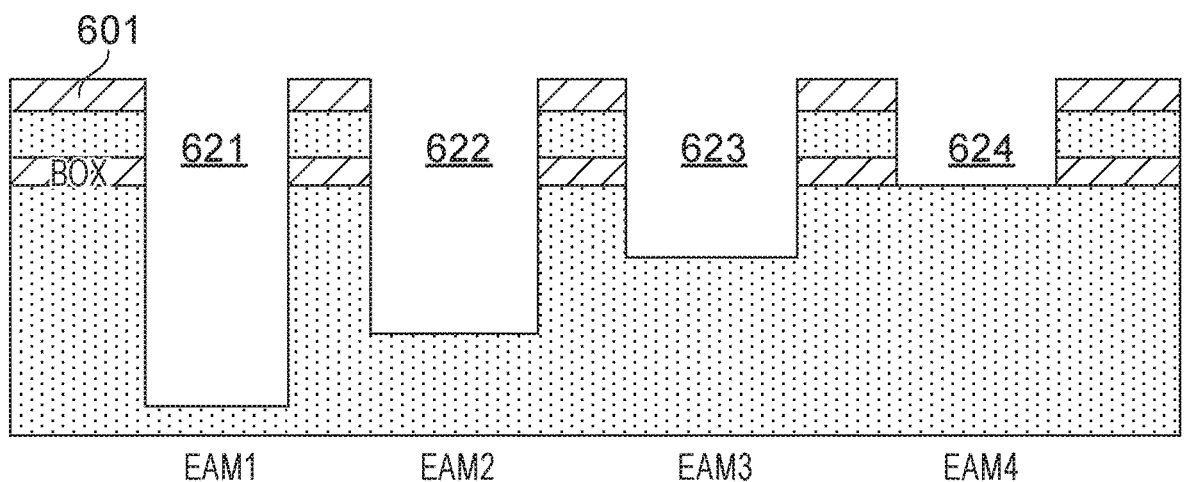
Figure 12C:
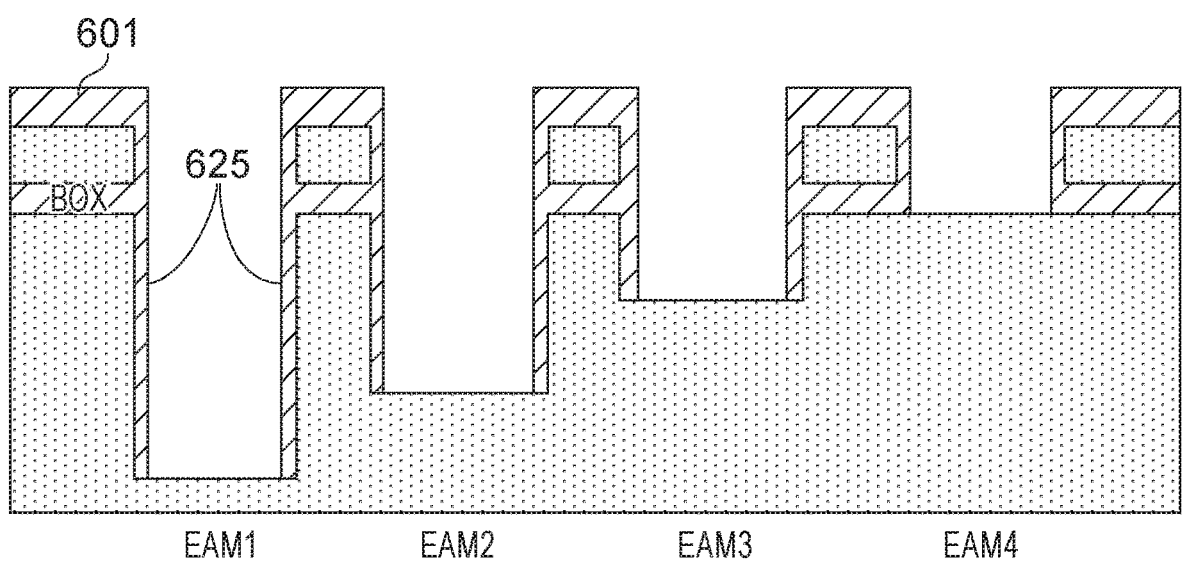

FIG. 11 depicts an embodiment with four EAMs, each of which is forms part of a III-V multistack epi layer, the four portions of the III-V multistack epi layer each being formed from layers which include respective active regions formed of a III-V materials which functions as an EAM at different operating wavelengths when a bias is applied via either the QCSE or FK effect. FIGS. 12a-12i show example steps involved in fabricating the optoelectronic component of FIG. 8. In an initial step (FIG. 12a), an SOI wafer is provided, a hard mask 601 applied and then etched (FIG. 12b) to form four cavities 621, 622, 623, 624, each cavity having a different depth. A layer of $SiO_2$ is applied to coat the sidewalls of the cavities (FIG. 12c). This $SiO_2$ sidewall may have a thickness of <20 nm. The cavities extend down below the BOX layer of the SOI chip.

Figure 12D:
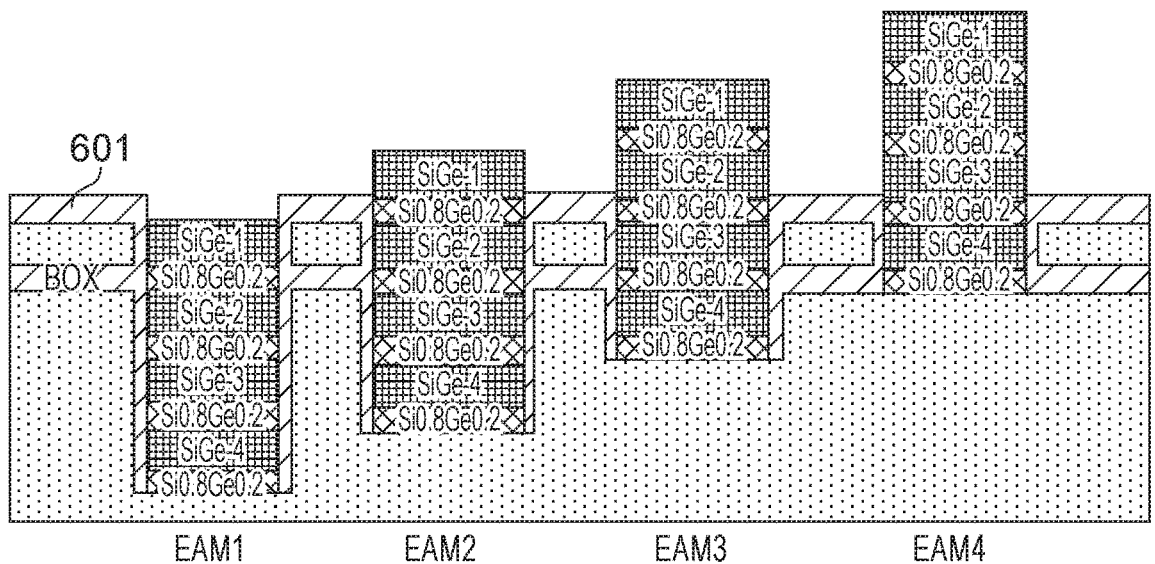
Figure 12E:
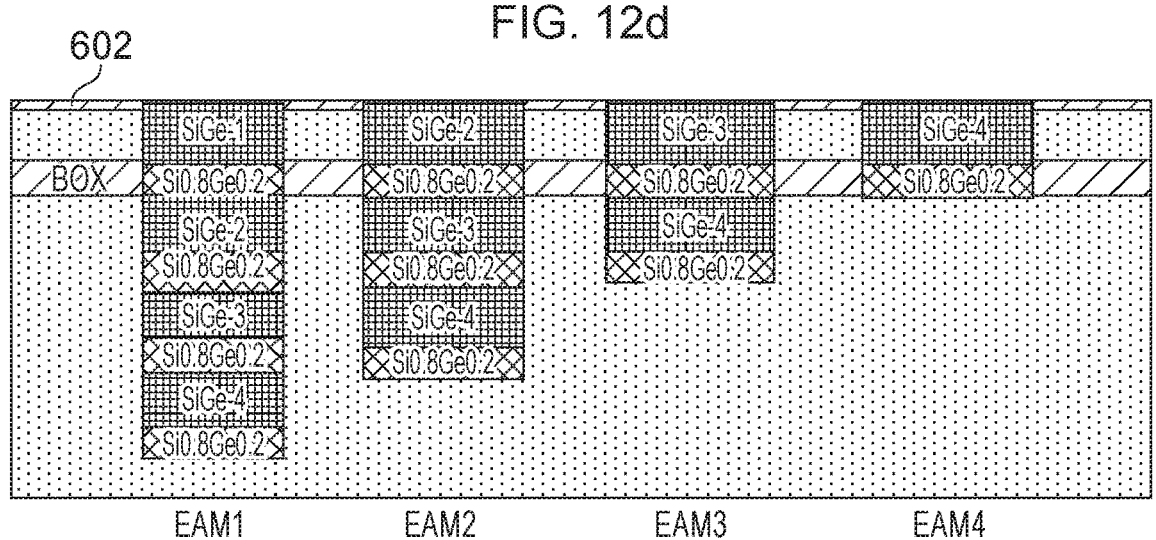
Figure 12F:
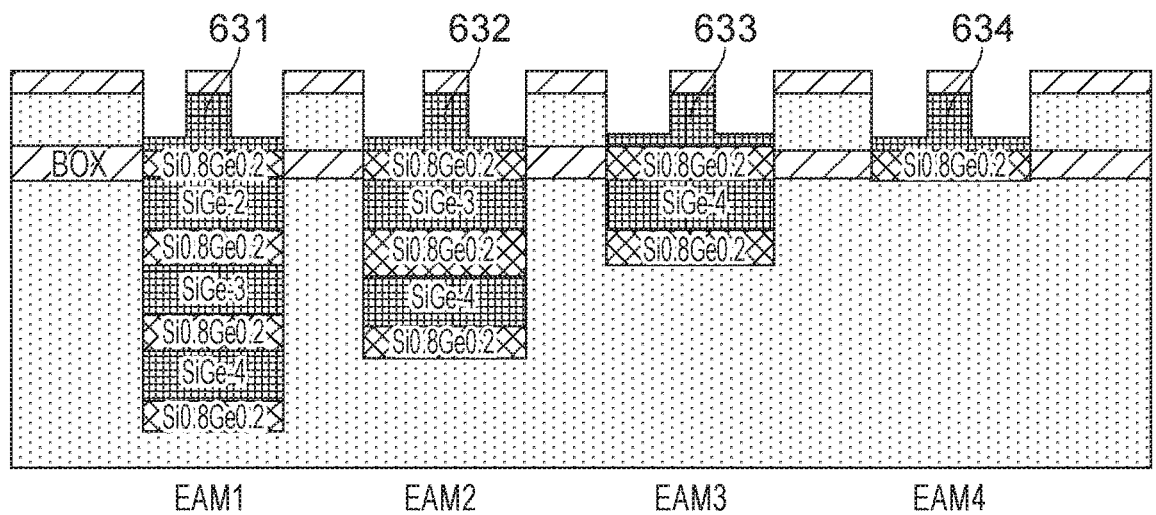

As shown in FIG. 12d, a single epitaxial multistack layer is grown, the multistack layer being made of four multistack portions, each portion containing an active region for a respective one of the four EAMs. In this embodiment, each multistack portion is formed from a pair of layers. Each pair of layers comprises a lower layer of a material such as $Si0.8Ge0.2$ which acts to form a bottom cladding layer, and an upper layer of SiGe, which forma an active core layer. These four multistack portions are stacked one on top of each other to form the single multistack epitaxial layer which is grown simultaneously in all four cavities. As depicted in FIG. 12e, each cavity has a depth chosen such that a respective active region of a respective EAM will be aligned along a single optical axis. This means that surplus regions of the multistack portion will form above three of the four cavities. This surplus is removed (FIG. 12e) via polishing such as chemical mechanical polishing (CMP). The CMP process may leave behind around 20 nm or more of $SiO_2$ layer 602 above the surface of the SOI chip. As shown in FIG. 12f, further etching is carried out to create a waveguide structure at each of the active regions of the respective EAMs that lie along the optical axis of the device. In each case, this corresponds to the active waveguide regions that lie level with the silicon device layer of the SOI platform. Any redundant layers above the silicon device layer will have been removed and any active layers below the silicon device layer (i.e. lying within the BOX layer or the silicon substrate of the SOI platform) will be redundant.

Figure 12G:
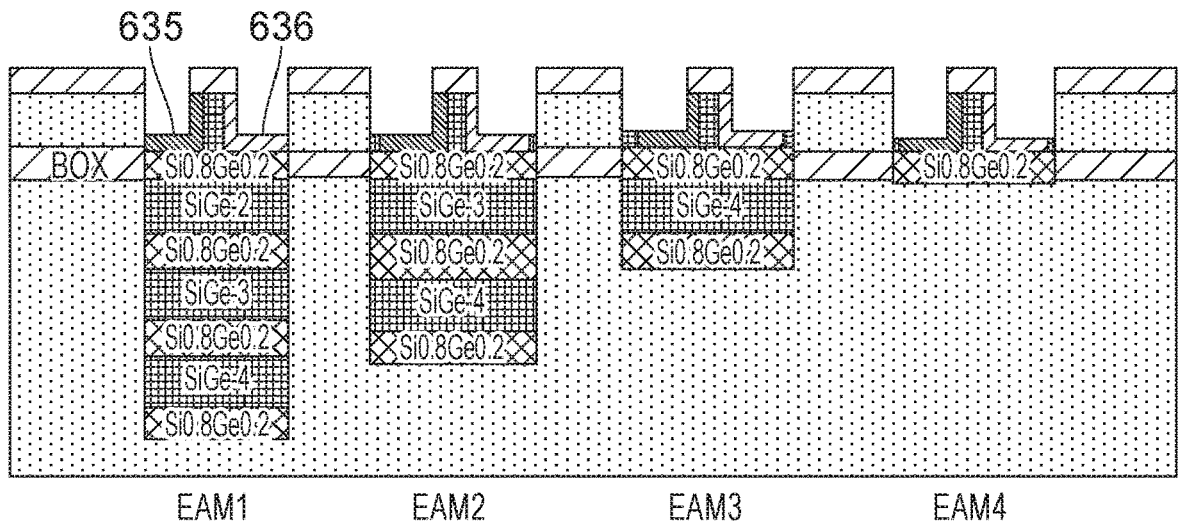
Figure 12H:
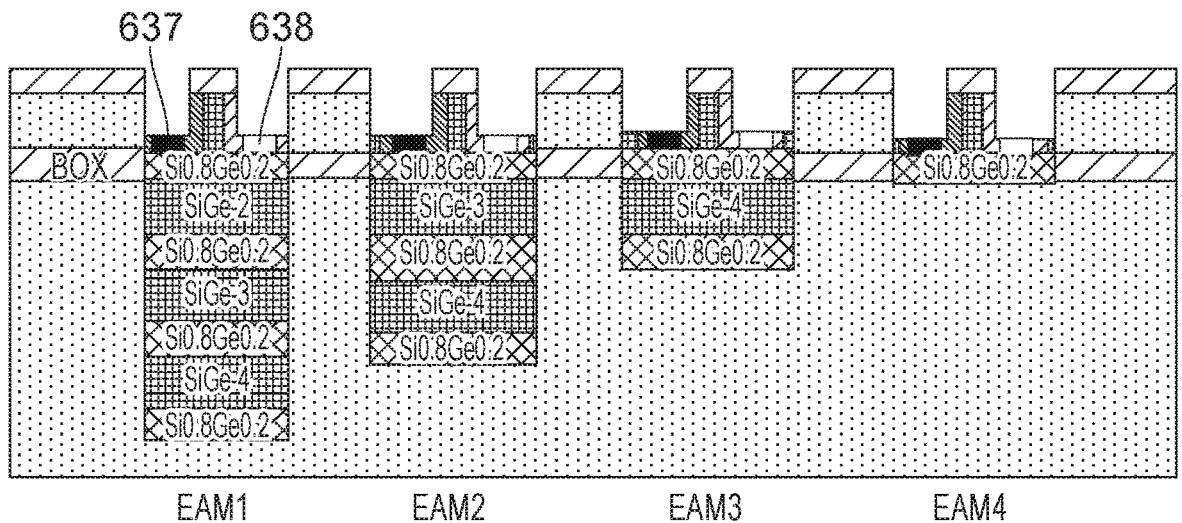

As is shown in FIG. 12g, doping is carried out on each of the formed EAM waveguide structures to create a pin junction at the waveguide. In the embodiment shown, this doping takes the form of a p doped region 635 at a first side of the sidewall of the waveguide and an n doped region 636 at the other side of the sidewall of the waveguide. At each side of the waveguide, the doped region may extend along part of or the entire sidewall of the waveguide. The doped area may also extend along the slab of the waveguide laterally away from the waveguide forming an "L" shaped doped region.

A further doping step is carried out (FIG. 12h) at each EAM waveguide structure to create a more concentrated highly doped p doped region 637 within the overall p doped region 635 and a highly doped n doped region 638 within the overall n doped region 636. The highly doped regions provide an improved ohmic contact for electrodes and are typically located within the doped regions of the slab of the waveguide, and are typically equally spaced in that they are equidistant from the centre of the waveguide, in opposite lateral directions.

Figure 12I:
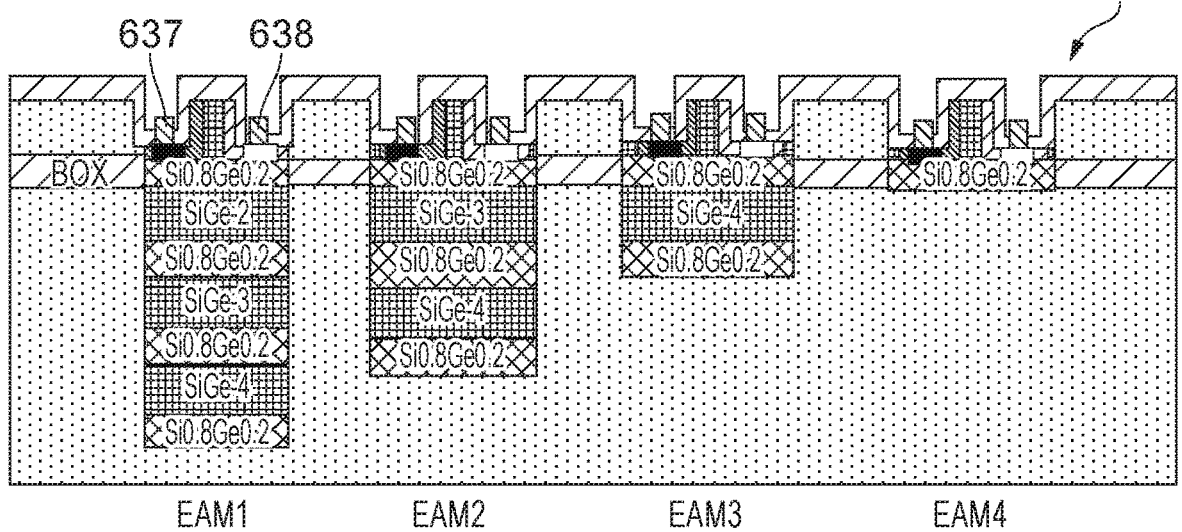

Next, as depicted in FIG. 12i, electrode contacts are fabricated by way of creating an open via in a layer of $SiO_2$ above each of the highly doped regions and depositing a conductive electrode material via metallization.

Figure 9:
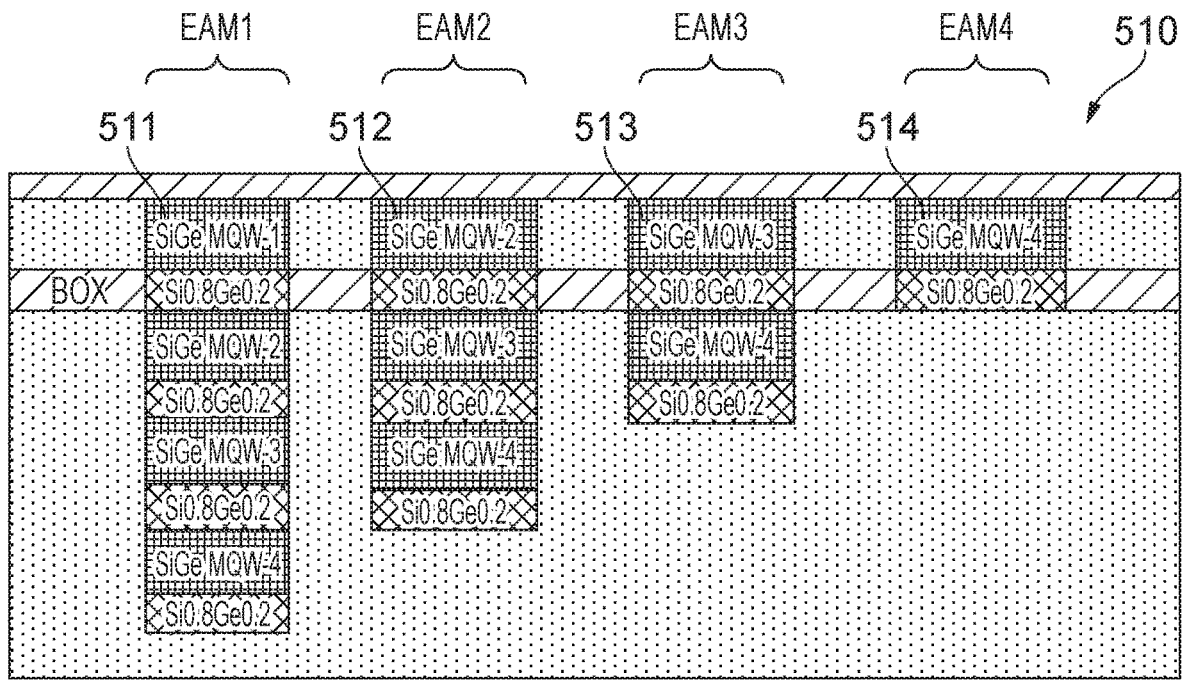
FIG. 9 depicts an example of a second embodiment of an optoelectronic component having four EAMs.
Figure 10:
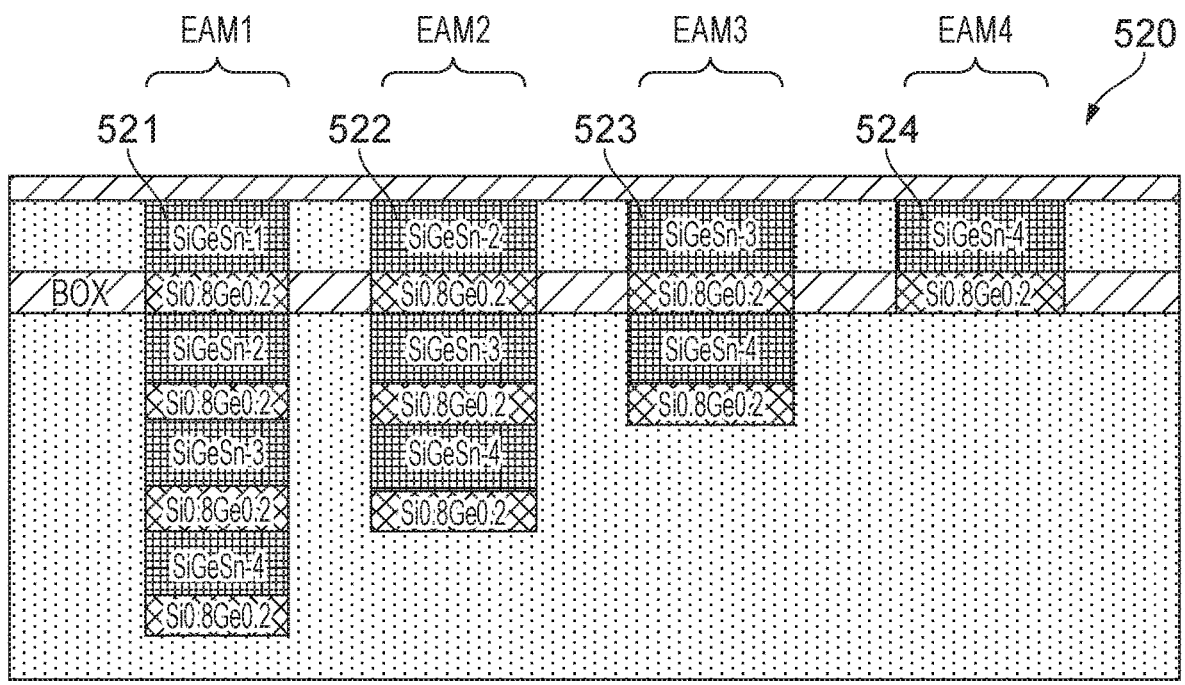
FIG. 10 depicts an example of a third embodiment of an optoelectronic component having four EAMs.

FIGS. 13a-13l show example steps involved in fabricating the optoelectronic component of FIG. 9.

Figure 13A:
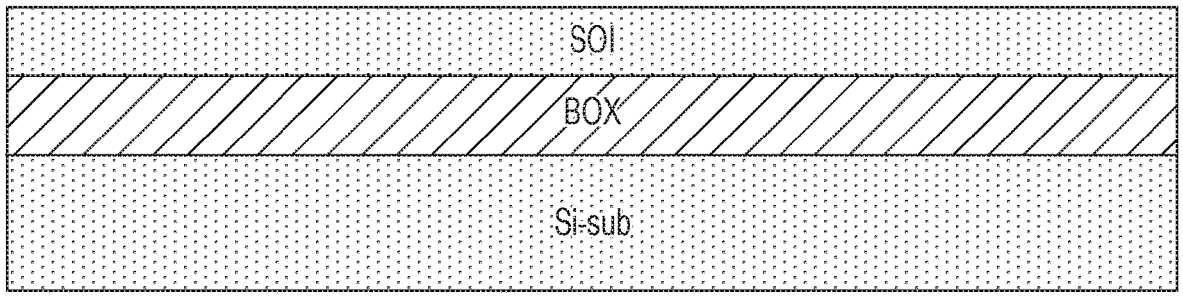
Figure 13B:
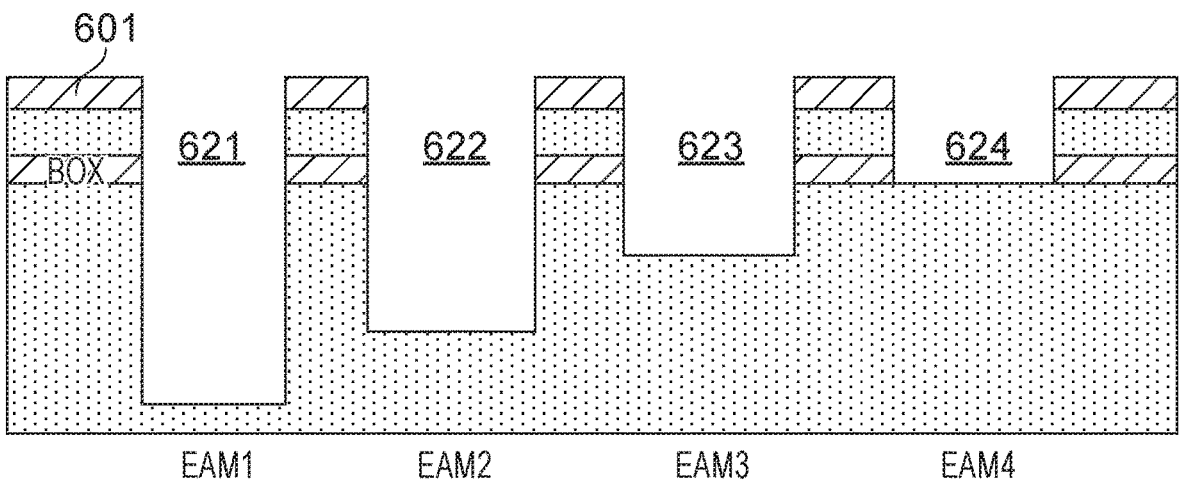
Figure 13C:
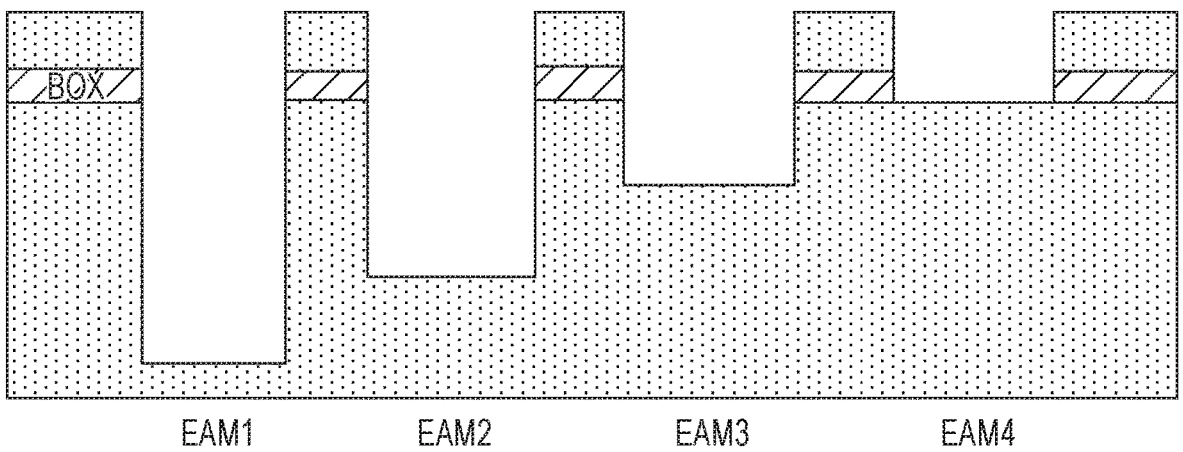
Figure 13D:
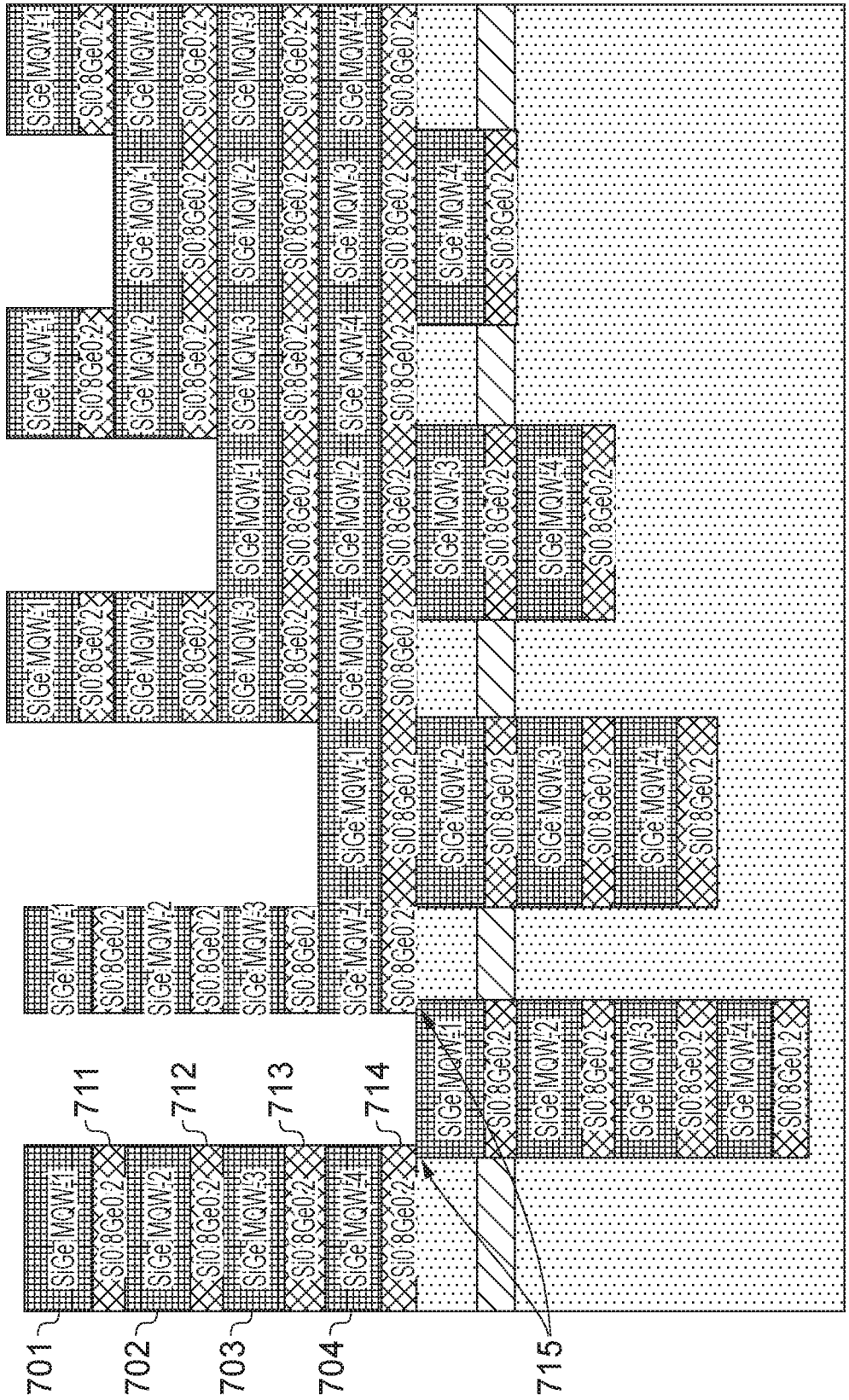

In an initial step (FIG. 13a), an SOI wafer is provided, a hard mask 601 applied and then etched (FIG. 13b) to form four cavities 621, 622, 623, 624, each cavity having a different depth. Then either selective epi growth or blanket epi growth will be used to grow a multistack in each cavity. As shown in FIG. 13d, a single epi step is then carried out to grow a multistack with blanket epi growth, the multistack comprising four different SiGe multiple quantum well (MQW) regions 701, 702, 703, 704, each SiGe MQW region laying on top of a respective SiGe material 711, 712, 713, 714, which may take the form of $Si0.8Ge0.2$. The four MQW materials have different properties from one another, that is to say, they are not formed from exactly the same material as each other. Facet defects 715 are expected to form at the edge of the multistacks, in the vicinity of the edges of the cavity within which the multistack is located.

Figure 13E:
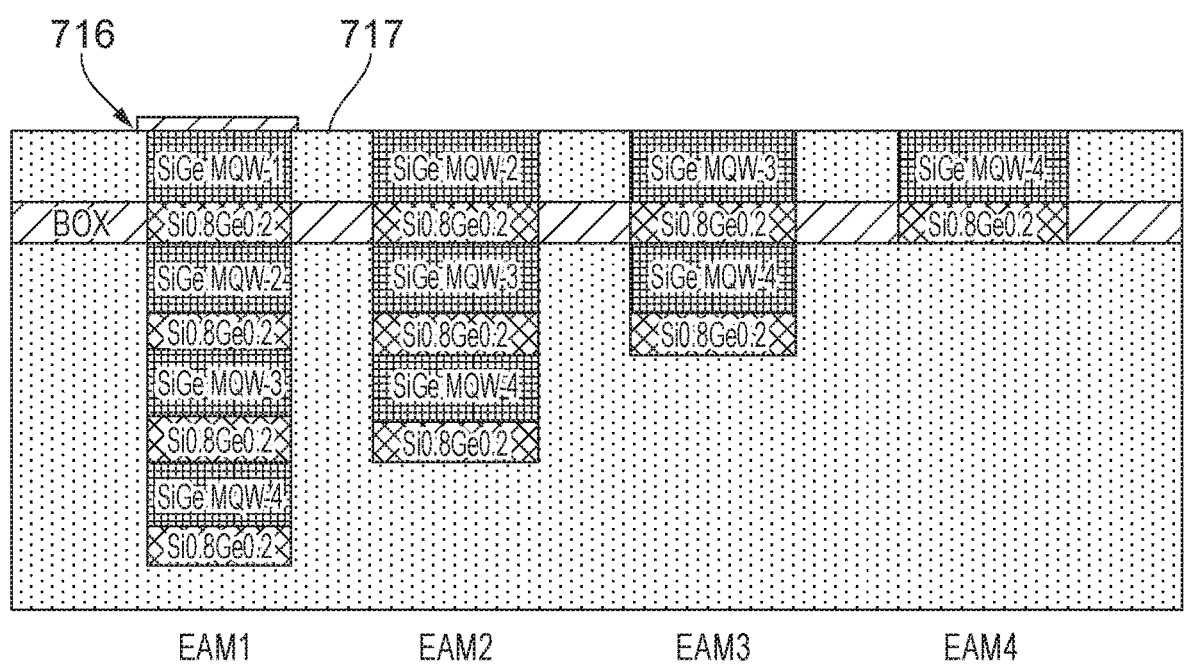

As shown in FIG. 13e, a cover layer of $SiO_2$ is applied, then chemical mechanical polishing is carried out to remove all but a thin layer of SiO₂ 716, for example 20 nm or less. Any layers of the multilayer epistack which lie above this thin layer of SiO₂ are removed such that there is a smooth, even surface across the upper surface of the SOI 717 and the upper surfaces of each epistack which fills each of the respective 4 cavities.

Figure 13F:
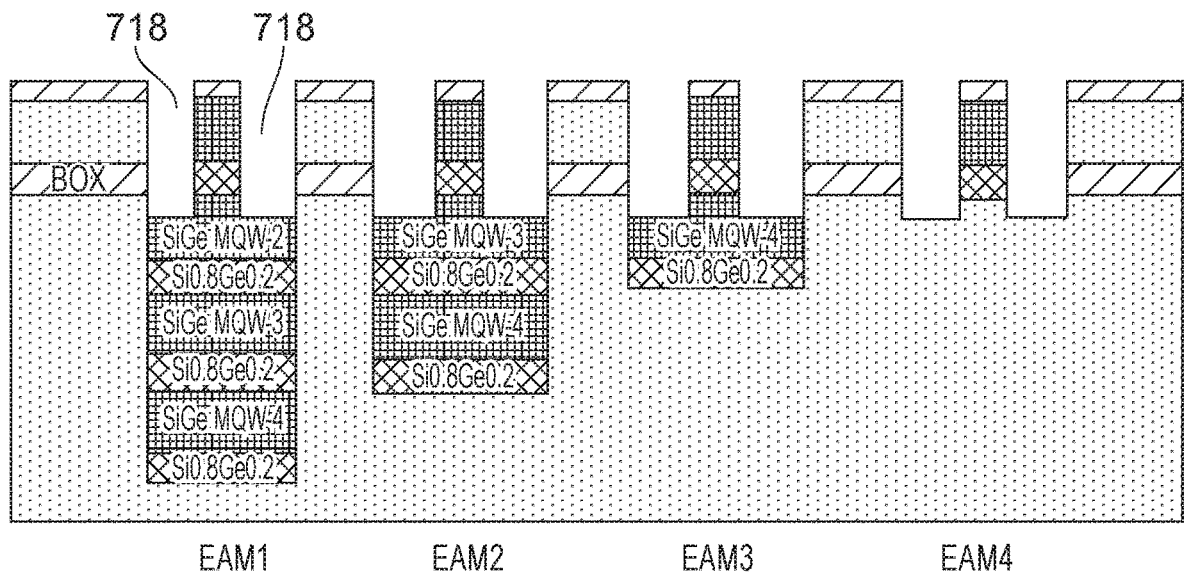
Figure 13G:
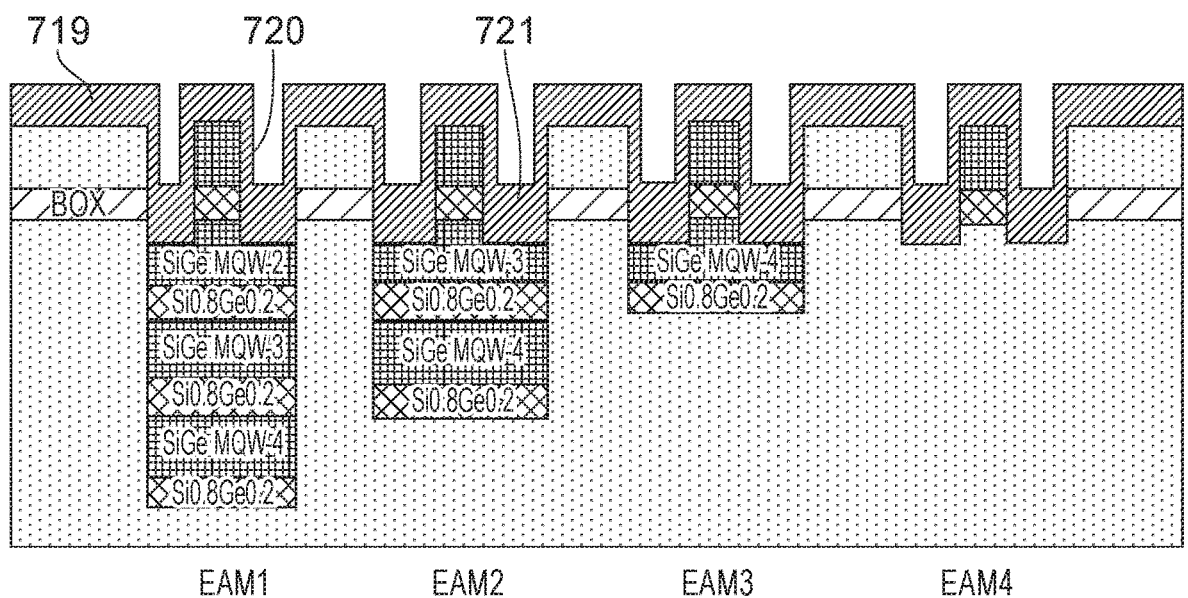

Trenches are etched at either side of the filled cavities to remove any facet defect areas 718, as can be seen in FIG. 13f, which is a section view along the direction of propagation of the light. A liner 719 such as silicon nitride is then deposited (FIG. 13g). For a material such as silicon nitride, the liner may have a refractive index of 2.7. Sidewall thicknesses 720 of the deposited silicon nitride may be 240 nm or less and the thickness 721 at the base of the trenches may be chosen such that the top surface of the liner layer aligns with (i.e. lies within the same plane as) the top surface of the BOX layer.

Figure 13H:
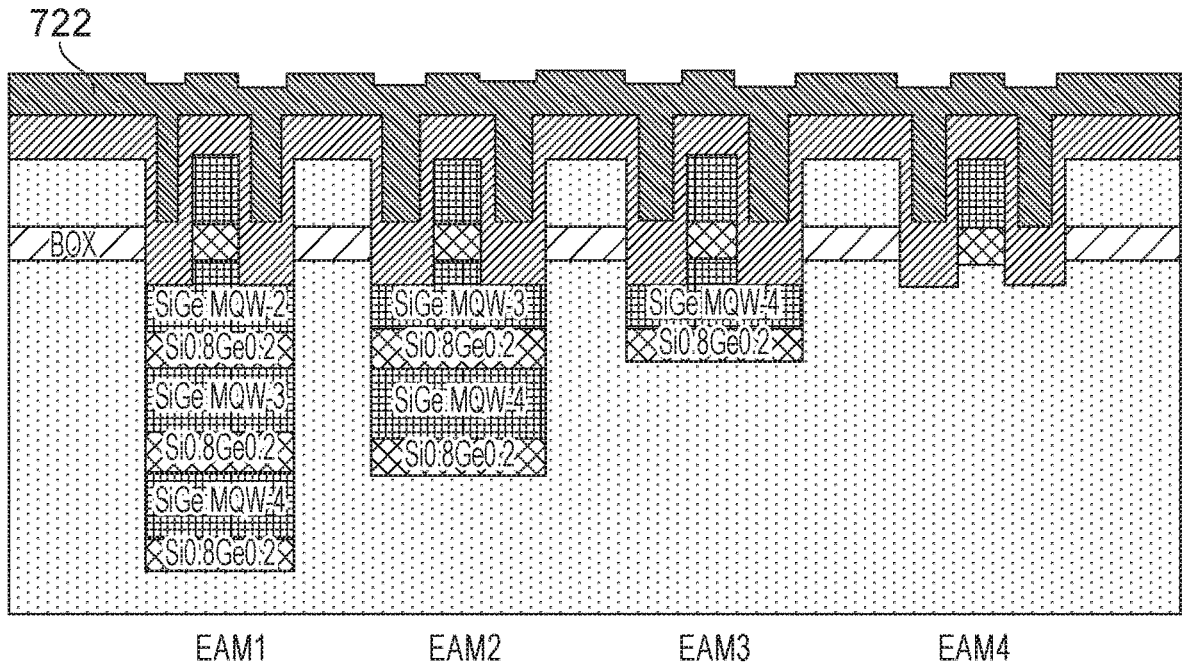
Figure 13I:
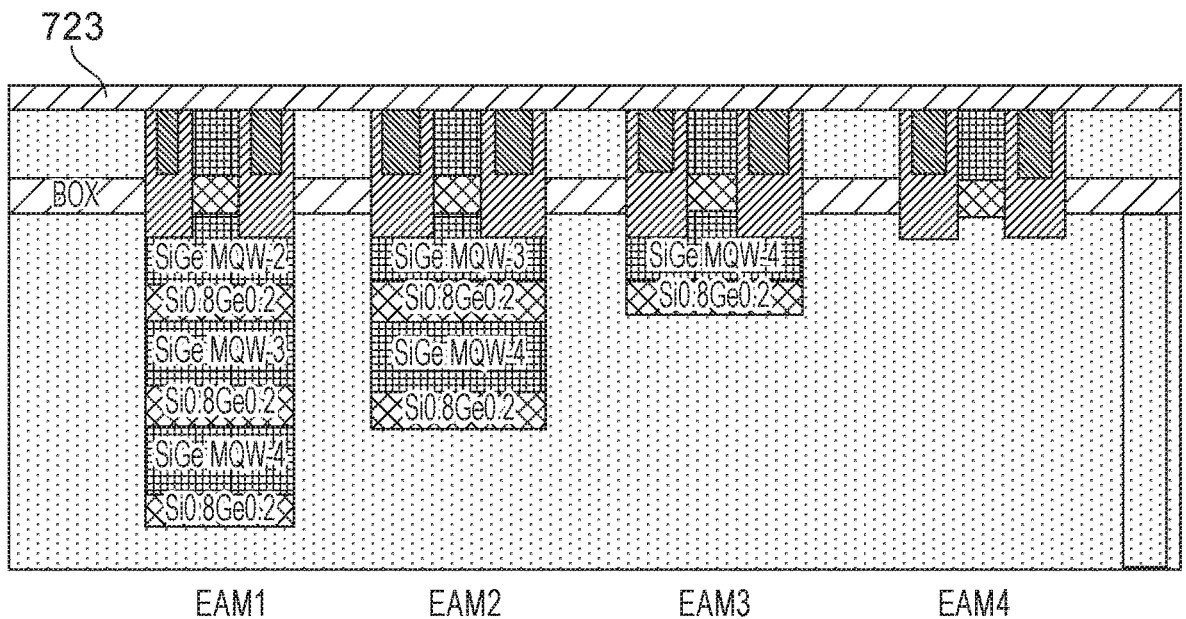
Figure 13J:
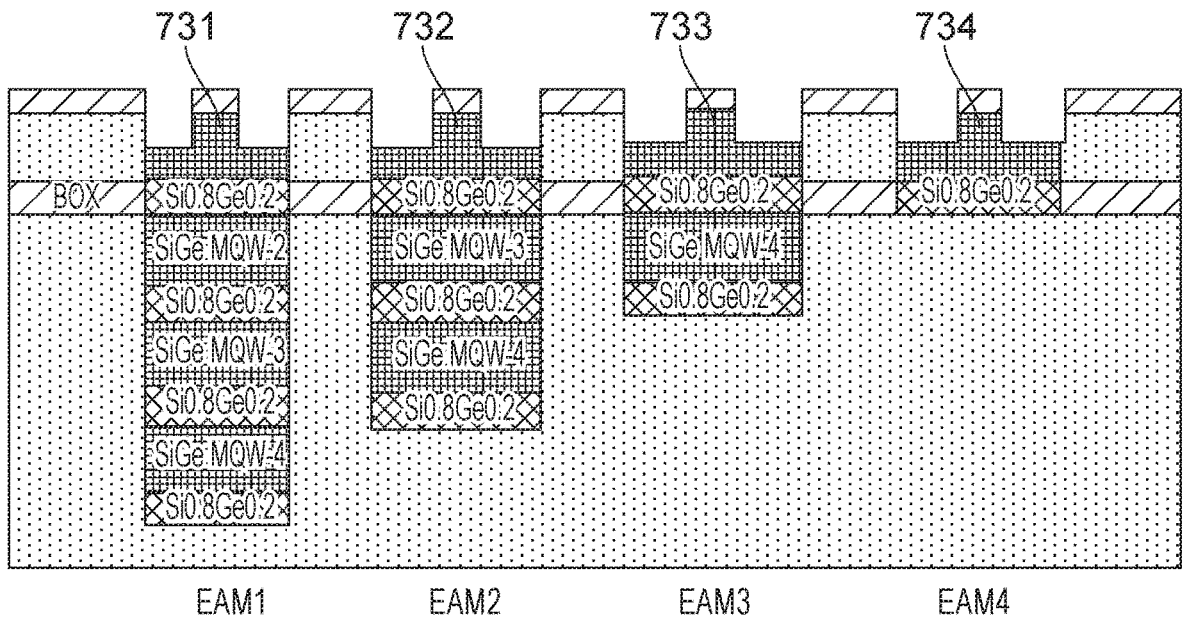

Next, as shown in FIG. 13h, amorphous silicon 722 is deposited to fill all of the trenches. The deposition will leave an uneven upper surface which is etched and/or planarized using a method such as chemical mechanical polishing (CMP) to create a smooth upper surface onto which a cover layer such as SiO₂ 723 may be applied (FIG. 13i).

Figure 13K:
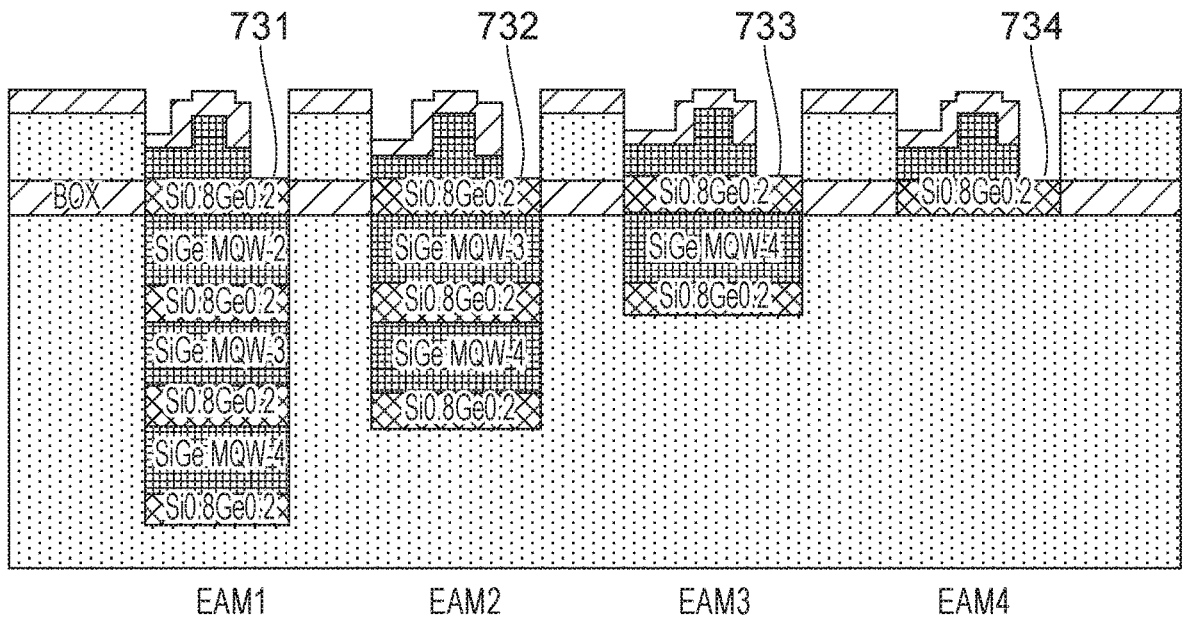
Figure 13I:
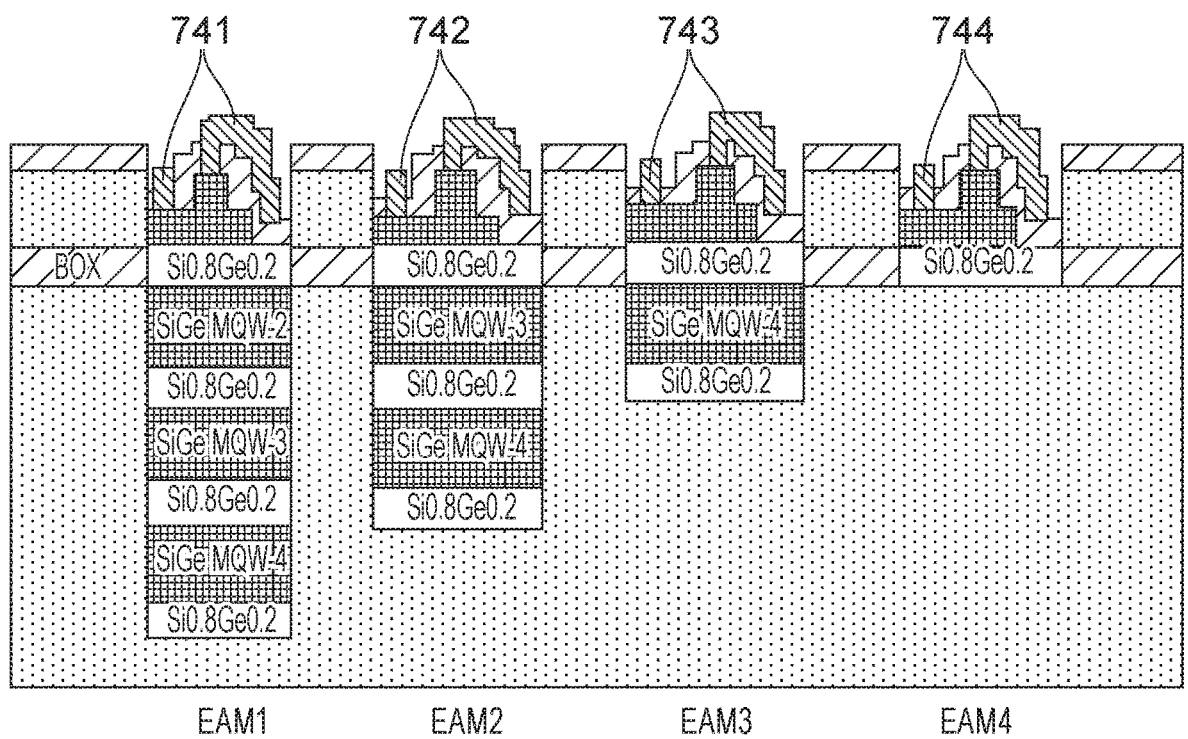

Next, waveguide structures 731, 732, 733, 734 can be etched in the uppermost layer of MQW material for each EAM waveguide structure (FIG. 13j) and an isolation area structures 741, 742, 743, 744 may be etched at one side of each EAM waveguide structure to accommodate a respective top electrode (FIG. 13k). Finally, as depicted in FIG. 13l, a layer of insulating material such as SiO₂ is deposited, vias etched and electrode contacts 751, 752, 753, 754 created by metallization to apply a bias across the MQW material.

FIGS. 14a-14j show example steps involved in fabricating an optoelectronic component according to FIG. 11, the optoelectronic component including four EAMs, the EAMs having a III-V type active region configured to modulate an optical signal via the quantum-confined Stark effect (QCSE) or the Franz-Keldysh (FK) effect.

Figure 14A:
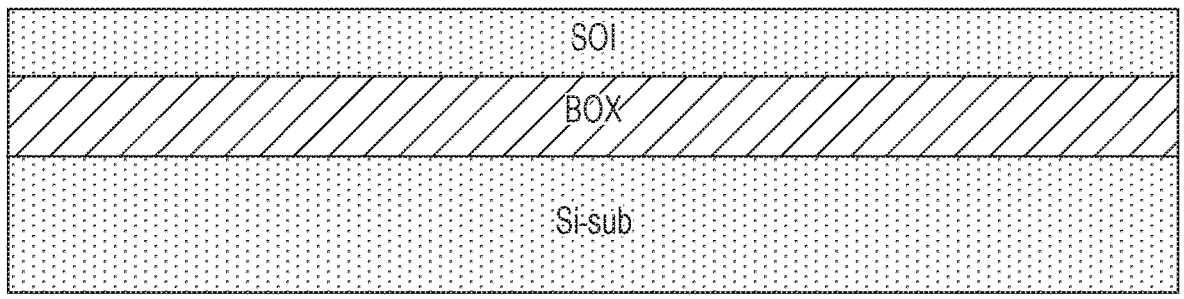
Figure 14B:
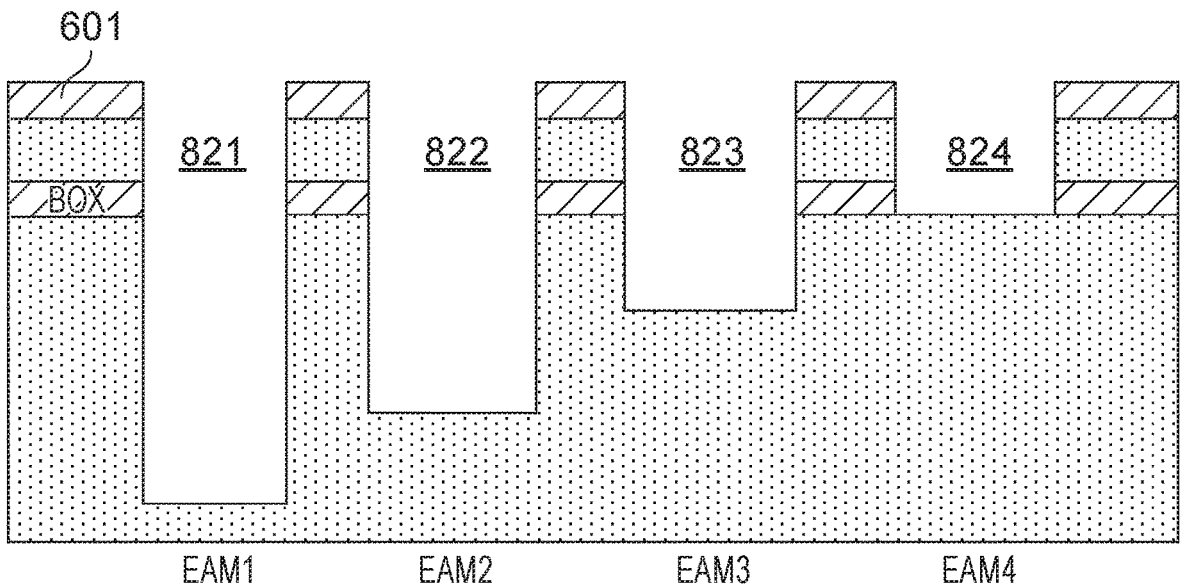
Figure 14C:
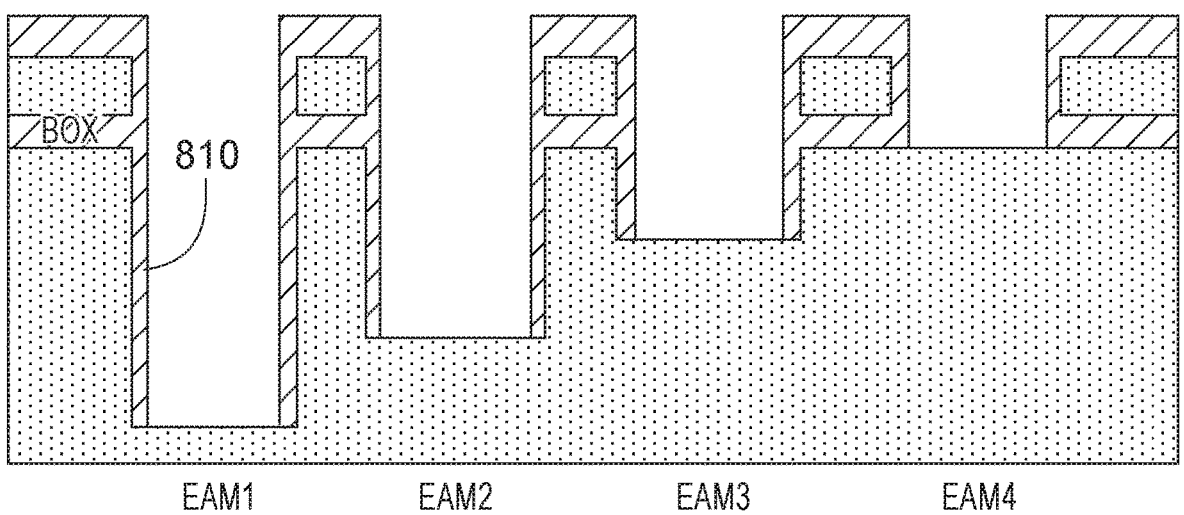

In an initial step (FIG. 14a), an SOI wafer is provided, the SOI waver comprising a silicon substrate layer, a buried oxide layer ("BOX") on top of the silicon substrate layer, and a silicon-on-insulator device layer ("SOI") directly on top of the buried oxide layer. A hard mask 601 is applied on top of the SOI layer and then etched (FIG. 14b) to form four cavities 821, 822, 823, 824, each cavity having a different depth. A layer of SiO₂ 810 is applied to coat the sidewalls of the cavities (FIG. 14c). This SiO₂ sidewall may have a thickness of 50 nm or less. The cavities may all extend down below the BOX layer of the SOI chip.

Figure 14D:
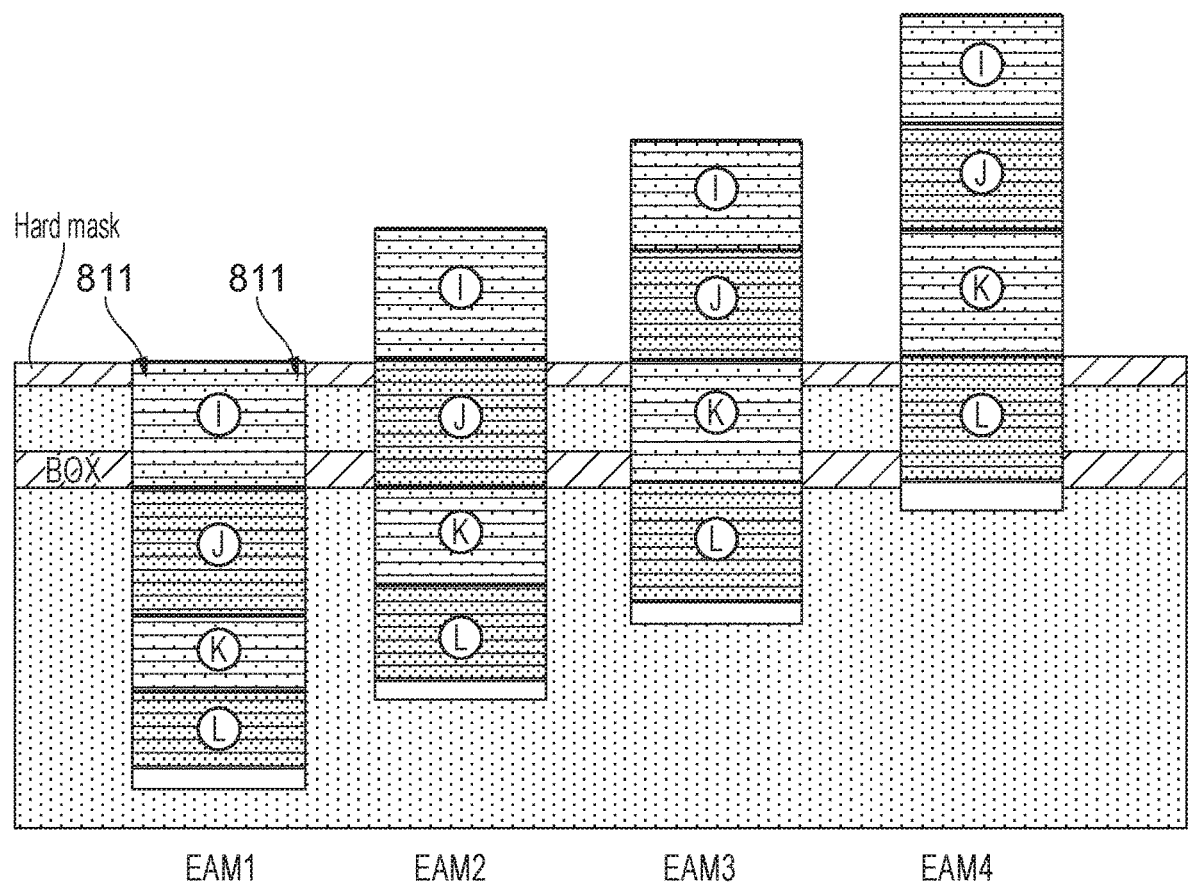

As shown in FIG. 14d, a single multistack epi layer is grown in all four cavities. As with previous embodiments, the single multistack epi layer is grown in a single step, requiring only one growth step to fill all four cavities with the active layer(s) required. A detailed example of such a multistack epi layer is shown in FIG. 14e.

The multistack epi layer comprises a growth of multiple of layers for each EAM, Each EAM having a bottom cladding layer or layers, a core active region (which may comprise multiple layers) and an upper cladding layer or layers. For each EAM, the optical mode of the core active region layers aligns with the optical axis of the SOI waveguide of the overall device.

A contact layer 812 formed from a material such as a p-InGaAs may be inserted between each EAM stack within the multistack epi layer, which also acts as etching stop layer for subsequent surface planarization after EPI growth. It is noted that epi cleaning steps may be carried out and may result in shrinkage of the thicknesses of the SiO₂ sidewalls. For example, this thickness could reduce from around 50 nm to around 20 nm. It is expected that there will be defect edge regions of the multistack epi layer at and around the interface with the sidewalls of the respective cavities.

Once the multistack epi layer has been deposited, a layer of insulator 813 such as SiO₂ is deposited (FIG. 14f) and a surface planarization technique such as CMP carried out (FIG. 14g) to leave a smooth surface at which the upper layer of the (coated) SOI is level with the uppermost layers of the respective multistacks.

Figure 14F:
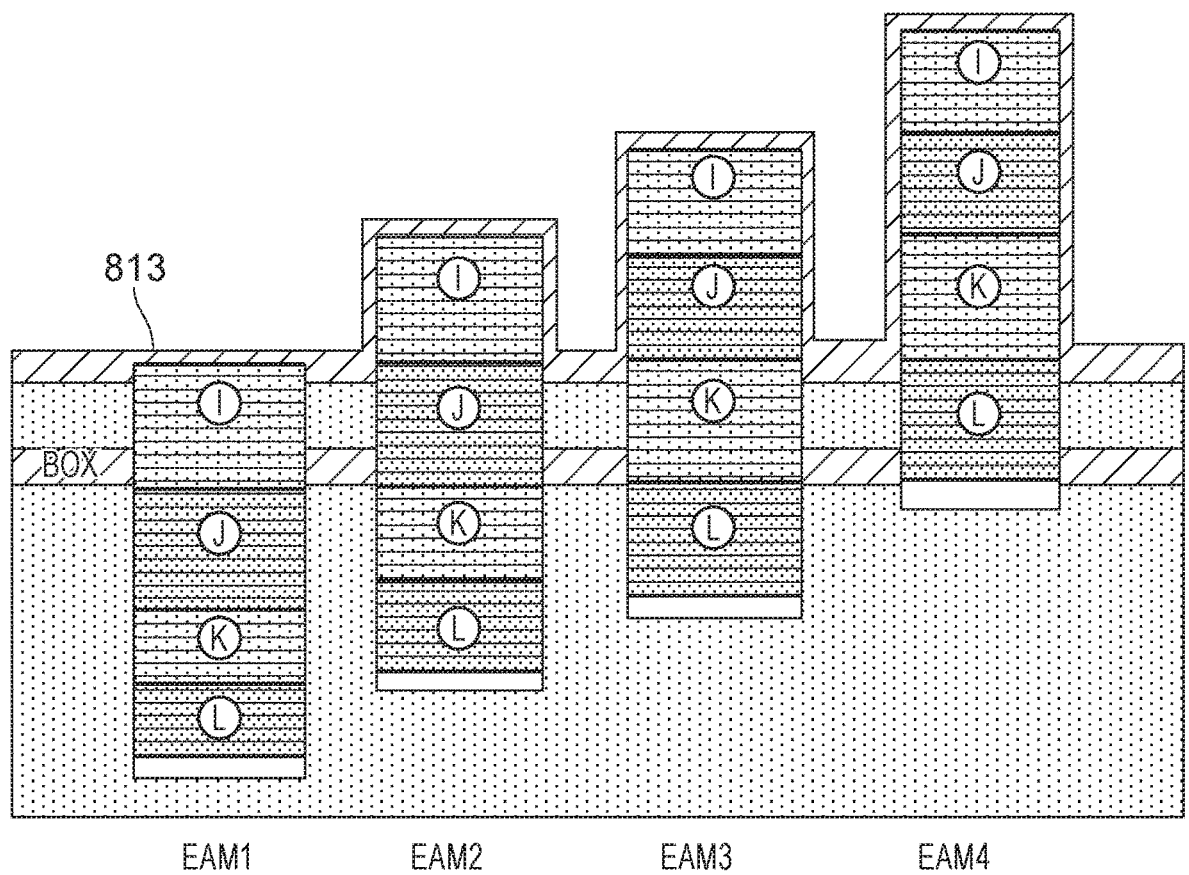
Figure 14G:
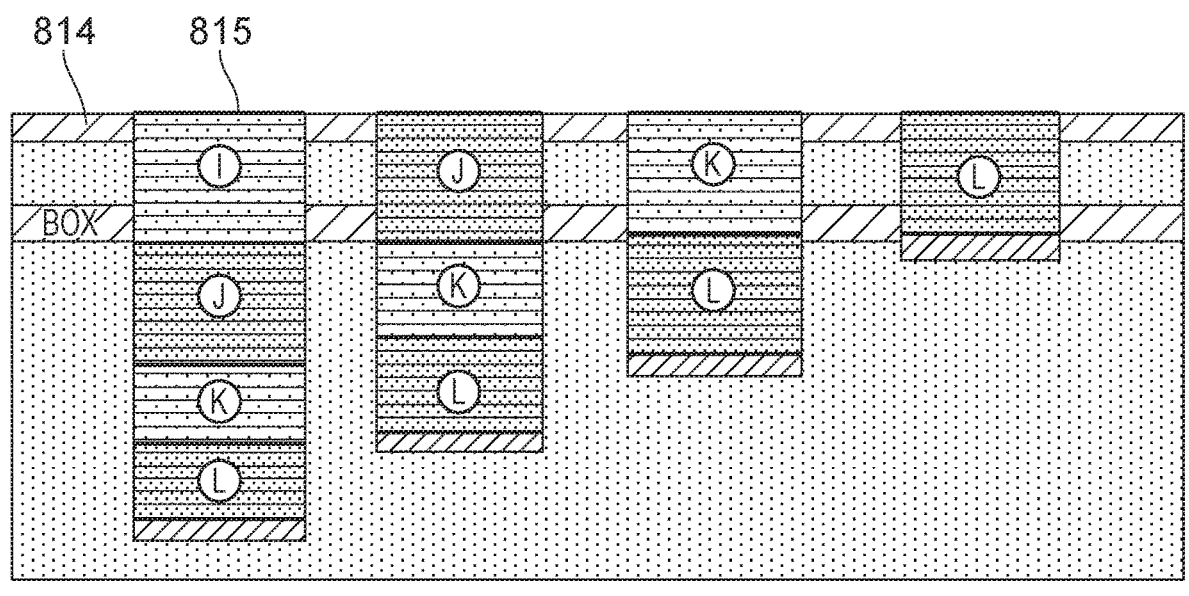
Figure 14H:
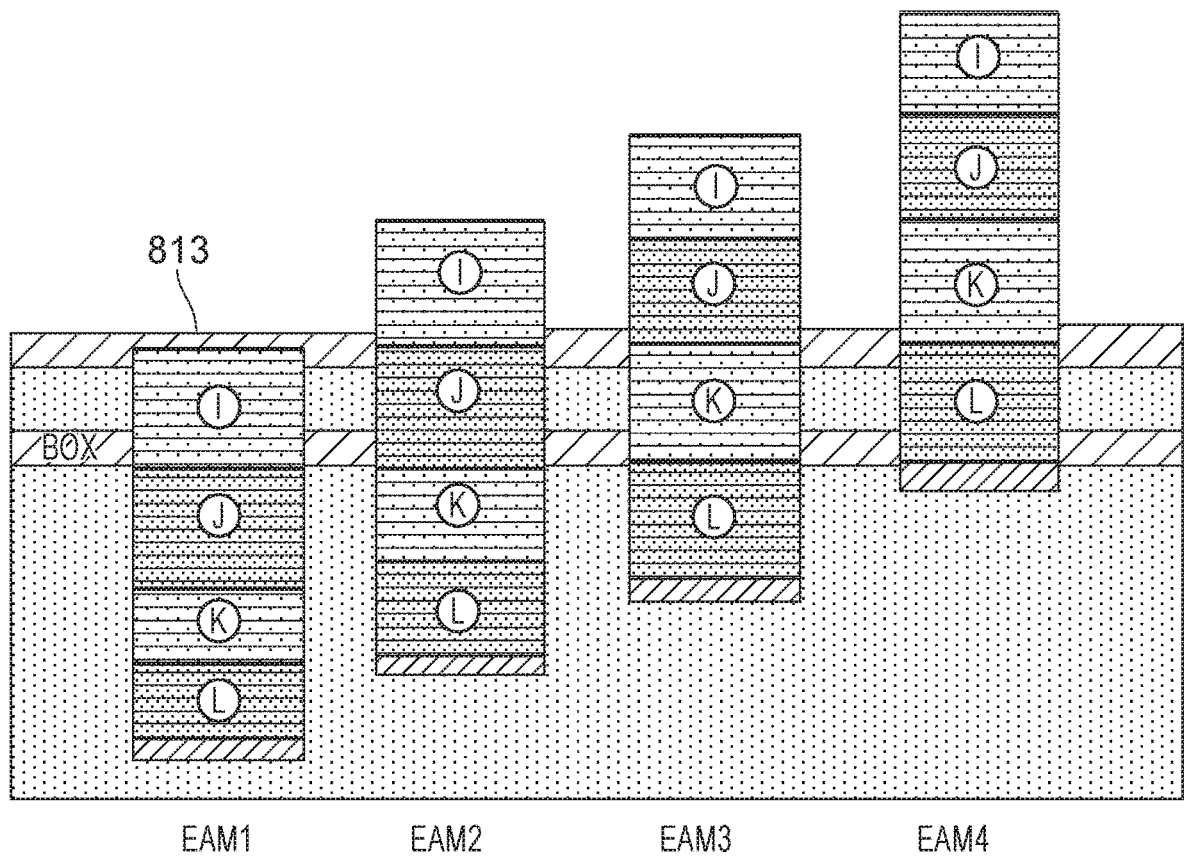
Figure 14I:
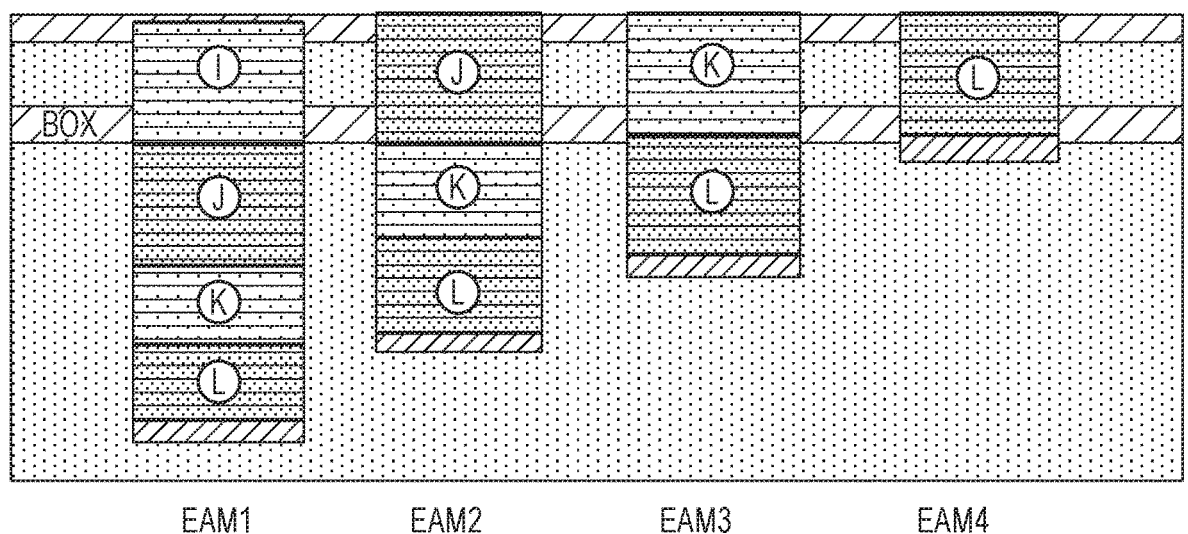
Figure 14J:
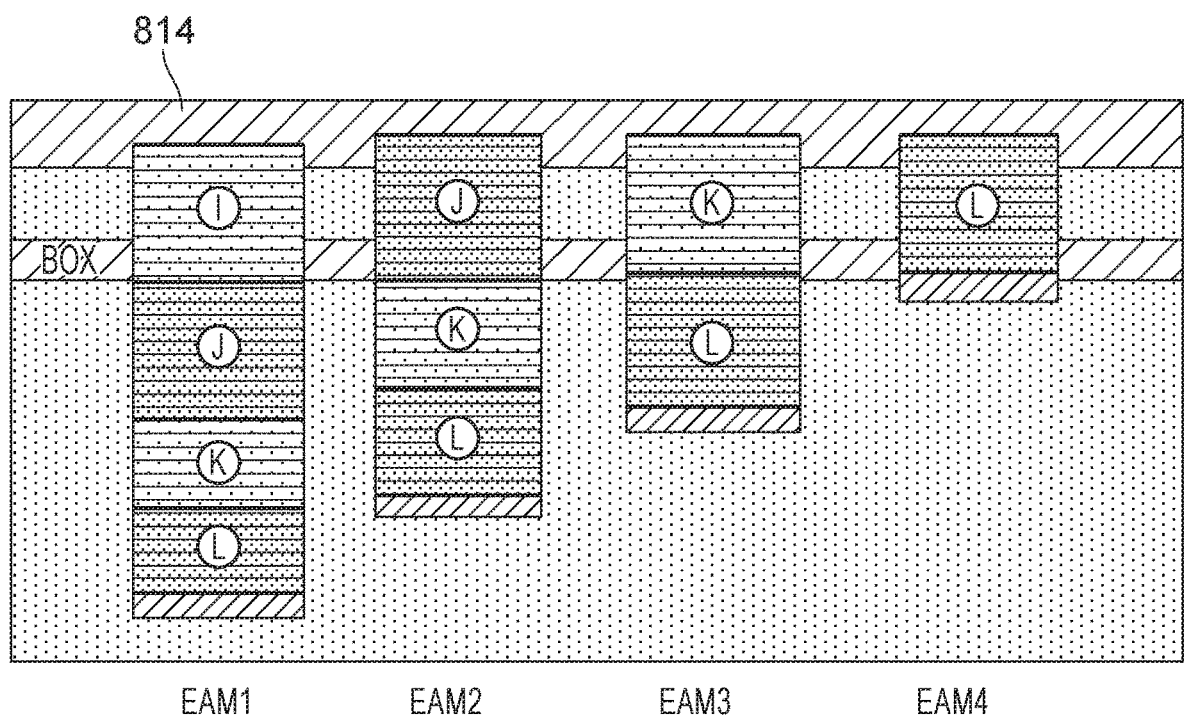

FIGS. 14h and 14i show alternative steps to those of FIGS. 14f and 14g. In these alternative steps, an etching area is first defined and any insulator layer 813 present (e.g. SiO₂) etched to expose the multistack layers that need to be etched. This will typically only be those multistacks located within the shallowest three cavities. Secondly, the exposed areas are etched. In this second step, where the materials include InP and InGAs, the InP layers will be etched and any InGAs layers will form an etch stop. Regardless of which planarization technique is carried out, a subsequent insulator layer 814 such as SiO₂ is deposited before subsequent fabrication of the waveguides and electrodes. These subsequent fabrication steps are described above with reference to FIGS. 13f-13l.

Although exemplary embodiments of a method of fabricating an optoelectronic component have been specifically described and illustrated herein, many modifications and variations will be apparent to those skilled in the art. Accordingly, it is to be understood that a method of fabricating an optoelectronic component constructed according to principles of this invention may be embodied other than as specifically described herein. The invention is also defined in the following claims, and equivalents thereof.

What is claimed is:

1. A method of fabricating an optoelectronic component within a silicon-on-insulator substrate, the method comprising:

providing a silicon-on-insulator, SOI, substrate, the SOI substrate comprising a silicon base layer, a buried oxide, BOX, layer on top of the base layer, and a silicon device layer on top of the BOX layer;

etching a first cavity region into the SOI substrate and etching a second cavity region into the SOI substrate, the first cavity region having a first depth and the second cavity region having a second depth, the second depth being greater than the first depth; and depositing a multistack epi layer into the first and the second cavity regions simultaneously, the multistack epi layer comprising a first multistack portion comprising a first active region and a second multistack portion comprising a second active region, wherein the relative separation of the first active region and the second active region within the multistack epi layer is chosen based on the difference in depth of the first cavity region and the second cavity region, such that after the simultaneous deposition step, the first active region within the first cavity region lies at the same level of the optoelectronic device as the second active region within the second cavity region and at the same level as the device layer.

2. The method of claim 1, further comprising the step of patterning the device layer of the SOI substrate to form a waveguide including an input waveguide and an output waveguide.

3. The method of claim 1, wherein the multistack epi layer in the first cavity region and the second cavity region comprises one or more of the following III-V materials: InGaAs, InGaAsP, AlInGaAs, InGaNAs.

4. The method of claim 1, wherein the multistack epi layer in the first cavity region and the second cavity region comprise one or more of the following group IV materials: Ge, SiGe, and SiGeSn.

5. The method of claim 1, wherein the stack layers of the first multistack portion comprise doped layers which form a pin junction at the first active region.

6. The method of claim 1, wherein the stack layers of the second multistack portion comprise doped layers which form a pin junction at the second active region.

7. The method of claim 1, wherein the stack layers of the first multistack portion comprise undoped layers at the first active region.

8. The method of claim 1, wherein the stack layers of the second multistack portion comprise undoped layers at the second active region.

9. The method of claim 1, wherein the materials of the first multistack portion are chosen such that when an electrical bias is applied across the first active region, it functions as an electro-absorption modulator, EAM.

10. The method of claim 1, wherein the materials of the second multistack portion are chosen such that when an electrical bias is applied across the second active region, it functions as a laser diode.

11. The method of claim 1, wherein the materials of the first multistack portion are chosen such that when an electrical bias is applied across the second active region, it functions as a laser diode.

12. The method of claim 1, wherein the materials of the second multistack portion are chosen such that when an electrical bias is applied across the second active region, it functions as an electro-absorption modulator, EAM.

13. The method of claim 1, wherein a buffer structure is located at the base of each of the first and second cavity regions.

14. The method of claim 1, wherein the first cavity region and the second cavity region are separated by an intermediate portion of the SOI substrate.

15. The method of claim 14, further comprising a distributed Bragg reflector (DBR) grating located at the intermediate portion of the SOI substrate.

16. A method of fabricating an optoelectronic component, the method comprising:
providing a substrate;
etching a first cavity region into the substrate and etching a second cavity region into the substrate, the first cavity region having a first depth and the second cavity region having a second depth, the second depth being greater than the first depth; and
depositing a multistack epi layer into the first and the second cavity regions simultaneously, the multistack epi layer comprising a first stack portion comprising a first active region and a second stack portion comprising a second active region;
wherein the relative separation of the first active region and the second active region within the multistack epi layer is chosen based on the difference in depth of the first cavity region and the second cavity region, such that after the simultaneous deposition step, the first active region within in the first cavity region lies at the same level of the optoelectronic device as the second active region within the second cavity region.

17. The method of claim 16, further comprising the step of patterning the substrate to form a waveguide including an input waveguide and an output waveguide, the waveguide being located at the same level as the first active region and the second active region.

18. The method of claim 16, further comprising a third cavity region and a fourth cavity region, the third cavity region having a greater depth than the second cavity region, and the fourth cavity region having a greater depth than the third cavity region; wherein
the multistack epi layer includes a third multistack portion comprising a third active region and a fourth multistack portion comprising a fourth active region; and
wherein the first active region within the first cavity region and second active region within the second cavity region lie within the same level of the optoelectronic component as the third active region within the third cavity region and the fourth active region within the fourth cavity region.

19. The method of claim 18, wherein the first active region, second active region, third active region and fourth active each function as an EAM upon the application of an electrical bias across the active region, such that the optoelectronic component functions as a four channel Coarse Wavelength Division Multiplexor, CWDM4.

20. An optoelectronic component within a silicon-on-insulator, SOI, substrate, the SOI substrate comprising a silicon base layer, a buried oxide, BOX, layer on top of the base layer, and a silicon device layer on top of the BOX layer and the optoelectronic component comprising:
a first cavity region etched into the SOI substrate, the first cavity region having a first depth;
a second cavity region etched into the SOI substrate, the second cavity region having a second depth, the second depth being greater than the first depth;
a multistack epi layer located within the second cavity region with a first multistack portion containing a first active region, and a second multistack portion on top of the first multistack portion; the second multistack portion containing a second active region; and
a further multistack epi layer with a further first active region, located within the first cavity region, the epi layers of the further multistack epi layer being identical to the layers of the first multistack portion.

* * * * *